United States Patent [19]

Ogawa

[11] Patent Number: 5,822,257
[45] Date of Patent: Oct. 13, 1998

[54] SEMICONDUCTOR MEMORY DEVICE CAPABLE OF RELIEVING FIXED-FAILURE MEMORY CELLS AND REFRESH-FAILURE MEMORY CELLS

[75] Inventor: Junji Ogawa, Kawasaki, Japan

[73] Assignee: Fujitsu Limited, Kawasaki, Japan

[21] Appl. No.: 852,092

[22] Filed: May 6, 1997

[30] Foreign Application Priority Data

May 22, 1996 [JP] Japan ................................. 8-126611
Oct. 11, 1996 [JP] Japan ................................. 8-270359

[51] Int. Cl.⁶ .................................................. G11C 29/00
[52] U.S. Cl. ............... 365/200; 365/230.03; 365/189.02; 365/189.05; 365/189.07; 365/189.08; 365/222; 365/225.7; 365/227; 365/228
[58] Field of Search .............................. 365/200, 230.03, 365/189.02, 189.05, 189.07, 189.08, 222, 225.7, 227, 228

[56] References Cited

U.S. PATENT DOCUMENTS 5,157,634 10/1992 Dhong et al. ............................ 365/222

FOREIGN PATENT DOCUMENTS 62-250599 10/1987 Japan .
64-59700 3/1989 Japan .
4-263199 9/1992 Japan .

*Primary Examiner*—Viet Q. Nguyen
*Assistant Examiner*—Andrew Q. Tran
*Attorney, Agent, or Firm*—Nikaido, Marmelstein, Murray & Oram LLP

[57] ABSTRACT

A memory device has a plurality of word lines, a plurality of bit lines crossing the word lines, and a memory cell array having memory cells disposed at respective points of intersection between the word lines and the bit lines. The memory device includes a first redundant memory cell array, a first address comparison circuit, a second redundant memory cell array, and a second address comparison circuit. The first redundant memory cell array replaces memory cells with redundant memory cells per bit or a small number of bits. The first address comparison circuit stores an addresses of memory cells to be replaced, compares the stored addresses with an inputted address, and allows a memory cell to be replaced effectively with a redundant memory cell in the first redundant memory cell array when a stored address matches the inputted address. The second redundant memory cell array replaces memory cells with redundant memory cells per word line or bit line. The second address comparison circuit stores addresses corresponding to word lines or bit lines to be replaced, compares the stored addresses with an inputted address, and allows memory cells to be replaced effectively with redundant memory cells in the second redundant memory cell array when a stored address matches the inputted address.

27 Claims, 32 Drawing Sheets

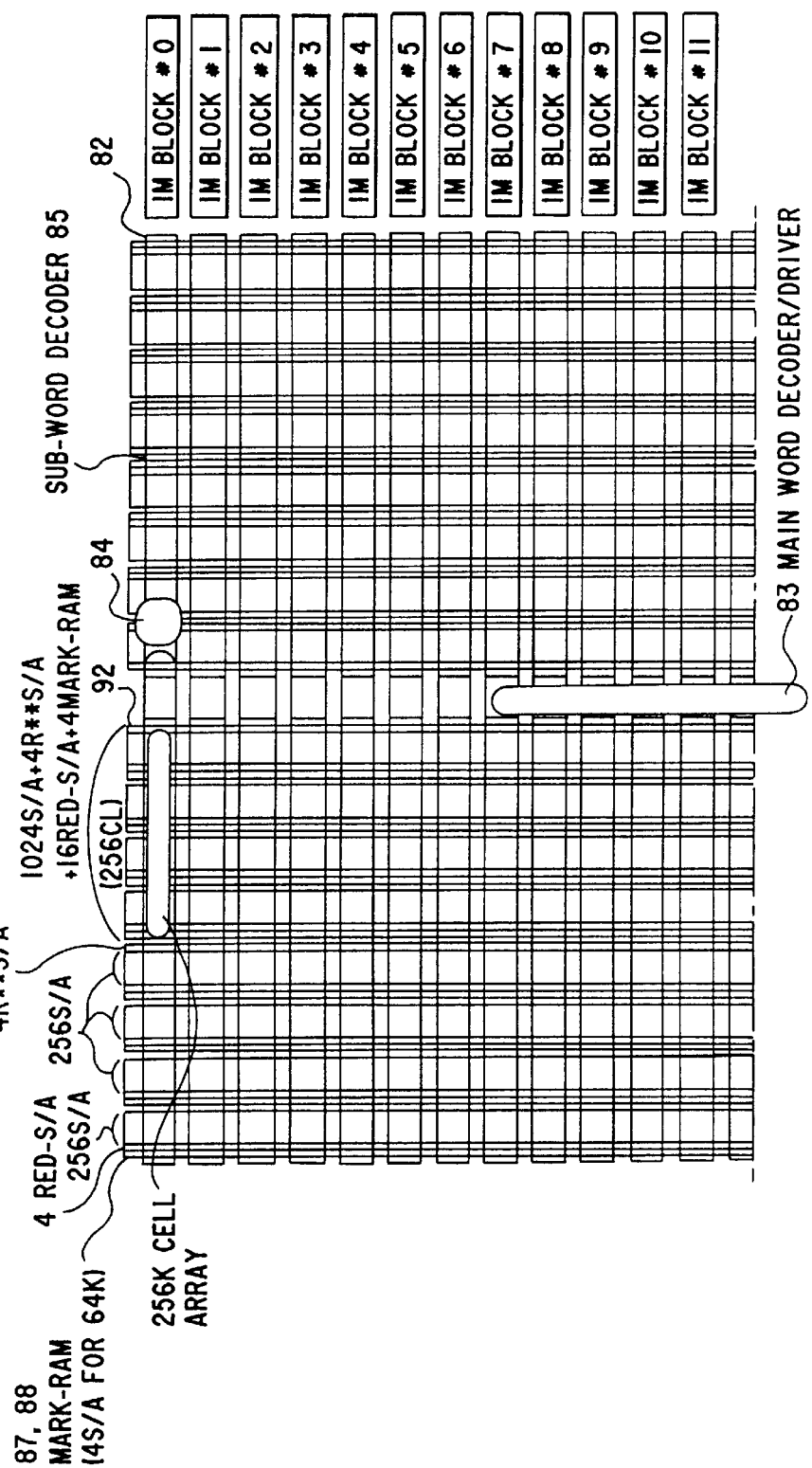

SEMICONDUCTOR MEMORY DEVICE CAPABLE OF RELIEVING FIXED-FAILURE MEMORY CELLS AND REFRESH-FAILURE MEMORY CELLS

BACKGROUND OF THE INVENTION

1. Field of the Invention:

The present invention relates to the structure of redundant memory cells in a dynamic random-access memory (DRAM) or a static random-access memory (SRAM), and more particularly to the novel structure of redundant memory cells for relieving faulty cells due to fixed failures and faulty cells due to failures caused by short refresh intervals.

2. Description of the Prior Art:

As the amount of data processed by information processing apparatus increases, the storage capacity of memory devices used therein also increases. Of those memory devices, a large-storage-capacity memory referred to as a DRAM which needs to be refreshed to renew stored data within a predetermined period of time is widely used as a main memory device. SRAMs can theoretically hold data for an infinite data retention time. However, they actually fail to hold data completely for an infinite data retention time on account of the presence of faulty cells which occur for various reasons.

To meet demands for memory devices of larger storage capacities, it is necessary to fabricate large-scale memory chips according to the microelectronics fabrication technology. However, such large-scale memory chips tend to contain various faults which are caused for a variety of reasons in the fabrication process. Since those faults would result in a reduction in the yield of memory products, it has heretofore been customary to a fault tolerant technique for converting faulty memory chips having faulty bits into good memory chips.

For relieving faulty bits, it has been often practiced to relieve fixed failures which are referred to as so-called hard failures. Fixed failures are frequently caused by short or open circuits between fabricated layers including diffused layers, oxide films, gate polysilicon layers, cell capacity electrode layers, metal interconnections, etc. Those short or open circuits are caused by dust particles introduced during the fabrication process, and tend to concentrate in local regions. For this reason, redundant memory cells which have heretofore been used to relieve fixed failures are generally of a line-redundant or block-redundant structure for replacing a unit of one through four word lines or a unit of two through four bit lines.

Therefore, a ROM area for storing addresses of memory cells to be replaced is not required to have a substantially large storage capacity. It is the general practice to employ a circuit arrangement capable of quickly detecting whether an address matches the address of a faulty cell or not while allowing increased current consumption.

Another type of faulty bit is considered to result from a memory cell which can write, store, and read data normally, but cannot clear the data retention time on the catalog because its data retention time is shorter than those of other memory cells. Specifically, faulty bits due to the fixed failures described above can be relieved by being replaced per word line or bit line, so that data can written in and read from all memory cells. However, there is a possibility that there may be memory cells whose refresh intervals are shorter than a desired standard value. A memory chip which contains such memory cells cannot satisfy the desired standard value and is classified as a faulty memory chip. Those memory cells will hereinafter be referred to as a refresh-failure cell.

The refresh-failure cell is considered to be caused by a leakage into the substrate of a diffused layer in a memory cell region, a leakage in a channel region, and defect of a cell capacity oxide film. Consequently, the refresh-failure cell occurs per bit rather than per line. Refresh-failure cells thus tend to be dispersed rather than concentrating in local regions.

It is known to replace memory cells of short refresh intervals with memory cells of longer refresh intervals as disclosed in Japanese laid-open patent publication No. 4-232688 (U.S. patent application No. 602037 filed Oct. 23, 1990). In the disclosed document, it has been proposed to replace a refresh-failure cell per bit with a static memory.

Japanese laid-open patent publications Nos. 62-250599, 64-59700, 4-263199, etc. reveal the replacement of fixed-failure cells, rather than refresh-failure cells, per bit.

At a large storage capacity level such as the storage capacity level of a 256M DRAM, the conventional proposal to replace fixed-failure cells with line-redundant or block-redundant cells is not enough to increase the yield of memory products because the probability that refresh-failure cells will occur in one memory chip increases as the storage capacity increases. Accordingly, it is necessary to consider the structure of redundant cells which takes into account both the relieving of fixed-failure cells and the relieving of refresh-failure cells.

As described above, refresh-failure cells occur in a dispersive distribution, and hence can more effectively be relieved by replacement per bit. To meet demands for a larger storage capacity and a longer refresh interval, it is necessary to relieve more refresh-failure cells. As a result, a ROM set for detecting whether a faulty cell is being accessed or not becomes large in storage capacity.

An address comparison circuit comprising a NOR-type ROM set as proposed in Japanese laid-open patent publication No. 4-232688 has a problem in that its current consumption increases as the storage capacity thereof increases. While the NOR-type ROM set ensures high-speed operation, all NOR gates simultaneously consume a current with respect to an address which does not match the address of a faulty cell. Since NOR gates as comparison circuits are associated with respective redundancy bits, they consume an enormous amount of current.

If both line-redundant cells for relieving fixed-failure cells and bit-redundant cells for relieving refresh-failure cells are provided, then ROM sets which serve as an address comparison circuit for the line-redundant cells and the bit-redundant cells are of quite a large scale. Designing such ROM sets is a very important task in realizing a large-storage-capacity memory which has long refresh intervals.

Inasmuch as refresh failures occur dispersively, an array of refresh-failure redundant cells for relieving refresh-failure cells should preferably be of such an arrangement which can be replaced per bit or small number of bits. However, such an array of refresh-failure redundant cells may not necessarily be simple in arrangement if the memory is of a larger storage capacity. Specifically, since the unit of cells to be replaced is small, the number of faulty address sets to be stored and the number of addresses of each set are large, and hence an address storage circuit and an address comparison circuit therefor tend to large in size. Consequently, it is necessary to solve the problems of increased power consumption and circuit design difficulties which result from the large size of the address storage and comparison circuits.

SUMMARY OF THE INVENTION

It is an object of the present invention to provide a semiconductor memory device which can relieve both fixed-failure cells and refresh-failure cells.

Another object of the present invention is to provide a semiconductor memory device which has, as an address comparison circuit for selecting redundant cells for relieving refresh-failure cells, a circuit that consumes a reduced current and has trouble-free access times for writing and reading data.

Still another object of the present invention is to provide a semiconductor memory device which has an address comparison circuit of novel structure for selecting line-redundant cells or block-redundant cells and bit-unit-redundant cells for relieving both fixed-failure cells and refresh-failure cells.

Yet still another object of the present invention is to provide a semiconductor memory device which has redundant cells of efficient structure for relieving both fixed-failure cells and refresh-failure cells and an address comparison circuit of efficient structure for selecting such redundant cells.

A further object of the present invention is to provide a semiconductor memory device which has an array of redundant cells for relieving refresh-failure cells, the array of redundant cells being of a novel structure and being capable of operating with reduced power consumption.

According to a first aspect of the present invention, there is provided a memory device having a plurality of word lines, a plurality of bit lines crossing the word lines, and a memory cell array having memory cells disposed at intersections between the word lines and the bit lines: comprising a first redundant memory cell array for replacing memory cells with redundant memory cells per bit or a small number of bits; a first address comparison circuit for storing an addresses of memory cells to be replaced, comparing the stored addresses with an inputted address, and allowing a memory cell to be replaced with a redundant memory cell in the first redundant memory cell array when a stored address matches the inputted address; a second redundant memory cell array for replacing memory cells with redundant memory cells per word line or bit line; and a second address comparison circuit for storing addresses corresponding to word lines or bit lines to be replaced, comparing the stored addresses with an inputted address, and allowing memory cells to be replaced with redundant memory cells in the second redundant memory cell array when a stored address matches the inputted address.

With the above arrangement, refresh-failure cells are replaced per bits or a small number of bits with redundant memory cells in the first redundant memory cell array, and fixed-failure cells are replaced per a word line or a bit line or plural word or bit lines with redundant memory cells in the second redundant memory cell array. Therefore, refresh-failure cells and fixed-failure cells can efficiently be replaced with redundant memory cells, resulting in an increased space efficiency and an increased yield of memory devices. The small number of bits represents a number of bits fewer than the number of bits belonging to a single word line or a single pair of bit lines, for example.

In the first aspect of the present invention, more specifically, a data retention time over which a charge representing data stored in the memory cell to be replaced effectively by the first address comparison circuit drops to a predetermined allowable level is shorter than a data retention time of the redundant memory cell to be replaced in the first redundant memory cell array.

Specifically, a refresh-failure cell is relieved by being replaced with a memory cell in the first redundant memory cell array which has a longer refresh cycle period than the refresh-failure cell.

In the first aspect of the present invention, more specifically, the memory cells to be replaced effectively by the second address comparison circuit suffer a failure in reading data therefrom or writing data therein.

Therefore, the memory cells that include memory cells from which data cannot be read or in which data cannot be written due to a word line short circuit or a bit line word short circuit, for example, are replaced per word line or bit line with memory cells in the second redundant memory cell array.

In the first aspect of the present invention, more specifically, the second address comparison circuit allows memory cells to be replaced effectively with redundant memory cells per word line in the second redundant memory cell array when the stored address matches a row address for selecting a word line, and allows memory cells to be replaced effectively with redundant memory cells per bit line in the second redundant memory cell array when the stored address matches a column address for selecting a bit line.

Thus, in the second redundant memory cell array, when the stored address matches a row address, memory cells are allowed to be effectively replaced per word line, and when the stored address matches a column address, memory cells are allowed to be effectively replaced per bit line.

In the first aspect of the present invention, more specifically, the memory device further comprises a multiplexer disposed in a stage preceding an output stage of the memory device for selecting one of data outputted form the memory cell array, data outputted from the first redundant memory cell array, and data outputted from the second redundant memory cell array.

Data outputted from the respective memory cell arrays are selected and outputted by the multiplexer which precedes the output stage according to address matching signals from the first and second address comparison circuits.

According to a second aspect of the present invention, there is provided a memory device having a plurality of word lines, a plurality of bit lines crossing the word lines, and a memory cell array having memory cells disposed at intersections between the word lines and the bit lines and including capacities for holding charges representing data, the memory cell array including memory cells having data retention times over which the charges drop to a predetermined allowable level, the data retention times including a first time and a second time shorter than the first time: comprising a first redundant memory cell array having redundant memory cells for replacing memory cells having the second time in the memory cell array; and a first address comparison circuit for storing addresses of the memory cells having the second time, comparing the stored addresses with an inputted address, and allowing a memory cell having the second time to be replaced with a redundant memory cell having a third time longer than the second time in the first redundant memory cell array when a stored address matches the inputted address, the first address comparison circuit comprising AND-type logic circuits for forming a current path to an output terminal when the stored address matches the inputted address.

For relieving refresh-failure cells, they can effectively be replaced per bit or a small number of bits in a certain case. In such a case, it is necessary for the address comparison circuit to compare all address signals or a number of address signals close thereto, resulting in a large current which is consumed. According to the second aspect, therefore, AND-type circuits, rather than conventional NOR-type circuits, are used in the first address comparison circuit.

In the second aspect of the present invention, more specifically, the first address comparison circuit comprises as many cascaded paired unit circuits as the number of address bits of the addresses to be compared, each of the cascaded paired unit circuits comprising a pair of transistors having respective gates for being supplied with the inputted address and a pair of fuses connected to the transistors, respectively, for storing address bits of one of the stored addresses, and wherein the first address comparison circuit outputs an address matching signal through the current path which is formed according to a conductive condition of the transistors and a conductive condition of the fuses.

Alternatively, in the second aspect of the present invention, more specifically, the first address comparison circuit comprises as many cascaded unit circuits as the number of address bits of the addresses to be compared, each of the cascaded unit circuits comprising a pair of transistors having respective gates for being supplied with the inputted address and threshold voltages to be increased or reduced by electric means, the transistors storing address bits of one of the stored addresses as an increase or reduction in the respective threshold voltages, and wherein the first address comparison circuit outputs an address matching signal through the current path which is formed according to a conductive condition of the transistors.

Since the current path is formed only when the compared addresses match each other, the current which is consumed by the first address comparison circuit is reduced.

In the second aspect of the present invention, more specifically, the addresses include row address bits and column address bits, the first address comparison circuit comprising a row address comparison circuit for comparing the row address bits and a column address comparison circuit for comparing the column address bits, and wherein the first address comparison circuit outputs an address matching signal through the current path which is formed in the row address comparison circuit and the column address comparison circuit.

Inasmuch the first address comparison circuit is divided into the row address comparison circuit and the column address comparison circuit, each having a current path, the time required until an address matching signal is finally outputted is shortened. Therefore, even if many address signals are compared, they can be compared at high speed.

In the second aspect of the present invention, more specifically, the cascaded unit circuits of the first address comparison circuit are divided into a plurality of blocks, the first address comparison circuit including buffers connected between the blocks for amplifying a signal flowing the current path.

Because the buffers amplify the signal flowing the current path for high-speed operation, they allow addresses to be compared at high speed.

In the second aspect of the present invention, more specifically, the first address comparison circuit has a plurality of sets of the cascaded unit circuits, the cascaded unit circuits being divided into at least two blocks, and wherein one of the blocks supplies output signals to the other block which belongs to the plurality of sets.

According to the second aspect of the present invention, more specifically, a circuit for comparing a two- or four-bit inputted address is shared by two cascaded sets, and an output signal from the shared circuit is shared by the plurality of sets. Therefore, the shared circuit can be saved for thereby reducing overall current consumption.

In the above arrangement of the second aspect, the number of sets in the other block to which the output signals from the one of the blocks are supplied can be modified by a mask option. In this manner, it is possible to determine the number of first address circuits to be dispensed with according to the probability or distribution with which refresh-failure cells occur.

Furthermore, the mask option is effected on an uppermost metal layer of the memory device for example. According to a third aspect of the present invention, there is provided a memory device having a plurality of word lines, a plurality of bit lines crossing the word lines, and a memory cell array having memory cells disposed at intersections between the word lines and the bit lines: comprising a first redundant memory cell array for replacing memory cells in the memory cell with redundant memory cells per bit or a small number of bits; a first address comparison circuit for storing addresses of memory cells to be replaced, comparing the stored addresses with an inputted address, and allowing a memory cell having a second refresh cycle period in the memory having a first refresh cycle period in the first redundant memory cell array longer than the second refresh cycle period when a stored address matches the inputted address; a second redundant memory cell array for replacing memory cells in the memory cell array with redundant memory cells per word line or bit line; a second address comparison circuit for storing addresses corresponding to word lines or bit lines to be replaced, comparing the stored addresses with an inputted address, and allowing a word line or a bit line to be replaced effectively with a word line or a bit line in the second redundant memory cell array when a stored address matches the inputted address; and a multiplexer for selecting one of data outputted form the memory cell array, data outputted from the first redundant memory cell array, and data outputted from the second redundant memory cell array.

With the third aspect of the present invention, redundant memory cells for relieving refresh-failure cells replace refresh-failure cells per bit or a small number of bits, and redundant memory cells for relieving fixed-failure cells replace fixed-failure cells per a word line or a bit line or plural word or bit lines. Output data from those redundant memory cells or output data from a normal memory cell array are selected by the multiplexer which is disposed in a stage preceding an output stage.

In the third aspect of the present invention, more specifically, the memory device is disposed on a semiconductor chip, the first address comparison circuit and the second address comparison circuit being disposed adjacent to each other, and wherein the inputted address is supplied in common to the first address comparison circuit and the second address comparison circuit.

Since the first address comparison circuit and the second address comparison circuit associated with the respective redundant memory cell arrays are disposed adjacent to each other, a number of address signals can be supplied in common to the first and second address comparison circuits. Therefore, the space efficiency on the semiconductor chip is increased.

In the third aspect of the present invention, more specifically, the memory device is disposed on a semiconductor chip, the memory cell array including a plurality of memory cell arrays disposed on the semiconductor chip, the first redundant memory cell array and the second redundant memory cell array being shared by the plurality of memory cell arrays, the first address comparison circuit being disposed adjacent to the first redundant memory cell array, the second address comparison circuit being disposed adjacent to the second redundant memory cell array, and wherein the inputted address is supplied in common to the first address comparison circuit and the second address comparison circuit.

The space efficiency on the semiconductor chip is further increased because the first and second redundant memory cell arrays are centralized on the semiconductor chip and the first and second address comparison circuits are disposed adjacent to the first and second redundant memory cell arrays.

In the third aspect of the present invention, more specifically, the memory device is disposed on a semiconductor chip, the first address comparison circuit and the second address comparison circuit being disposed adjacent to each other, wherein a portion of the inputted address is supplied in common to the first address comparison circuit and the second address comparison circuit, and the remainder of the inputted address is supplied to the first address comparison circuit, and wherein the second address comparison circuit outputs an address matching signal to allow a plurality of word lines or bit lines to be replaced effectively.

If the first redundant memory cell array for relieving refresh-failure cells replaces refresh-failure cells per bit or a small number of bits, whereas the second redundant memory cell array for relieving fixed-failure cells replaces fixed-failure cells per a plurality of word lines, for example, then the second address comparison circuit may store and compare a small number of address signals. Therefore, the second address comparison circuit may be simplified in arrangement.

In the third aspect of the present invention, more specifically, the memory device is disposed on a semiconductor chip, the addresses including row address bits and column address bits, the first address comparison circuit comprising a first row address comparison unit for storing and comparing the row address bits with inputted row address bits and a first column address comparison unit for storing and comparing the column address bits with inputted column address bits, the second address comparison circuit comprising a second row address comparison unit for storing and comparing the row address bits with inputted row address bits and a second column address comparison unit for storing and comparing the column address bits with inputted column address bits, and wherein the first redundant memory cell array is disposed between the first row address comparison unit and the first column address comparison unit, for outputting data of memory cells to be replaced in response to respective address matching signals therefrom, the second row address comparison unit being disposed adjacent to the first row address comparison unit, the second row address comparison unit and the first row address comparison unit being supplied in common with the inputted row address bits, the second column address comparison unit being disposed adjacent to the first column address comparison unit, the second column address comparison unit and the first column address comparison unit being supplied in common with the inputted column address bits.

The above arrangement permits the space efficiency on the semiconductor chip to be further increased.

In the third aspect of the present invention, more specifically, the memory cell array includes a plurality of memory cell arrays disposed on the semiconductor chip, the second redundant memory cell array being disposed adjacent to the second address comparison circuit, and shared by the plurality of memory cell arrays.

This arrangement also permits the space efficiency on the semiconductor chip to be further increased.

According to a fourth aspect of the present invention, there is provided a memory device having a plurality of word lines, a plurality of bit lines crossing the word lines, and a memory cell array having memory cells disposed at intersections between the word lines and the bit lines and including capacities for holding charges representing data, the memory cell array including memory cells having data retention times over which the charges drop to a predetermined allowable level, the data retention times including a first time and a second time shorter than the first time: comprising a redundant memory cell array having redundant memory cells for replacing memory cells having the second time in the memory cell array; and an address comparison circuit for storing addresses of the memory cells having the second time, comparing the stored addresses with an inputted address, and allowing a memory cell having the second time to be replaced with a redundant memory cell having a third time longer than the second time in the first redundant memory cell array when a stored address matches the inputted address; the redundant memory cell array and the address comparison circuit being included in a redundant circuit, the redundant circuit having a plurality of first-layer redundant circuits associated with respective divided memory cell arrays and a second-layer redundant circuit shared by the plurality of first-layer redundant circuits, wherein memory cell having the second time in the divided memory cell arrays can be replaced with corresponding memory cell in redundant memory cell arrays in the first-layer redundant circuits, and memory cell having the second time which cannot be replaced with memory cells in the first-layer redundant circuits can be replaced with memory cell in a redundant memory cell array in the second-layer redundant circuit.

With the fourth aspect of the present invention, the redundant circuits for relieving refresh-failure cells are arranged in a hierarchical structure, and the redundant circuits in a lower layer are associated with memory cell blocks divided from the memory cell array. Refresh-failure cells in the memory cell blocks are replaced with redundant memory cells, and refresh-failure cells which cannot be relieved by the redundant circuits in the lower layer are replaced and relieved by the redundant circuit in an upper layer which is shared by the divided memory cell blocks. This arrangement is effective in dispersing the redundant circuits and also in increasing the relief probability.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS OVERALL STRUCTURE

Figure 1:
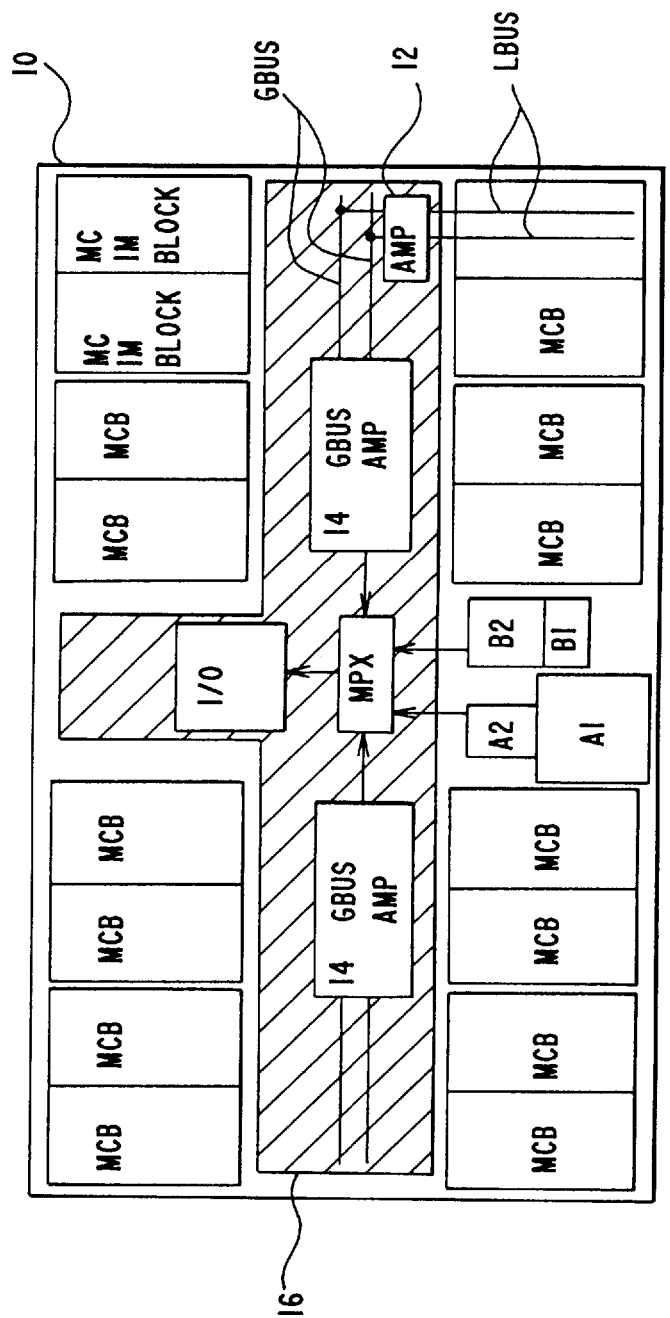
FIG. 1 is a plan view of a semiconductor memory device according to an embodiment of the present invention.

FIG. 1 shows in block form a semiconductor memory device according to an embodiment of the present invention. As shown in FIG. 1, the semiconductor memory device comprises 16 memory cell blocks MCB each having 1-Mbit memory cells on a memory chip 10. Between the four arrays of memory cell blocks MCB, there are positioned a peripheral circuit section 16 including address buffers, read amplifiers, write amplifiers, input/output circuits, and other control circuits, a redundant memory cell array A2 for relieving refresh-failure cells, an address comparison circuit A1 for the redundant memory cell array A2, a redundant memory cell array B2 for relieving fixed-failure cells, and an address comparison circuit B1 for the redundant memory cell array B2.

If the semiconductor memory device is a DRAM, then each of the memory cell blocks MCB has memory cells, each comprising one transistor and one capacitor, disposed at intersections between word lines and bit lines, and data stored in the memory cells are read by sense amplifiers which are connected to the bit lines. The circuit arrangement of the memory cells is of well known nature as disclosed in the publications referred to above, and will not be described here. However, an example of the circuit arrangement of the memory cells will be described later on with reference to FIG. 20. disposed therein for use in accessing data stored in the memory cells. The local buses LBUS are connected through a local-bus amplifier and selector 12 to global buses GBUS which are connected to global-bus amplifiers 14.

The redundant memory cell array B2 for relieving fixed-failure cells has line-redundant cells or block-redundant cells, and is disposed in one location rather than being dispersed in the memory cell blocks MCB. Therefore, even when fixed-failure cells occur and concentrate in one memory cell block, they can efficiently be replaced with redundant cells in the redundant memory cell array B2.

Redundant cells for relieving refresh-failure cells are arranged to replace refresh-failure cells per bit or several bits. The redundant memory cell array A2 for relieving refresh-failure cells is disposed in one location with respect to all the memory cell blocks MCB. Therefore, when refresh-failure cells occur in any distribution, they can flexibly be replaced with redundant cells in the redundant memory cell array A2.

According to the embodiment, since semiconductor memory device includes the redundant memory cell array B2 and the redundant memory cell array A2 for relieving both fixed-failure cells and refresh-failure cells, the address comparison circuits B1, A1 for determining whether redundant cells are accessed or not are of a large capacity. Specifically, each of the address comparison circuits B1, A1 comprises a ROM for storing addresses where faulty cells are to be replaced with redundant cells, and a comparator for comparing an inputted address and the addresses stored in the ROM. If the address comparison circuit is of 16 Mbits, then it is necessary to connect 24 address lines to the address comparison circuit. The address comparison circuits B1, A1 which are disposed in one location as shown in FIG. 1 are highly space-efficient because a greater space would be required if redundant cells were dispersed in the memory cell blocks and address comparison circuits were correspondingly dispersed.

According to the embodiment, the comparators are of the AND type as described later on for reducing the current consumption by the address comparison circuits. The AND-type comparators take a longer period of time until a result of address matching is obtained than the NOR gates described above. In order to overcome such a shortcoming, when a faulty cell is accessed, it is accessed in an ordinary memory cell block and a redundant cell is also accessed at the same time. Even though the time required for address matching by the address comparison circuits is long, an output signal from the redundant cell can be obtained until an output signal is outputted from the ordinary memory cell block through the local bus, the global bus, and their amplifiers. Therefore, these output signals are selected by a multiplexer MPX at a stage prior to the final input/output circuit I/O.

As shown in FIG. 1, the redundant memory cell array B2 for relieving fixed-failure cells replaces fixed-failure cells per line or block. Therefore, the redundant memory cell array B2 is of a relatively large storage capacity. However, the address comparison circuit B1 for the redundant memory cell array B2 is of a relatively small storage capacity. The redundant memory cell array A2 for relieving refresh-failure cells replaces refresh-failure cells per bit, and hence is of a relatively small storage capacity. However, the address comparison circuit A1 for the redundant memory cell array A2 is of a relatively large storage capacity.

Figure 2:
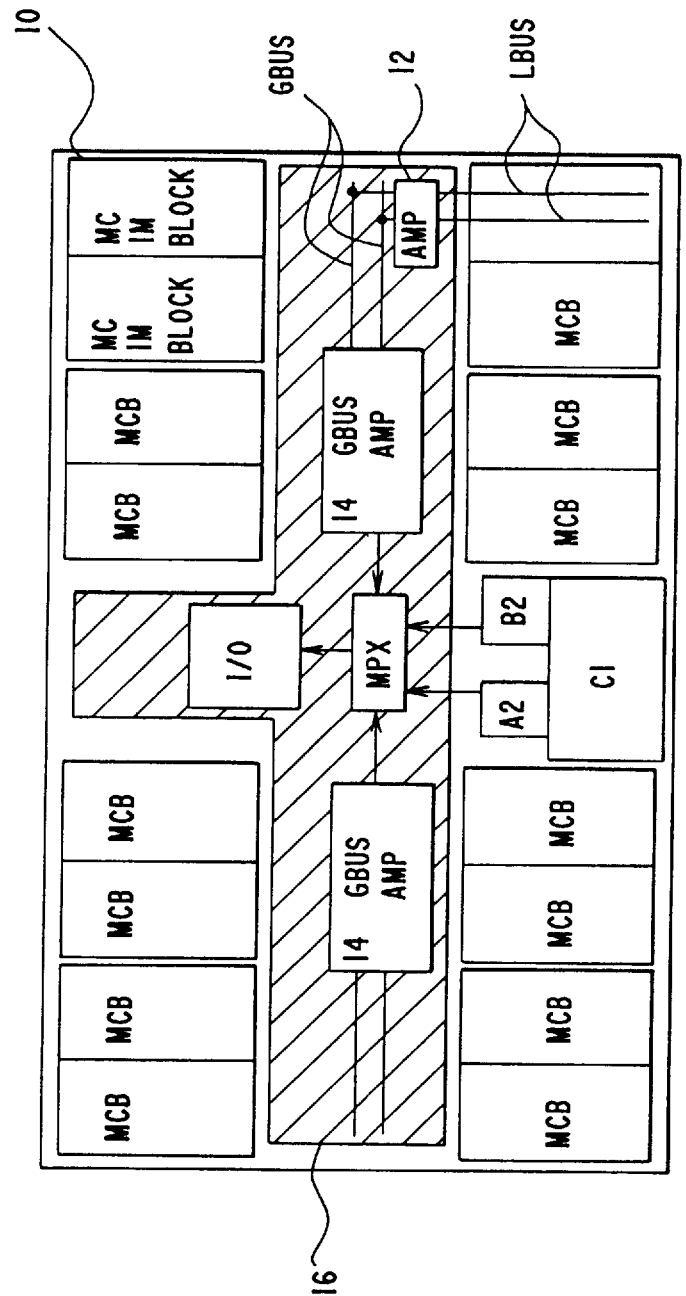
FIG. 2 is a plan view of a semiconductor memory device according to another embodiment of the present invention.

FIG. 2 shows in block form a semiconductor memory device according to another embodiment of the present invention. The semiconductor memory device shown in FIG. 2 differs from the semiconductor memory device shown in FIG. 1 in that the address comparison circuits for the redundant memory cell array B2 and the redundant memory cell array A2 are combined into a common address comparison circuit C1. Since redundant cells, irrespective of whether they are either line-redundant cells, block-redundant cells, or bit-redundant cells, need to be compared with all addresses, the address comparison circuits for the redundant memory cell array B2 and the redundant memory cell array A2 are combined into the common address comparison circuit C1 for increased space efficiency.

Figure 3:
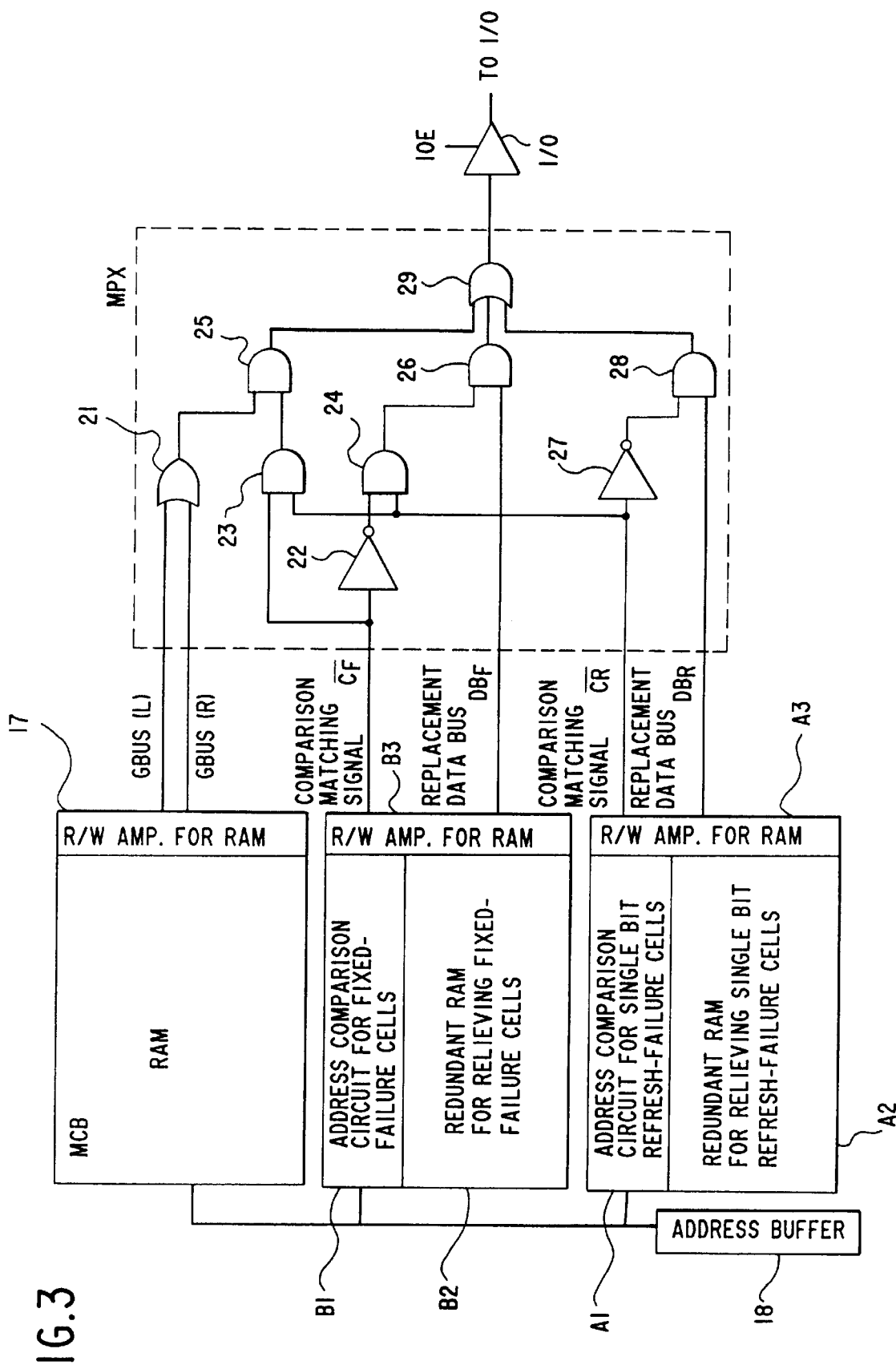
FIG. 3 is a block diagram showing a logic structure of a multiplexer in the semiconductor memory device shown in FIG. 1 or 2.

FIG. 3 shows a logic structure of the multiplexer MPX in the semiconductor memory device shown in FIG. 1 or 2. As described above, the address comparison circuits A1, B1 comprise AND-type circuits which are capable of reducing a consumed current though their speed of operation is lowered. Output signals from the memory cell blocks MCB and output signals from the redundant memory cell arrays A2, B2 are selected by the multiplexer MPX and outputted to the final input/output circuit I/O.

Each of the memory cell blocks MCB is associated with a write/read amplifier 17 for the memory cells thereof, and the redundant memory cell arrays A2, B2 are associated with write/read amplifiers A3, B3, for the redundant memory cells thereof. One of the left and right global bus lines GBUS shown in FIGS. 1 and 2 is selected by an OR gate 21. The address comparison circuit B1 for fixed-failure cells outputs a comparison matching signal /CF. When compared addresses match with each other, stored data from the redundant memory cell array B2 are outputted to a replacement data bus DBF. When an address supplied from an address buffer 18 and data in the ROM of the address comparison circuit B1 match each other, the comparison matching signal /CF becomes low in level, causing an AND gate 23 to inhibit data output from the memory cell blocks MCB from being outputted from an AND gate 25. When an address unmatch is detected by the address comparison circuit A1 for refresh-failure cells, a comparison matching signal /CR outputted therefrom becomes high in level, causing an AND gate 24 to allow an AND gate 26 to select the output data from the replacement data bus DBF.

When compared address bits match each other in the address comparison circuit A1, the comparison matching signal /CR outputted therefrom becomes low in level, causing the AND gates 23, 24 to inhibit output data from the memory cell blocks MCB and output data from the redundant memory cell array B2 from being outputted, and stored data from the redundant memory cell array A2 are outputted through a replacement data bus DBR and selected by an AND gate 28.

The output data from the AND gates 25, 26, 28 are outputted through an OR gate 29 to the input/output circuit I/O. An input/output enable signal IOE is applied to the input/output circuit I/O.

As can be seen from FIG. 3, fixed-failure cells in the memory cell blocks MCB are replaced per line or block with line-redundant cells or block-redundant cells, and refresh-failure cells in the memory cell blocks MCB or the redundant memory cell array B2 are replaced per bit or several bits with redundant cells from the redundant memory cell array A2.

REDUNDANT MEMORY CELL ARRAY FOR RELIEVING REFRESH-FAILURE CELLS

Figure 4:
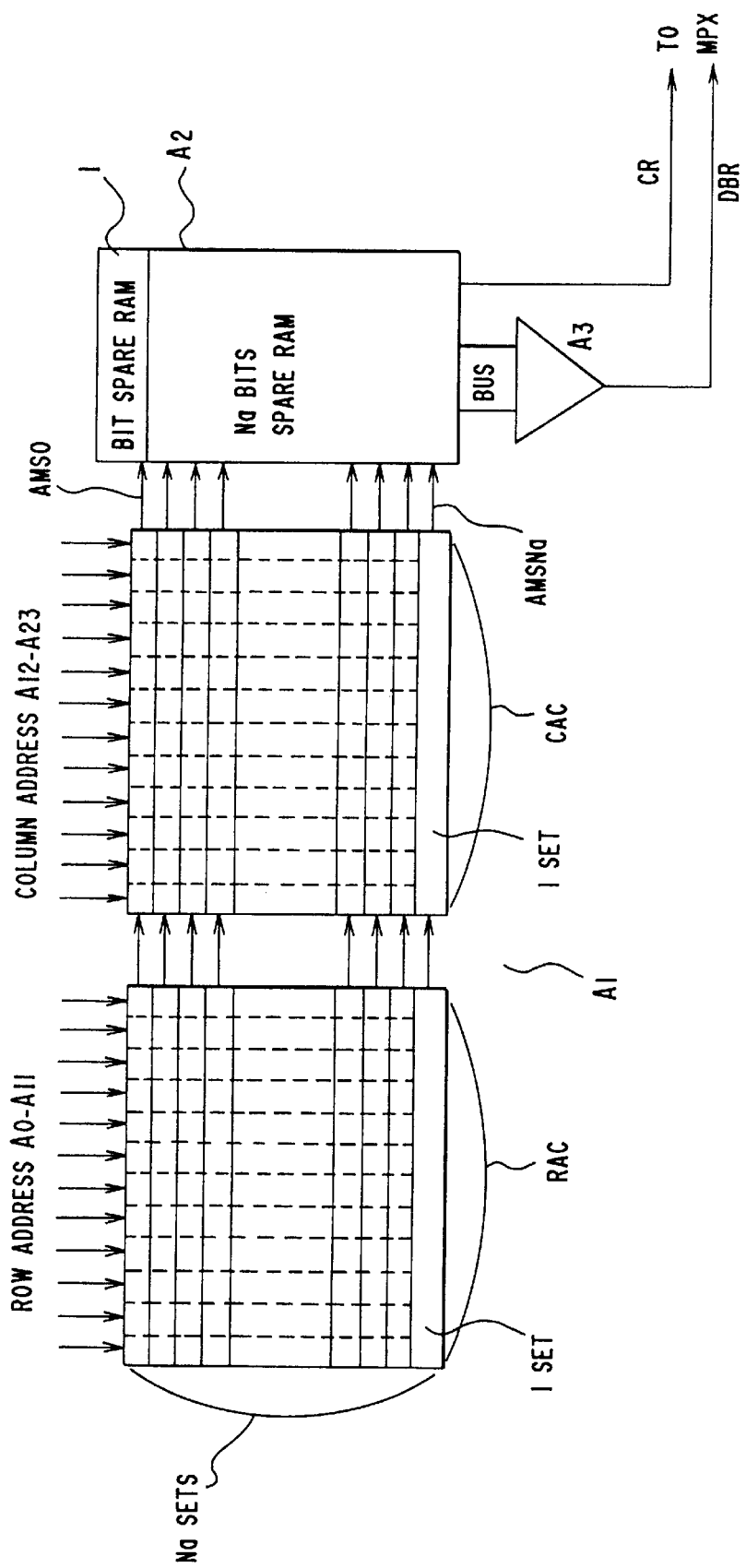
FIG. 4 is a block diagram of a redundant memory cell array for relieving refresh-failure cells and an address comparison circuit disposed adjacent thereto.

FIG. 4 shows in block form the redundant memory cell array A2 for relieving refresh-failure cells and the address comparison circuit A1 disposed adjacent thereto. As shown in FIG. 4, the address comparison circuit A1 comprises a row address comparison circuit RAC for comparing a row address A0~A11 and a column address comparison circuit CAC for comparing a column address A12~A23. When a compared address matches data in ROMs of the address comparison circuits RAC, CAC, the address comparison circuit A1 outputs an address matching signal AMS0~AMSNa to the redundant memory cell array A2.

Each of the address comparison circuits RAC, CAC comprises Na sets of AND gates. Each of the Na sets of AND gates is supplied with a row address bit and a column address bit, compares them with stored address bits in the ROMs (address bits corresponding to replacement bits), and brings an address matching signal AMS into a high level, for example, when the compared address bits match each other.

The redundant memory cell array A2 has Na-bit redundant memory cells which are selected by the high level of the address matching signal AMS. Stored data from a redundant memory cell are outputted through bus lines BUS and amplified by an amplifier A3, from which the data are outputted through the replacement data bus DBR to the multiplexer. The comparison matching signal /CR which is generated in response to the address matching signal AMS is a low-level signal representative of a replaced state.

Figure 5:
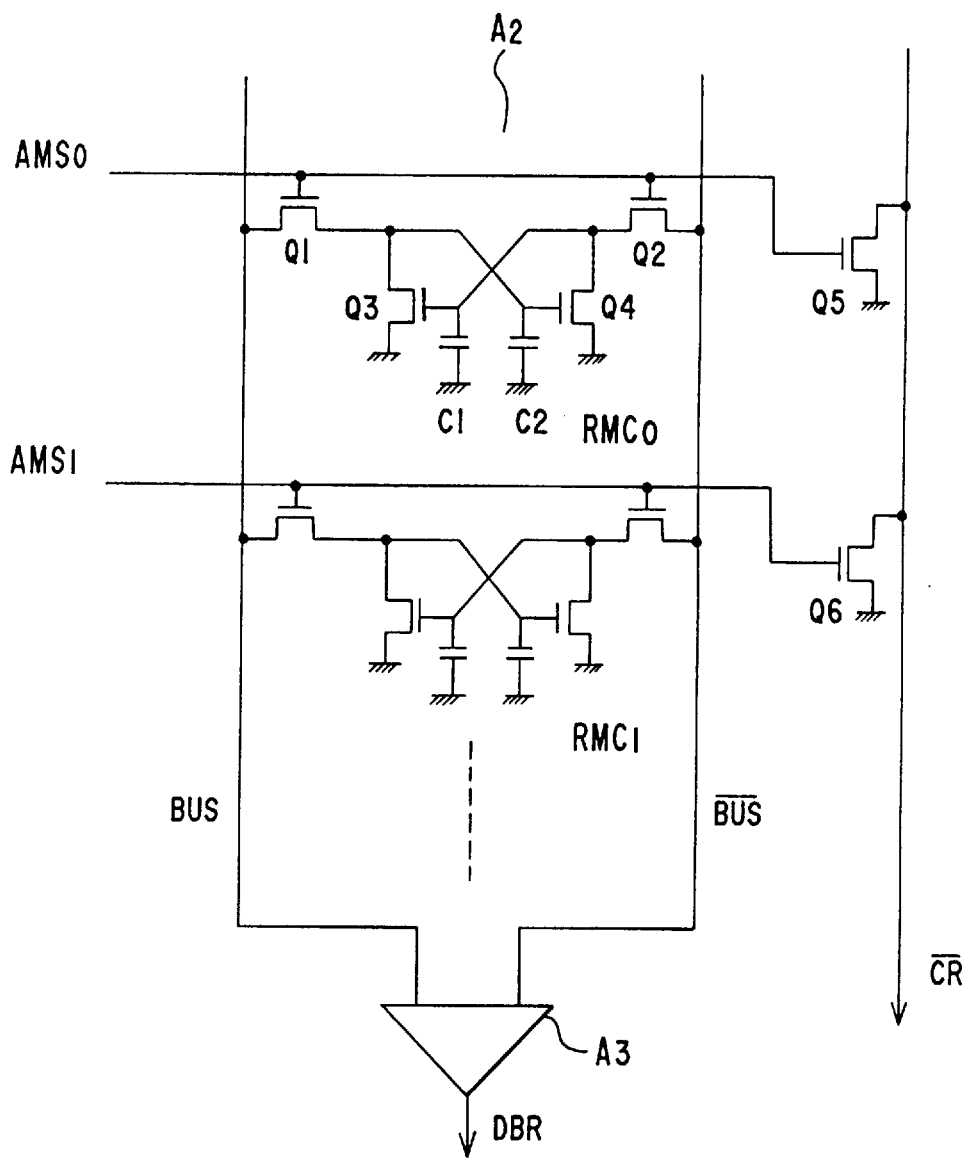
FIG. 5 is a circuit diagram of the FIG. 5 shows the redundant memory cell array.

FIG. 5 shows the redundant memory cell array A2 (spare memory). As shown in FIG. 5, the redundant memory cell array A2 has a plurality of redundant memory cells each comprising a four-transistor dynamic memory cell which has four transistors Q1, Q2, Q3, Q4 and two capacitors C1, C2. In response to the high level of the address matching signal AMS, the transistors Q1, Q2 are selected, reading a high-level potential stored in either one of the two capacitors C1, C2. The high-level potential data that are read are transferred through the pair of bus lines BUS, /BUS to the amplifier A3.

Figure 21:
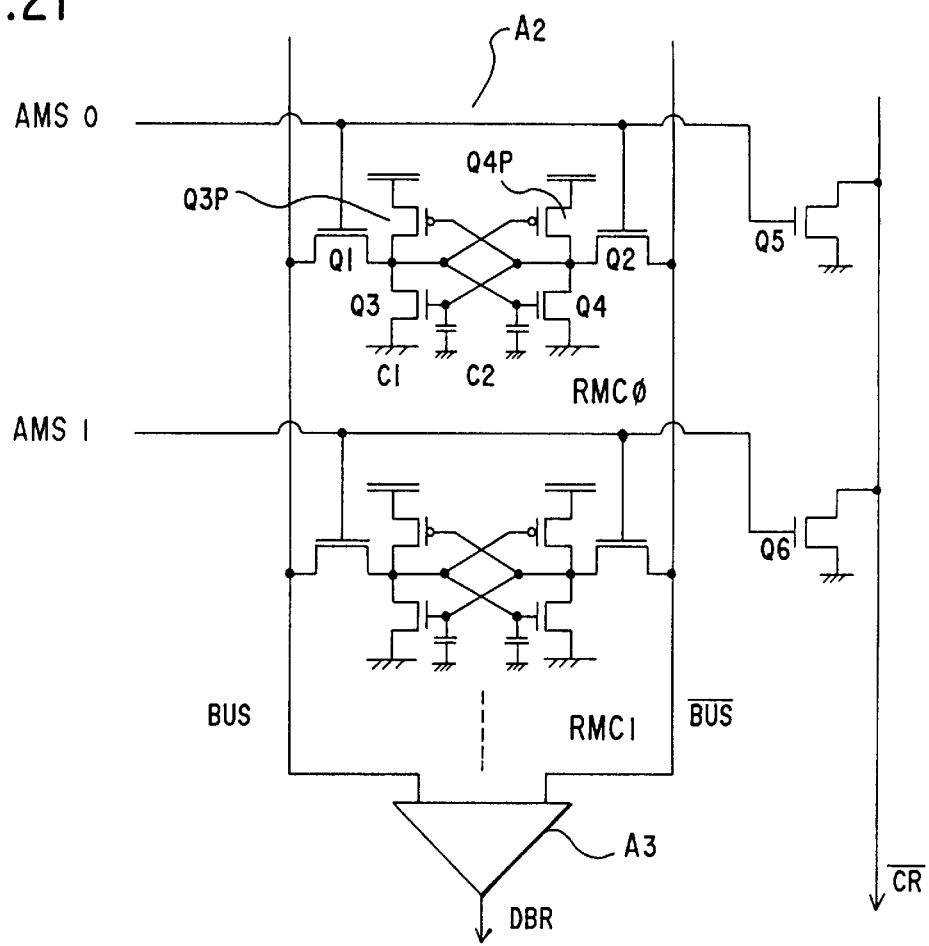
FIG. 21 is a circuit diagram of a redundant memory cell which is preferably an SRAM memory cell comprising a flip-flop which has cross-connected CMOS inverters.

Each of the redundant memory cells may not be limited to the four-transistor dynamic memory cell, but may include a static or dynamic load circuit. One such modified redundant memory cell is preferably an SRAM memory cell comprising a flip-flop which has cross-connected CMOS inverters as shown in FIG. 21. Since such a memory cell is well known in the art, it will not be described in detail below. Those parts in FIG. 21 which are identical or correspond to those shown in FIG. 5 are denoted by identical reference characters.

The address matching signals AMS are applied to transistors Q5, Q6 in order to generate the comparison matching signal /CR. When either one of the address matching signals AMS becomes high in level, the transistors Q5, Q6 are turned on, making the comparison matching signal /CR low in level.

Figure 6:
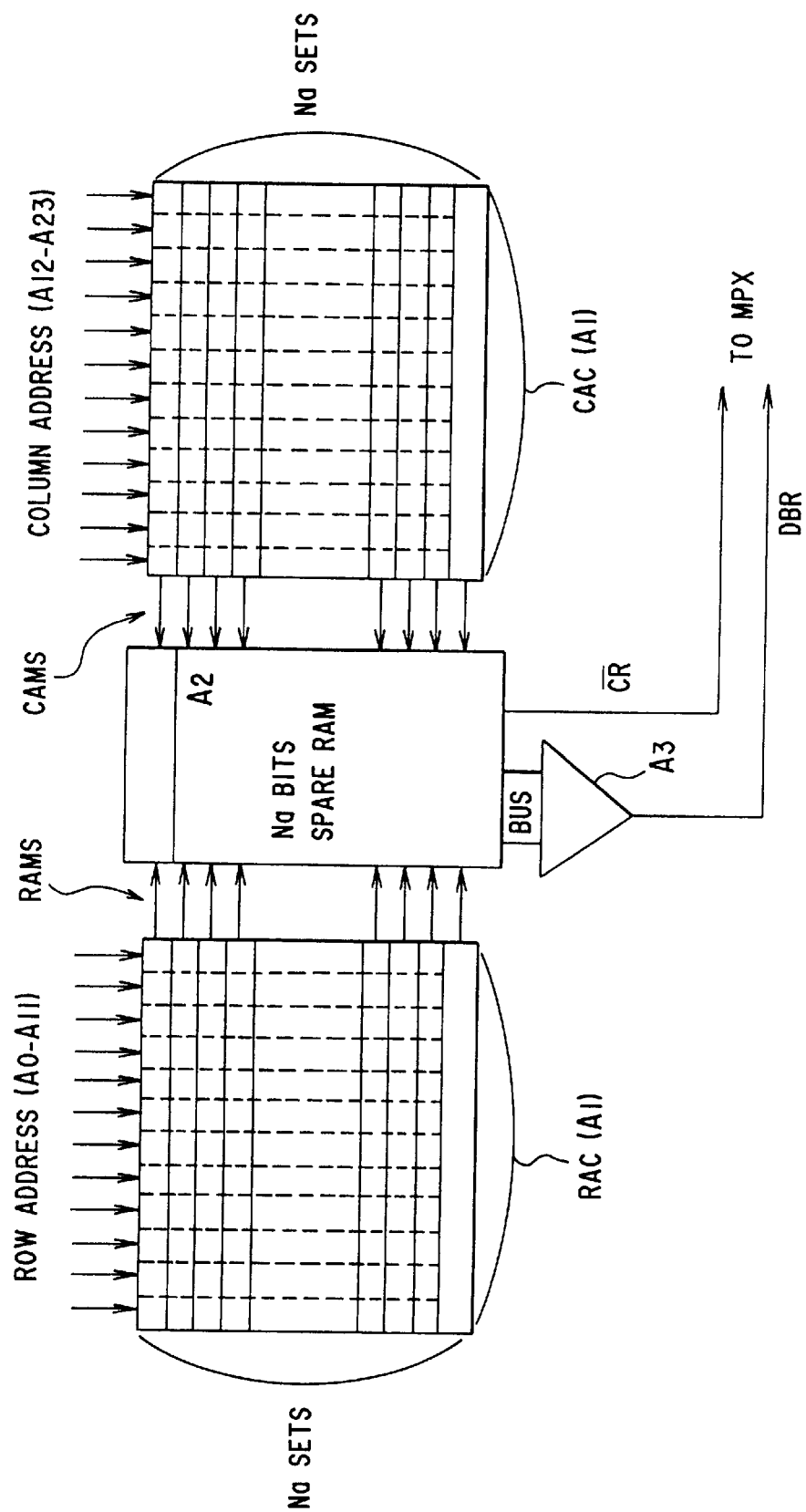
FIG. 6 is a block diagram of another arrangement of the redundant memory cell array and the address comparison circuit.

FIG. 6 shows in block form another arrangement of the address comparison circuit A1 and the redundant memory cell array A2. In the arrangement shown in FIG. 6, the address comparison circuit A1 is divided into a row address comparison circuit RAC and a column address comparison circuit CAC. Address matching signals RAMS, CAMS from the respective address comparison circuits RAC, CAC are applied to the redundant memory cell array (spare RAM) A2. As described later on, the redundant memory cell array A2 detects AND logic of the address matching signals RAMS, CAMS to produce a signal for selecting a redundant memory cell.

The circuit arrangement shown in FIG. 6 is effective to increase the overall speed of operation of the address comparison circuit which comprises AND gates as described later on. Since the address comparison circuit compares row and column address bits concurrent with each other, the address comparison circuit can compare address bits at a speed which is about twice the speed that is achieved by comparing address bits altogether as shown in FIG. 4.

Figure 7:
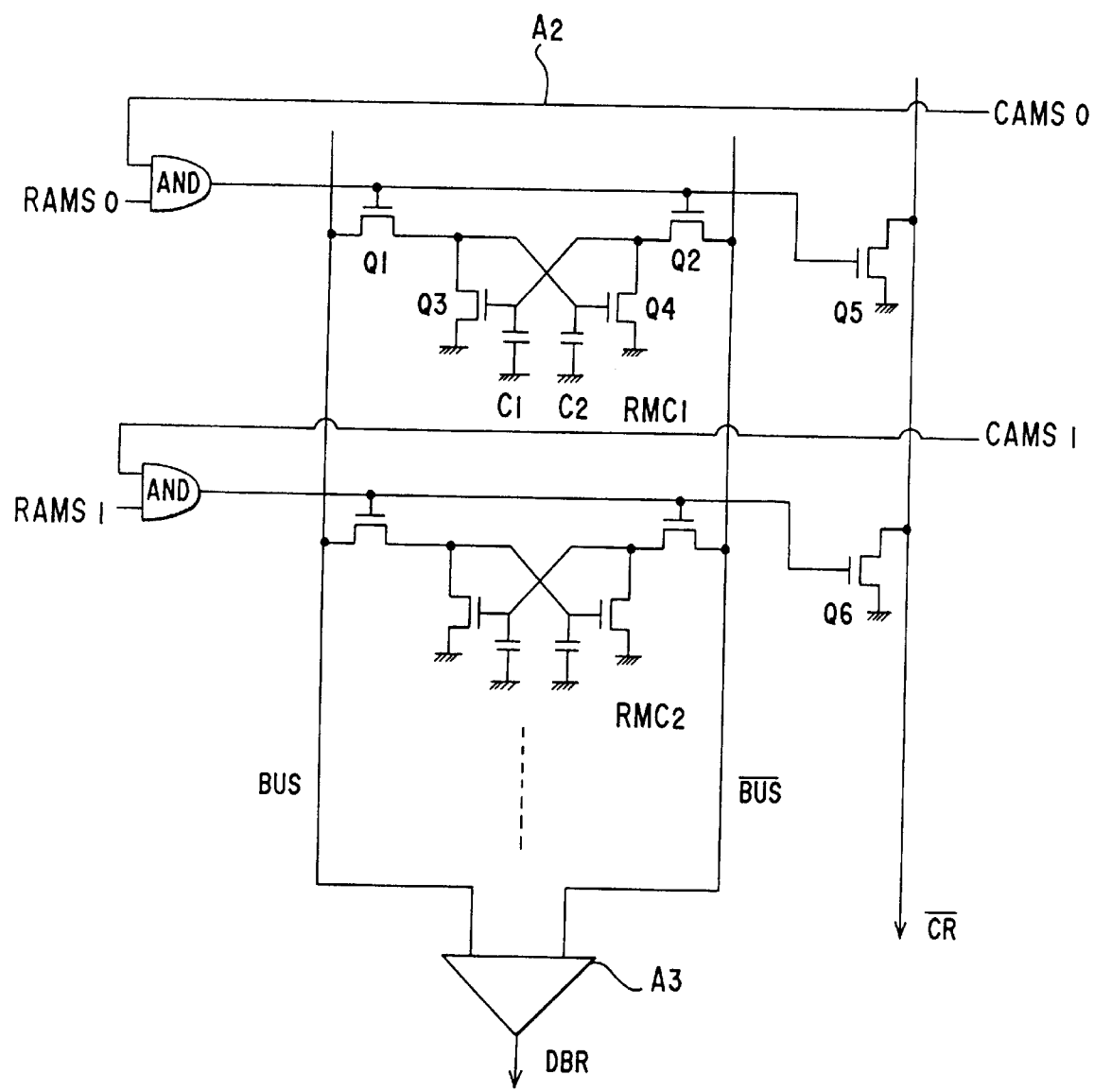
FIG. 7 is a circuit diagram of the redundant memory cell array of the arrangement shown in FIG. 6.

FIG. 7 shows the redundant memory cell array A2 of the arrangement shown in FIG. 6. As shown in FIG. 7, the redundant memory cell array A2 is similar to the redundant memory cell array A2 shown in FIG. 5 because each redundant memory cell comprises a four-transistor dynamic memory cell, but differs therefrom in that it has AND gates each for being supplied with an address matching signal RAMS from the row address comparison circuit and an address matching signal CAMS from the column address comparison circuit.

ADDRESS COMPARISON CIRCUIT

Figure 8:
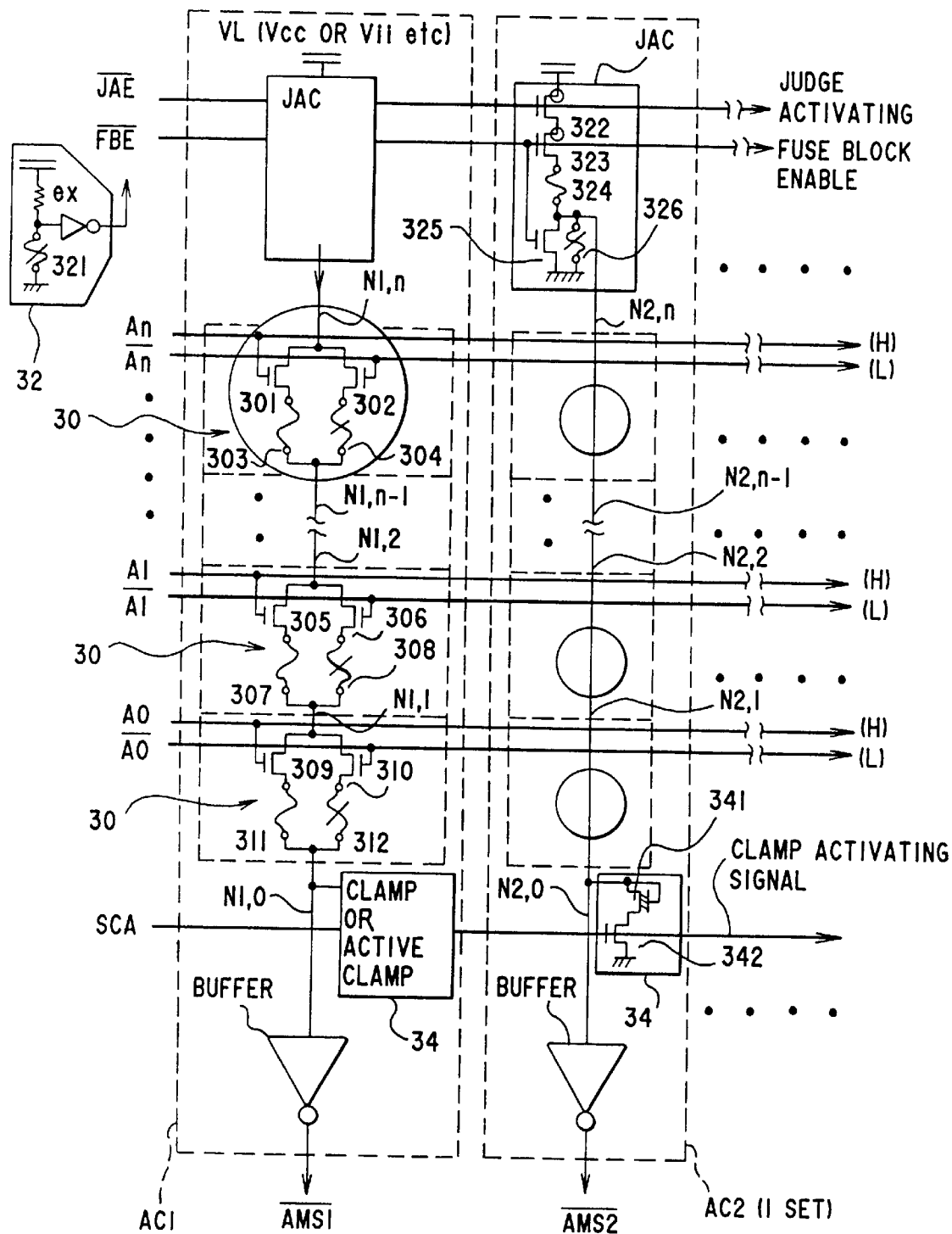
FIG. 8 is a circuit diagram of the address comparison circuit.

FIG. 8 shows the address comparison circuit A1. As shown in FIG. 8, the address comparison circuit A1 comprises Na sets of AND gates as described above with reference to FIGS. 4 and 6. FIG. 8 illustrates sets AC1, AC2 of AND gates. The AND gate set AC1 comprises a judge activation circuit JAC connected to a power supply VL and activatable by a judge activating enable signal /JAE, AND gates 30 for storing an address of a redundant bit and comparing it with an inputted address A0~An, a clamp circuit 34, and a buffer amplifier BUF.

Basic operation of the address comparison circuit Al shown in FIG. 8 is as follows: When the judge activation circuit JAC is activated, it supplies a current from the power supply VL to the AND gates 30. Therefore, a node N1,n goes high in level. A ROM which comprises fuses 303, 304, 307, 308, 311, 312 of the AND gates 30 store in advance an address corresponding to a faulty cell. In the AND gate set AC1 shown in FIG. 8, all the right-hand fuses have been made open by the writing of the address bits. When address bits An, A1, A0 are all high in level, transistors 301, 305, 309 are turned on, outputting a high level to a node N1,0. That is, an ANDed logic level of the address bits An, A1, A0 is outputted to the node N1,0.

Only when the inputted address matches the stored address corresponding to the faulty cell the capacitive loads of the nodes are charged to a high level by the power supply VL. If the inputted address does not match the stored address, then the current from the power supply VL stops at either one of the nodes. Since only one AND gate represents a comparison match with respect to the address, any current consumption at most of the AND gates is very small. The NOR-type address comparison circuit disclosed in Japanese laid-open patent publication No. 4-232688, however, consumes a relatively large current because a current flows through all NOR transistors which represent a comparison unmatch whereas no current flows through only an NOR gate which represents a comparison match.

The judge activation circuit JAC comprises P-channel transistors 322, 323, fuses 324, 326, and an N-channel transistor 325. In response to a judge activating enable signal /JAE, the P-channel transistor 322 is rendered conductive, activating the address comparison circuit. If a faulty cell is found by a final check test at the time of shipment from the factory, then an address corresponding to the faulty cell is written in a ROMs comprising fuses in the AND gate sets AC1, AC2. Once the address is written, the fuse 326 is opened. Therefore, the judge activation circuit JAC supplies a current to a node N2,n. If no address is written in the AND gate, then the fuse 324 is opened. Therefore, the node N2,n of the AND gate in which no address is written is forcibly fixed to a GND level. The address comparison circuit is divided into a plurality of blocks, and a block enable signal /FBE is a signal for activating only those blocks which are used. A low level of the block enable signal /FBE is supplied to the blocks which are used, and a high level of the block enable signal /FBE is supplied to the blocks which are not used. The block enable signal /FBE can be fixed to a low level by opening a fuse 321 in a block enable signal generating circuit 32 for generating the block enable signal /FBE.

The clamp circuit 34 comprises a depression transistor 341 and a transistor 342 which can be rendered conductive by a clamp activating signal SCA. For resetting the address comparison circuit, the clamp activating signal SCA is rendered high in level, clamping nodes N1,0, N2,0 to a low level. The clamp circuit 34 may not necessarily be an active circuit, but may be a circuit for connecting the node to ground at all times through a predetermined impedance. In the circuit arrangement shown in FIG. 8, address matching signals /AMS1, /AMS2 outputted from the address comparison circuit are in opposite phase with those shown in FIGS. 4 and 6.

Figure 9:
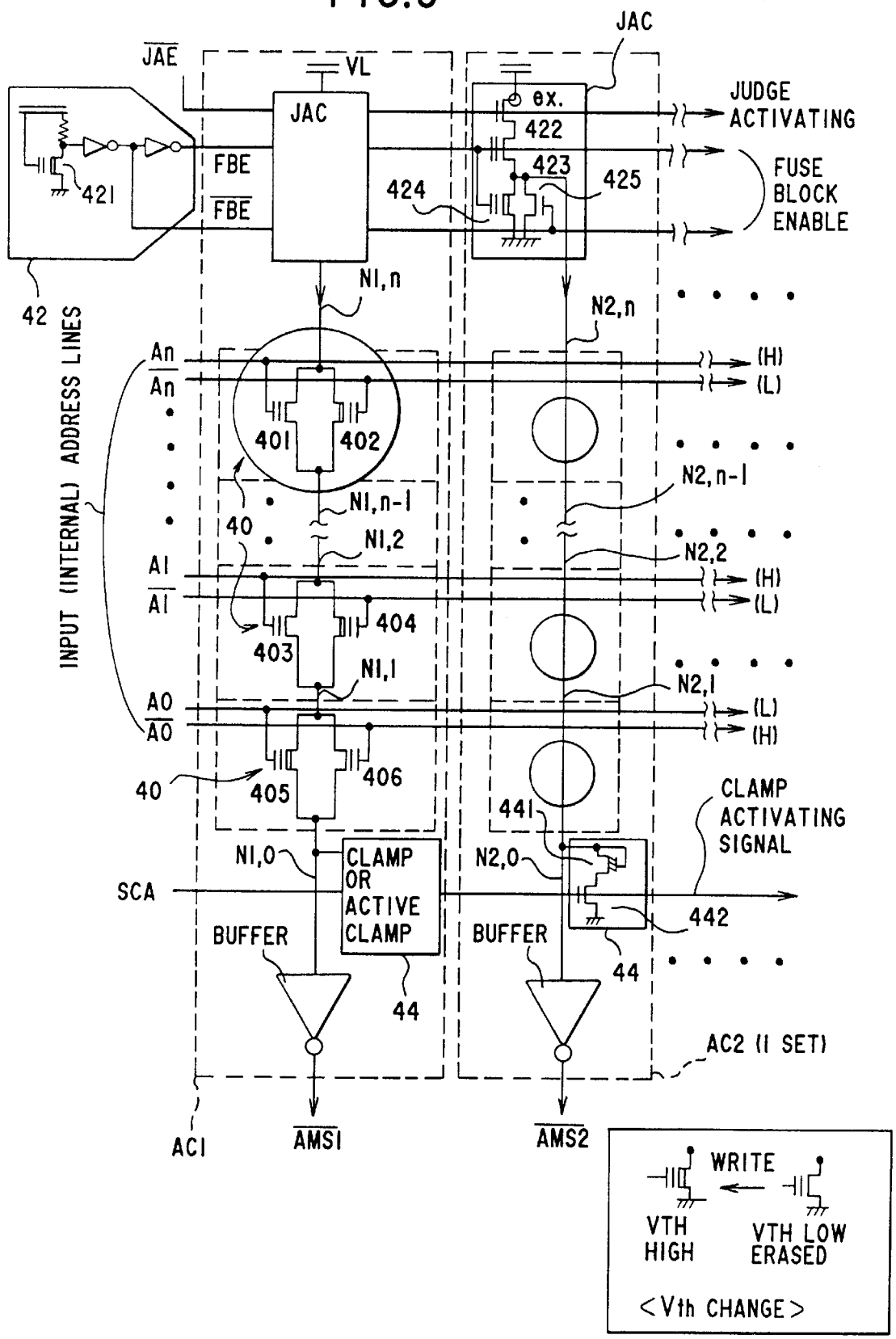
FIG. 9 is a circuit diagram of another arrangement of AND gates of the address comparison circuit.

FIG. 9 shows another arrangement of AND gates of the address comparison circuit A1. In the arrangement shown in FIG. 9, a ROM for storing an address of a faulty cell comprises electrically writable and erasable elements (memory cell) such as EEPROMS (which may be flush memories). As shown in a lower right-hand portion of FIG. 9, each of the EEPROMs has a transistor whose threshold voltage Vth is higher when an address signal is written therein and lower when an address signal is erased therefrom. Therefore, insofar as an address signal is written, the transistor is not rendered conductive even if any signal is applied to its gate, and functions as an open fuse.

The EEPROMs allow AND gate elements 40 to comprise transistors which perform both functions as a ROM and an AND gate transistor. In the example shown in FIG. 9, an address is written in transistors 402, 404, 405 of an AND gate set AC1, making their threshold voltage higher. Therefore, only when address signals An, A1, A0 are high, high, and low levels, respectively, a current reaches down to the lowermost node N1,0, making it high in level.

A judge activation circuit JAC, a clamp circuit 44, and a block enable signal generating circuit 42 shown in FIG. 9 have the same functions as those of the corresponding circuits shown in FIG. 8. The judge activation circuit JAC comprises a P-channel transistor 422, two EEPROM transistors 423, 424, and an N-channel transistor 425. When an address corresponding to a faulty address is written, a signal is written in the transistor 424, making its threshold voltage higher. In an AND gate set in which no address is written, a signal is written in the transistor 423, cutting off a current from the power supply.

In the block enable signal generating circuit 42 which generates a block enable signal FBE, a signal is written in a transistor 421 with respect to a block which is being used, making the block enable signal FBE high in level. As a result, the transistor 423 is turned on and the transistor 425 is turned off, thereby supplying a current from the power supply VL to the AND gates.

While the EEPROMs are employed in FIG. 9, circuits for writing signals into and erasing signals from those EEPROMs are omitted from illustration for the sake of brevity. The EEPROMs may be similarly used in an application in which their threshold voltage is higher when an address signal is erased therefrom and lower when an address signal is written therein.

In each of the AND-type address comparison circuits shown in FIGS. 8 and 9, when all the transistors of the AND elements corresponding to respective address signals are energized, a path is established for a current supplied from the power supply thereby to output an address matching signal as a result of comparison. Therefore, as more address signals are inputted, it takes a longer time until a result of comparison is outputted. This may be a disadvantage which the AND-type address comparison circuits suffer.

Figure 10:
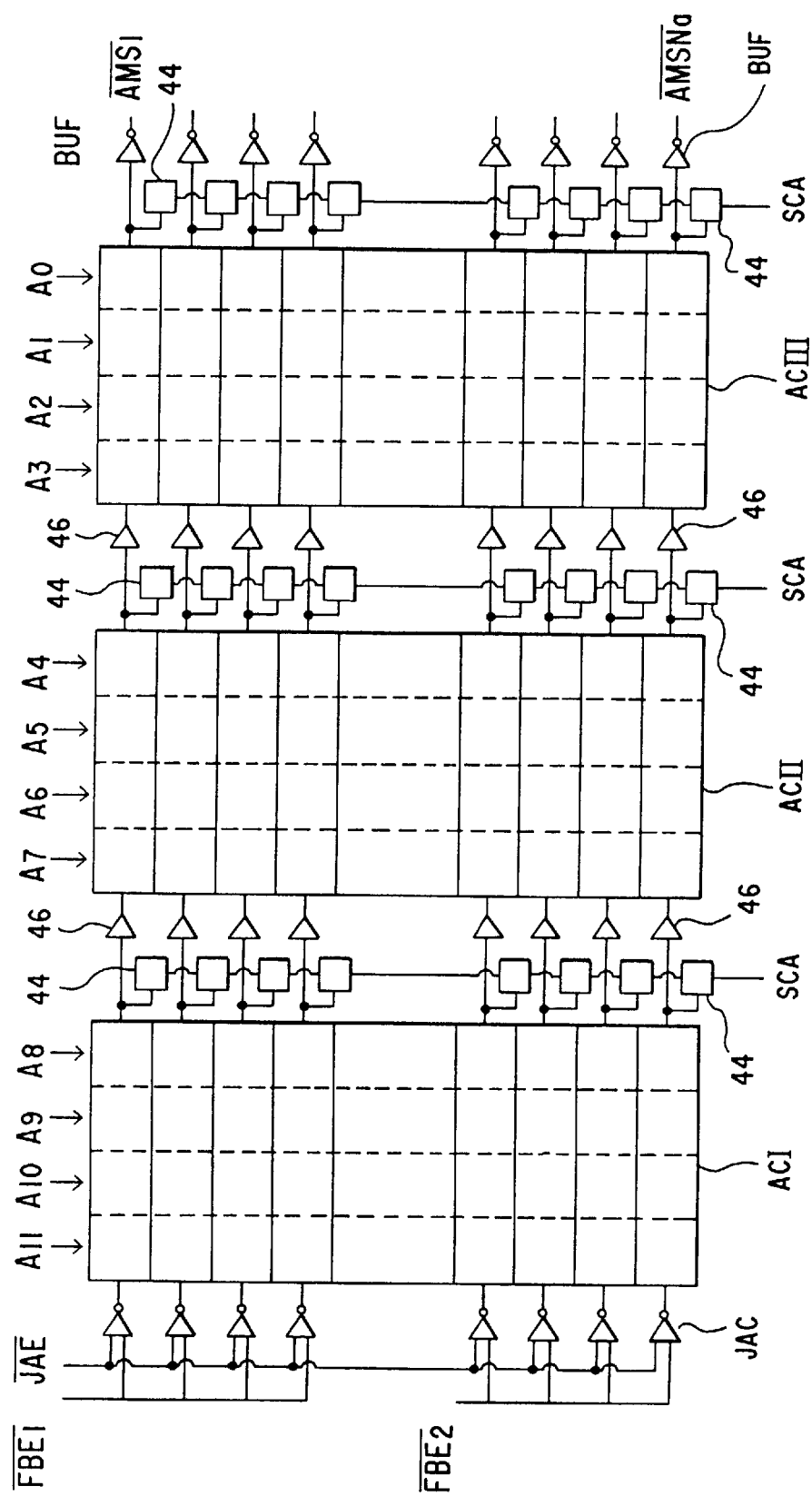
FIG. 10 is a block diagram of an improved address comparison circuit.

FIG. 10 shows in block form an address comparison circuit which is improved to eliminate the above drawback.

The address comparison circuit shown in FIG. 10 is divided into three AND gate blocks, i.e., an AND gate block ACI for comparing address signals A11~A8, an AND gate block ACI for comparing address signals A7~A4, and an AND gate block ACIII for comparing address signals A3~A0. The AND gate blocks ACI, ACII, ACIII have output terminals to which clamp circuits 44 and buffers 46 are connected. For resetting the address comparison circuit, a clamp signal SCA is applied to the clamp circuits 44 to render input terminals of the buffers 46 low in level. Thereafter, address bits or signals are applied to the address comparison circuit. A current from the power supply VL first flows from a judge activation circuit JAC into the AND gate block ACI which is supplied with the address bits or signals A11~A8. If these high-order address bits A11~A8 match address bits stored in the AND gate block ACI, then the current from the power supply which is connected to the buffers 46 coupled to the output terminals of the AND gate block ACI flows into the AND gate block ACII which is supplied with the intermediate-order address bits or signals A7~A4. If these intermediate-order address bits or signals A7~A4 match address bits stored in the AND gate block ACII, then the current from the power supply which is connected to the buffers 46 coupled to the output terminals of the AND gate block ACII flows into the AND gate block ACIII which is supplied with the low-order address bits or signals A3~A0. Only if all the inputted address bits match the stored address bits, an address matching signal /AMS1-/AMsNa goes low in level.

With the address comparison circuit shown in FIG. 10, the length of each of the AND gate sections to be driven by the buffers JAC, 46 is shorter, and their CR time constant is smaller correspondingly, making it possible to determine the output signal at higher speed. Nevertheless, the current consumed by the address comparison circuit shown in FIG. 10 is not simply three times the current consumed by the AND-type address comparison circuits shown in FIGS. 8 and 9.

The address comparison circuit shown in FIG. 10 is also vertically divided into a plurality of blocks. In the vertically divided blocks, the upper four sets of AND gates are activated by a block enable signal /FBE1, and the lower four sets of AND gates are activated by a block enable signal /FBE2, for example.

Figure 11:
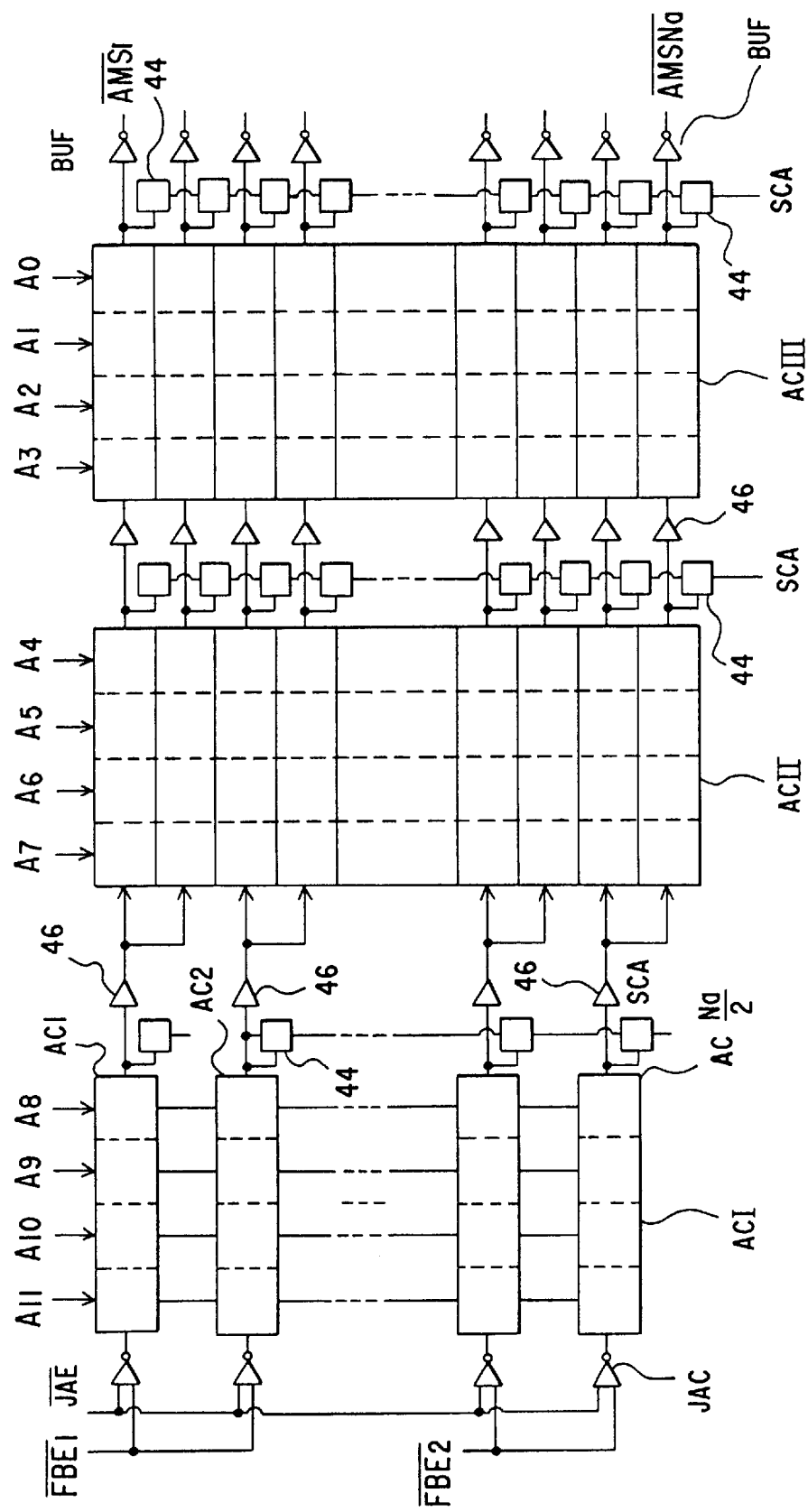
FIG. 11 is a block diagram of an address comparison circuit according to an improvement in the address comparison circuit shown in FIG. 10.

FIG. 11 shows in block form an address comparison circuit according to an improvement in the address comparison circuit shown in FIG. 10. The address comparison circuit shown in FIG. 11 is identical to the address comparison circuit shown in FIG. 10 in that it is divided into AND gate blocks ACI, ACII, ACIII, but differs therefrom in that the AND gate block ACI for comparing the address bits A11~A8 comprises a reduce number of Na/2 sets of AND gates, so that two sets of AND gates are associated with one set of AND gates ACII for comparing high-order address bits. The arrangement shown in FIG. 11 reduces the total number of AND gates ACI used and accordingly reduces the current which is consumed. Of course, the number of sets of AND gates of the AND gate block ACI may further be reduced.

In the arrangement shown in FIG. 11, the high-order address bits are held in a 1-to-2 correspondence to the low-order address bits. Therefore, a comparison matching signal which is produced when the high-order address bits A11~A8 maches with stored datas is supplied through the buffers 46 to two sets of low-order AND gates ACI. Since the number of redundant cells to replace faulty cells is not reduced, the number of address bits that can be relieved is not simply reduced, but may be reduced in terms of probability. Specifically, if two bits are not relieved but only one bit is relieved in a common area which has a common the high-order address bits A11~A8, reduced to ½ in a worst case.

However, faulty cells whose refresh intervals are short are distributed nearly according to the Poisson distribution, the above worse case will rarely take place. If the number of high-order-bit AND gates to be dispensed with is optimized while taking into account the distribution of refresh-failure cells, then it is possible to relieve a sufficient number of bits of refresh-failure cells with a reduced amount of current consumption.

Various methods may be available for dispensing with AND gates. However, it is effective to leave a bulk transistor so as to allow a mask to be modified later and then modify sets of AND gates to be dispensed with by modifying a mask in the future. Such a change may be made with a mask layer closely to the final step of the fabrication process so that circuits to be dispensed with may be flexibly modified. It is particularly preferable to modify the number of AND gates to be dispensed with based on a mask option for an interconnection layer (normally, a metal layer) which is positioned as an uppermost layer.

REDUNDANT MEMORY CELL ARRAY FOR RELIEVING FIXED-FAILURE CELL AND ADDRESS COMPARISON CIRCUIT

The redundant memory cell array B2 to replace each line or block for relieving fixed-failure cells is provided in common with a plurality of memory cell blocks on a memory chip has been described above with reference to FIGS. 1 and 2. An example of such a redundant memory cell array for relieving fixed-failure cells will be described below.

Figure 12:
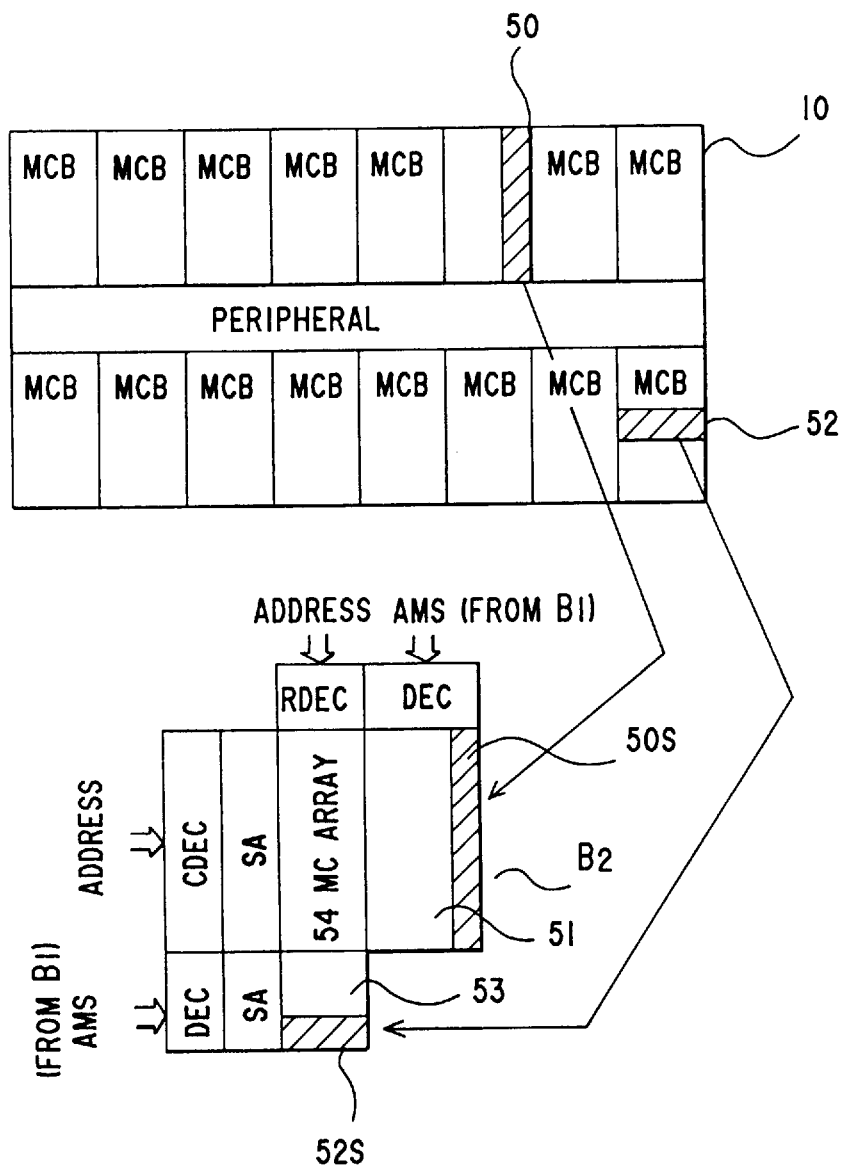
FIG. 12 is a block diagram showing how the redundant memory cell array replaces a line or block which contains faulty cells.

FIG. 12 shows how the redundant memory cell array B2 replaces a line or block which contains faulty cells. In the example shown, arrays of 16 memory cell blocks MCB are provided on a semiconductor memory chip 10, and peripheral circuits are disposed between the arrays of 16 memory cell blocks MCB. The semiconductor memory chip 10 also has the redundant memory cell array B2 and the address comparison circuit B1 (not shown).

It is assumed that fixed-failure cells are detected in areas 50, 52 which are shown hatched, the area 50 suffering a word-line short-circuit failure and the area 52 suffering a bit-line short-circuit failure. In this case, the area 50 with a plurality of adjacent word lines is replaced with an area 50S in the redundant memory cell array B2, and the area 52 with a plurality of adjacent bit lines is replaced with an area 52S in the redundant memory cell array B2. The redundant memory cell array B2 contains a memory cell array 54 having the same storage capacity as the memory cell blocks MCB, sense amplifiers SA, a row decoder and driver RDEC, a column decoder and selector CDEC, a row redundant memory cell array 51, a decoder associated therewith, a column redundant memory cell array 53, and a decoder associated therewith. The decoders DEC associated with the respective redundant memory cell arrays 51, 53 are supplied with address matching signals AMS from the address comparison circuit B1, selecting the replacing redundant cell areas 50S, 52S. The row and column decoders RDEC, CDEC are supplied with normal address signals to access to the replacing redundant cells which have replaced the fixed-failure cells.

Figure 13:
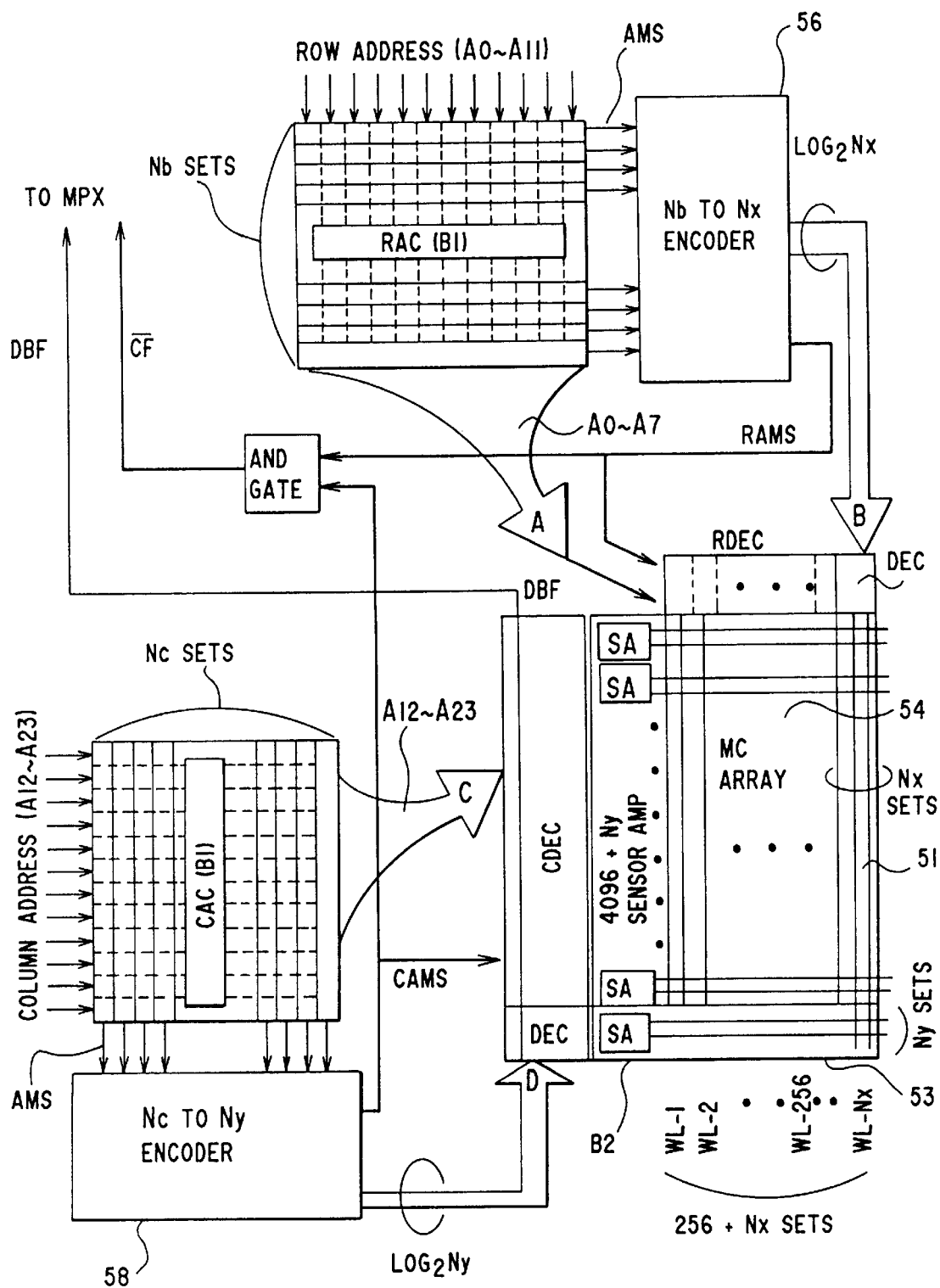
FIG. 13 is a block diagram showing in detail the relationship between the redundant memory cell array and the address comparison circuit.

FIG. 13 shows in detail the relationship between the redundant memory cell array B2 and the address comparison circuit B1. The redundant memory cell array B2 is of substantially the same structure as the redundant memory cell array B2 shown in FIG. 12. The redundant memory cell array B2 comprises a 256×4096 memory cell array 54 having the same storage capacity as ordinary memory cell blocks, a row redundant memory cell array 51 which comprises Nx sets of word lines, and a column redundant memory cell array 53 which comprises Ny sets of bit line pairs. If a set to be replaced of word lines comprises four word lines, then the row redundant memory cell array 51 comprises Nx×4 word lines. If a set to be replaced of bit line pairs comprises two bit line pairs, then the column redundant memory cell array 53 comprises Ny×2 bit line pairs. Therefore, the redundant memory cell array B2 has a total of 4096+(Ny×2) sense amplifiers.

The address comparison circuit B1 is divided into a row address comparison circuit RAC and a column address comparison circuit CAC. Address matching signals from the address comparison circuits RAC, CAC are supplied to decoders DEC of the respective redundant memory cell arrays 51, 53. In FIG. 13, the row address comparison circuit RAC comprises Nb sets of AND gates for storing Nb row addresses. Since it is more efficient to replace faulty cells with redundant cells per plural word lines, as described above, Nb address matching signals AMS are encoded into Nx bits representative of the number of replacing sets of word lines of the row redundant memory cell array by an encoder 56, which outputs $\log_2 Nx$ bits of a selection signal required to select the word line sets Nx in order to save an area for interconnections. At the same time, low-order 8 bits A0–A7 of row address bits A0–A11 supplied to the row address comparison circuit RAC are also supplied to the row decoder RDEC of the redundant memory cell array.

The column address comparison circuit CAC comprises Nc sets of AND gates for storing Nc column addresses. Nc address matching signals AMS are encoded into Ny bits by an encoder 58, which outputs $\log_2 Ny$ bits of a selection signal required to select the bit line pair sets Ny to the decoder DEC of the column redundant memory cell array 53. At the same time, column address bits A12~A23 supplied to the column address comparison circuit CAC are also supplied to the column decoder CDEC of the redundant memory cell array.

A row address matching signal RAMS outputted from the row address comparison circuit RAC and a column address matching signal CAMS outputted from the column address comparison circuit CAC are supplied as a comparison matching signal /CF through an AND gate to the multiplexer MPX. Replacement data from the replacement data bus DBF are also supplied to the multiplexer MPX. The row address matching signal RAMS is also supplied to the row decoder and driver RDEC to prohibit the memory cell array 54 from being selected when the row redundant memory cell array 51 is selected. Similarly, the column address matching signal CAMS is also supplied to the column decoder and selector CDEC to prohibit the memory cell array 54 from being selected when the column redundant memory cell array 53 is selected.

Figure 14:
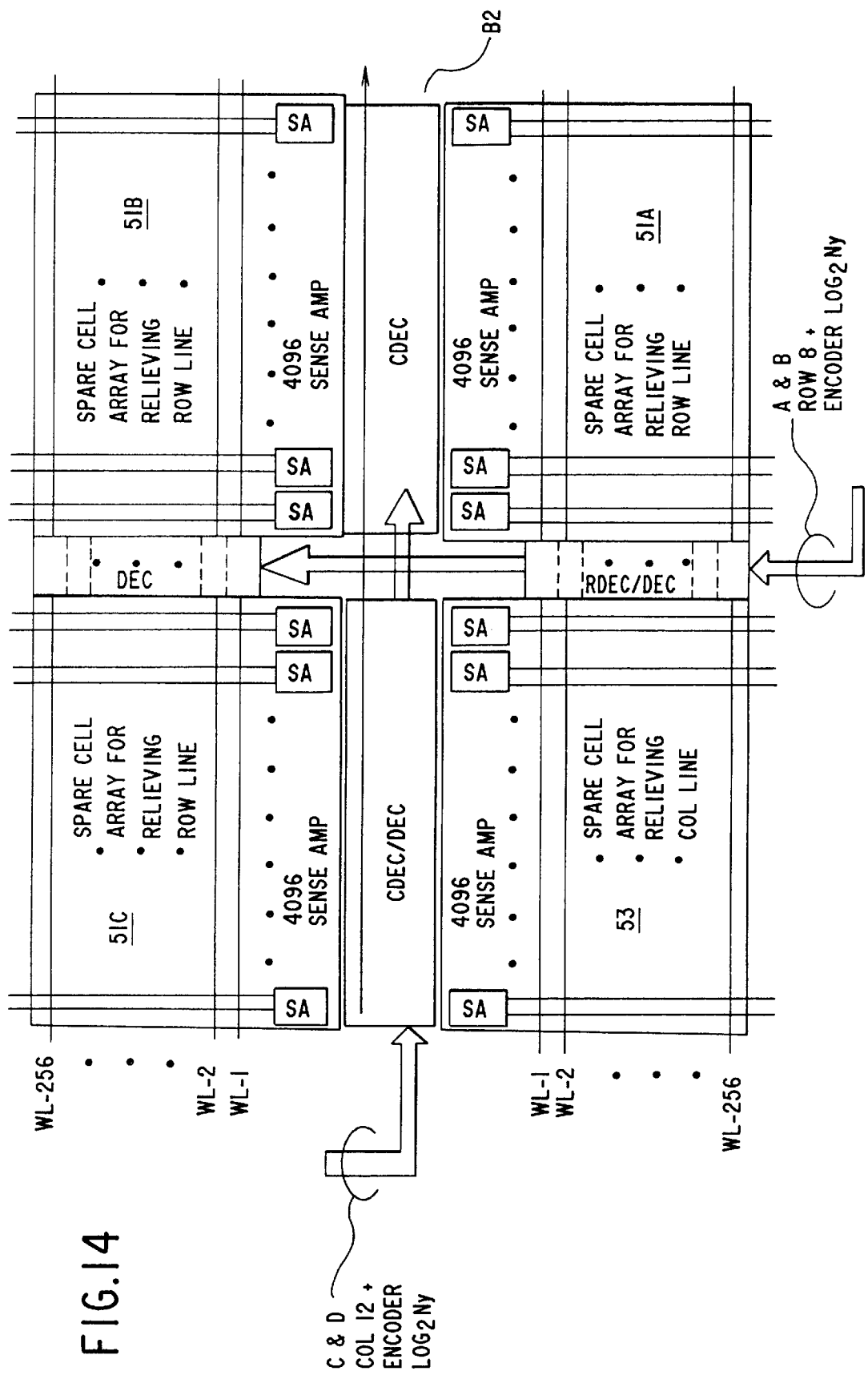
FIG. 14 is a block diagram of redundant memory cell arrays of greater storage capacity for replacing word lines and a redundant memory cell array of smaller storage capacity for replacing bit lines.

FIG. 14 shows in block form row redundant memory cell arrays 51A, 51B, 51C of greater storage capacity for replacing word lines and a column redundant memory cell array 53 of smaller storage capacity for replacing bit lines, the storage capacity of the redundant memory cell array 53 being one-third of that of the row redundant memory cell arrays 51A, 51B, 51C. In order to increase the space efficiency by using in common the row and column decoders RDEC, CDEC and the decoder DEC for the redundant memory cell array, the row redundant memory cell arrays 51A, 51B, 51C and the column redundant memory cell array 53 are arranged as illustrated in FIG. 14. The respective decoders are supplied with address signals A, C and encoded redundant memory cell selection signals B, D as shown in FIG. 14.

In FIG. 14, the row redundant memory cell arrays 51A, 51B, 51C have a total of 256×3=768 word lines, and the column redundant memory cell array 53 has 4096 bit line pairs.

Figure 15:
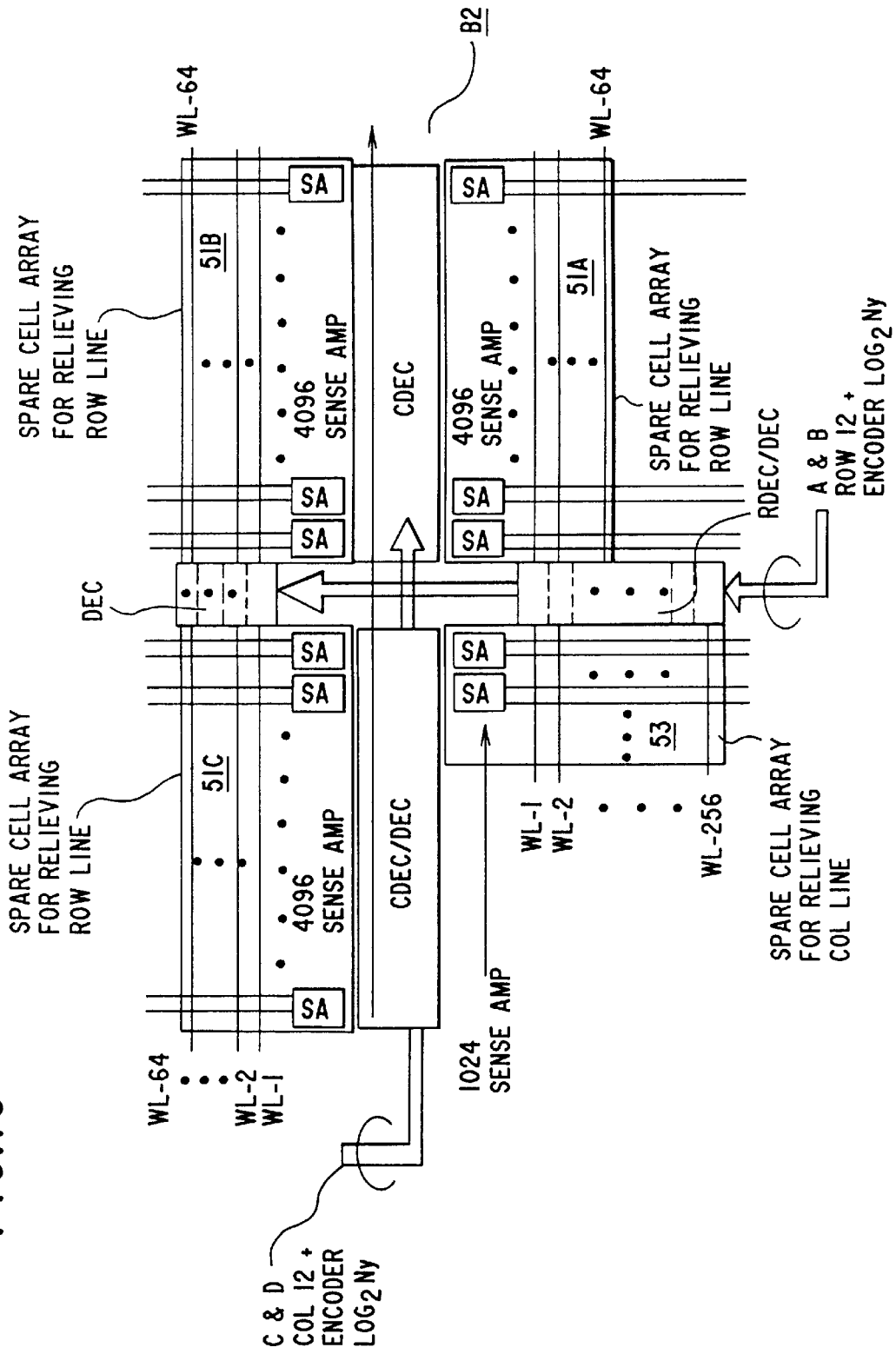
FIG. 15 is a block diagram of a modification of the redundant memory cell array for relieving fixed-failure cells.

FIG. 15 shows in block form a modification of the redundant memory cell array B2 for relieving fixed-failure cells, the modified redundant memory cell array being equivalent to the redundant memory cell array shown in FIG. 14. In FIG. 15, the redundant memory cell array includes row redundant memory cell arrays 51A, 51B, 51C each having 64 word lines, and hence has a total of 64×3= 192 word lines. The redundant memory cell array also includes a column redundant memory cell array 53 having 1024 bit line pairs. The ratio of the word lines to the bit line pairs should preferably be optimized depending on the occurrence of failures contained in each memory chip.

COMBINED ADDRESS COMPARISON CIRCUIT AND REDUNDANT MEMORY CELL ARRAY

Figure 16:
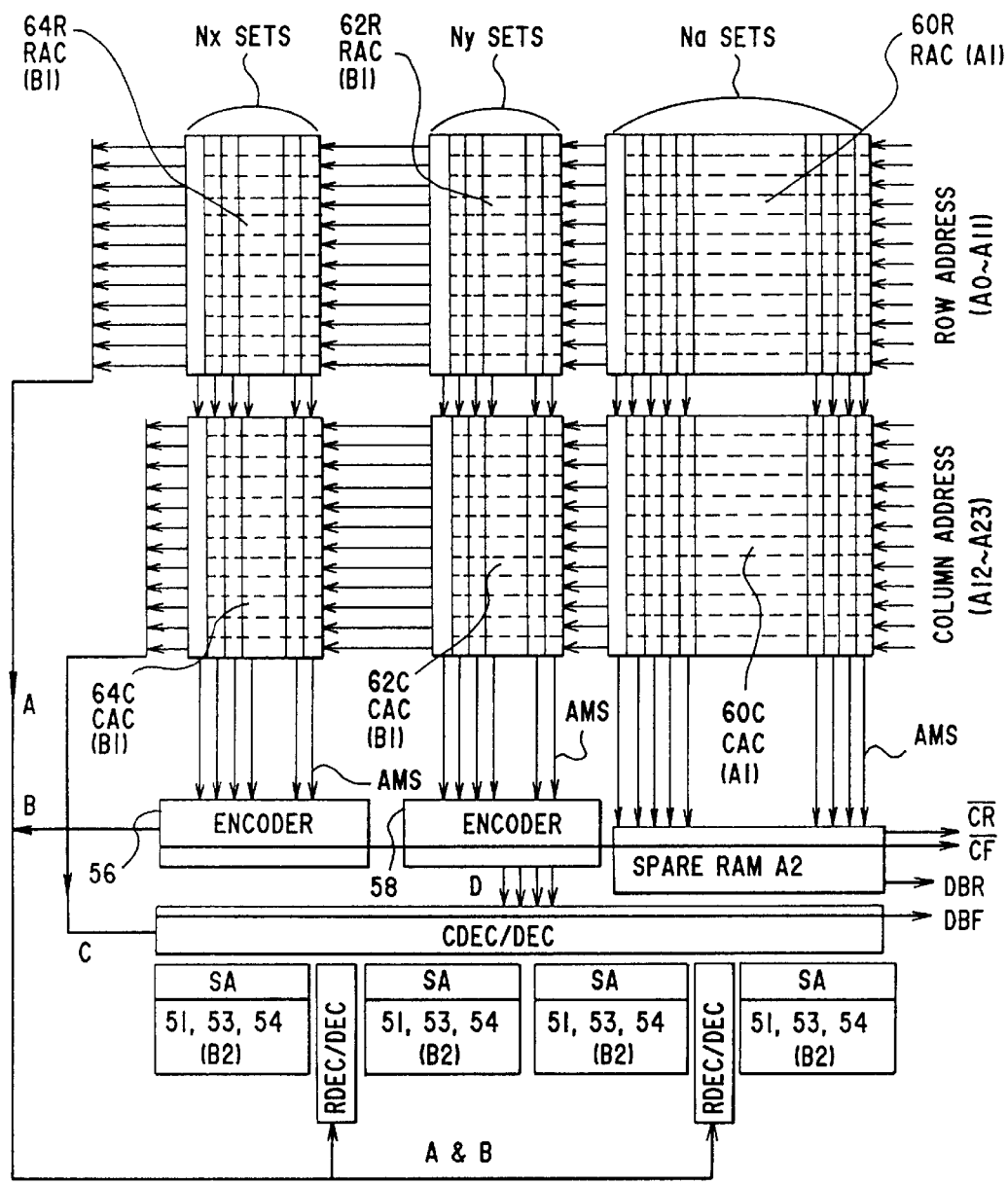
FIG. 16 is a block diagram showing in detail an address comparison circuit for refresh-failure cells, a redundant memory cell array therefor, an address comparison circuit for fixed-failure cells, and a redundant memory cell array therefor, which are combined together.

FIG. 16 shows in detailed block form an address comparison circuit Al for refresh-failure cells, a redundant memory cell array A2 for refresh-failure cells, an address comparison circuit Bl for fixed-failure cells, and a redundant memory cell array B2 for fixed-failure cells, which are combined together. As described above with reference to FIG. 2, it is most efficient to combine the address comparison circuits A1, B1 into an address comparison circuit C1.

In FIG. 16, for being supplied with row address bits A0–A11 and column address bits A12–A23, address comparison circuits 60R, 60C for refresh-failure cells and address comparison circuits 62R, 62C, 64R, 64C for fixed-failure cells are arranged as shown. In the redundant memory cell array A2 for refresh-failure cells, memory cells to replace refresh-failure cells are directly accessed by address matching signals AMS from the address comparison circuits 60R, 60C. In the redundant memory cell array B2 for fixed-failure cells, as described above with reference to FIG. 13, memory cells to replace fixed-failure cells are accessed by signals decoded from selection signals B, D which are produced by encoders 56, 58 based on address matching signals AMS from the address comparison circuit B1.

A comparison matching signal /CR and replacement data bus DBR for a refresh-failure cell are given to the multiplexer MPX shown in FIG. 3. Similarly, a comparison matching signal /CR and replacement data bus DBF for a fixed-failure cell are also given to the multiplexer MPX.

In FIG. 16, the redundant memory cell array A2 replaces faulty cells per bit. Therefore, the address comparison circuit A1 is supplied with address signals A0–A23 corresponding to all 16 Mbits for comparing them with replacement address bits stored in the AND gates;

In FIG. 16, the redundant memory cell array B2 may replace faulty cells per bit or may replace faulty cells per line or block as described above. The address comparison circuit B1 has AND gate groups 62R, 62C, 64R, 64C for being supplied with all address signals to compare the supplied address signals with replacement address bits. Theoretically, therefor, it is possible to replace faulty bits with redundant memory cells per bit. Actually, however, faulty bits are replaced with redundant memory cells per line or block. In such a case, a comparison matching signal from a corresponding AND gate is partly ignored.

In FIG. 16, the redundant memory cell array B2 for fixed-failure cells is divided into two blocks each having a row decoder RDEC/DEC at its center. Since the redundant memory cell array B2 is of large storage capacity, it is of the same structure as a DRAM which comprises a matrix of memory cells each comprising a transistor and a capacitor.

Figure 17:
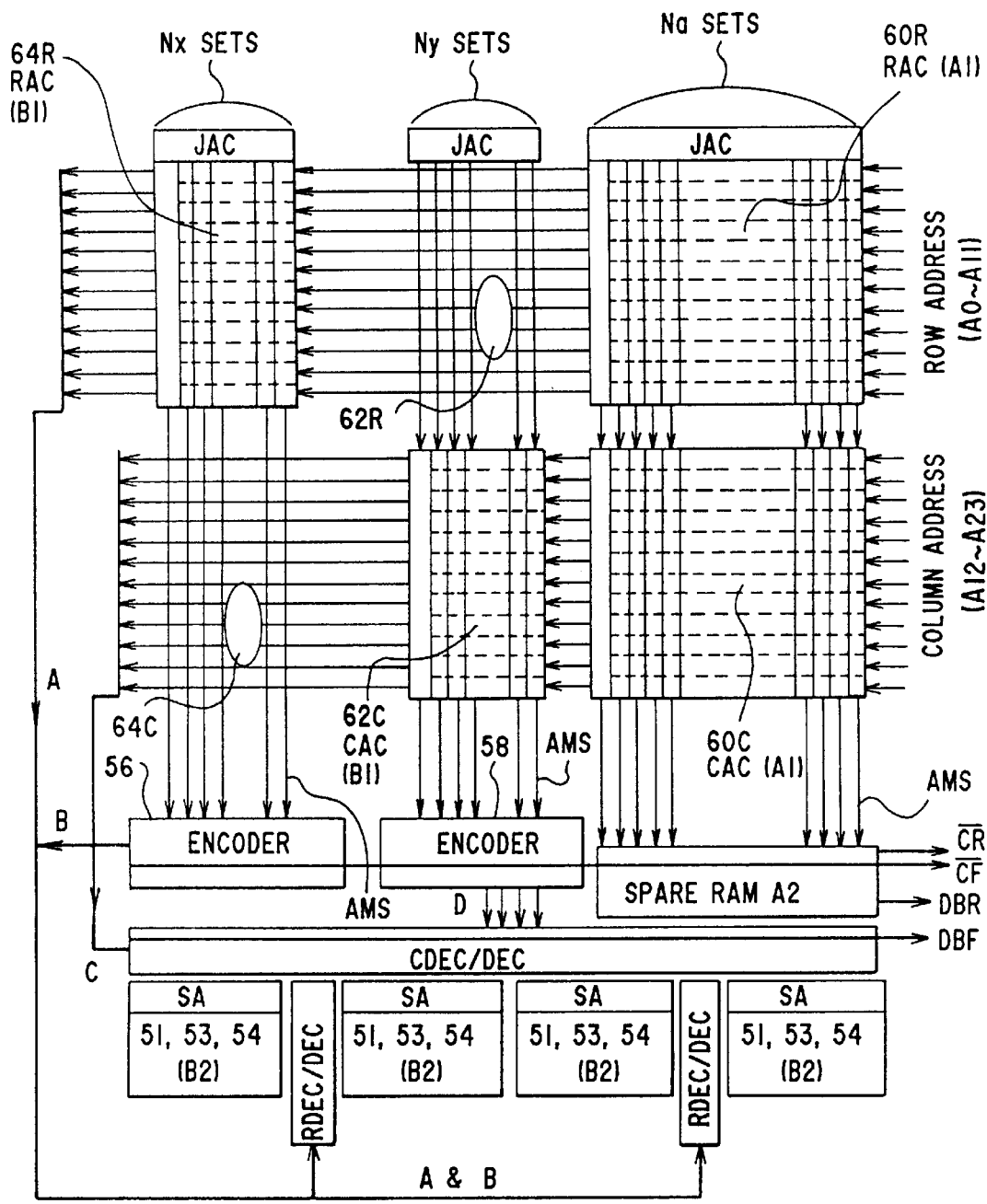
FIG. 17 is a block diagram of another combined arrangement of address comparison circuits and redundant memory cell arrays.

FIG. 17 shows in block form another combined arrangement of address comparison circuits and redundant memory cell arrays shown in FIG. 2. The combined arrangement shown in FIG. 17 differs from the combined arrangement shown in FIG. 16 in that the AND gate group 62R for comparing row address bits and the AND gate group 64C for comparing column address bits are omitted from the redundant memory cell array B1 for fixed-failure cells.

As shown in FIG. 13, it is practical for the redundant memory cell array for fixed-failure cells to replace faulty cells per word or bit line due to the probability of failure occurrence. In such an application, it is sufficient for a selection signal supplied to the row decoder RDEC/DEC to be generated from an address matching signal AMS from the comparison circuit 64R which has compared row address bits, and it is also sufficient for a selection signal supplied to the column decoder CDEC/DEC to be generated from an address matching signal AMS from the comparison circuit 62C which has compared column address bits. Because the AND gate groups 62R, 64C are dispensed with, the current which is consumed is smaller than the arrangement shown in FIG. 16.

Figure 18:
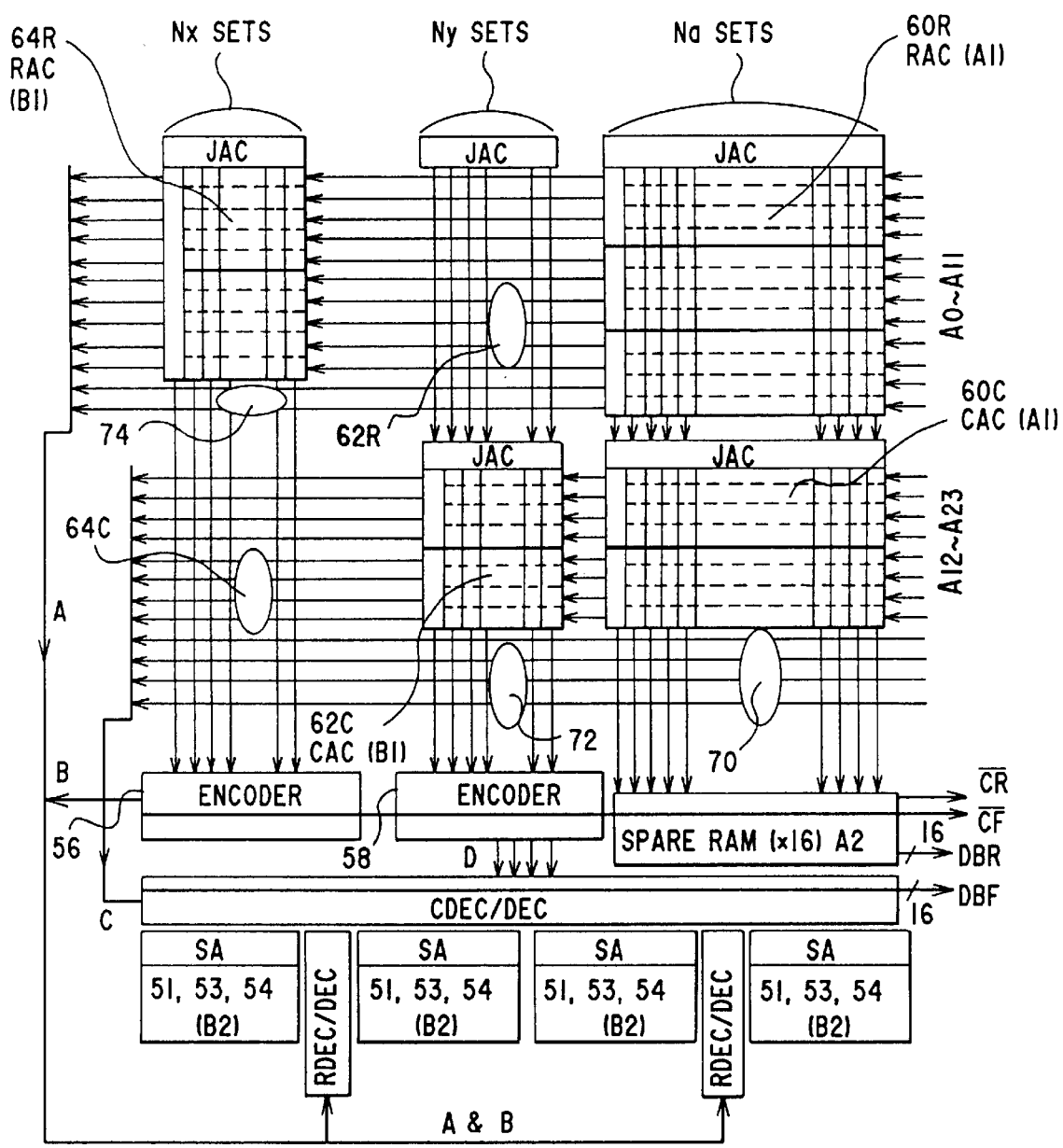
FIG. 18 is a block diagram showing an improvement of the combined arrangement of address comparison circuits and redundant memory cell arrays shown in FIG. 17.

FIG. 18 shows in block form an improvement of the combined arrangement of address comparison circuits and redundant memory cell arrays shown in FIG. 17. In FIG. 18, first, the redundant memory cell array A2 for relieving refresh-failure cells produces a 16-bit output signal, so that each of the replacement data buses DBR, DBF comprises 16 lines. AND gate groups 70, 72 for comparing four column address bits are omitted from the address comparison circuits 60C, 62C. The address comparison circuit 60C may thus have only memory circuits and comparison circuits for eight address bits A12~A20. The redundant memory cell array A2 comprises 16 static memory cells shown in FIG. 5 which are arranged along address comparison signals AMS. The redundant memory cell array B2 replaces faulty cells altogether per 16 bit line pairs.

Secondly, the redundant memory cell array B2 for relieving fixed-failure cells replaces faulty cells by four word lines. Therefore, an AND gate group 74 for comparing 2 row address bits is omitted from the address comparison circuit 64R. The address comparison circuit 64R is thus arranged to correspond to 10 address bits A0~A9.

Thirdly, each of the address comparison circuits 60R, 60C, 64R, 62C is divided into a plurality of blocks as indicated by thick lines as described above with reference to FIG. 10. Although not shown in FIG. 18, clamp circuits and amplifier buffer circuits are provided between the divided blocks for increased speed of address comparison as shown in FIG. 10.

In FIG. 18, each of the replacement data buses DBR, DBF is of a 16-bit arrangement. This 16-bit arrangement provides a high matching capability if the global data bus in the memory is of a 16-bit arrangement and the input/output circuits are also of a 16-bit arrangement, because the multiplexer MPX shown in FIG. 3 multiplexes a 16-bit data signal.

Figure 19:
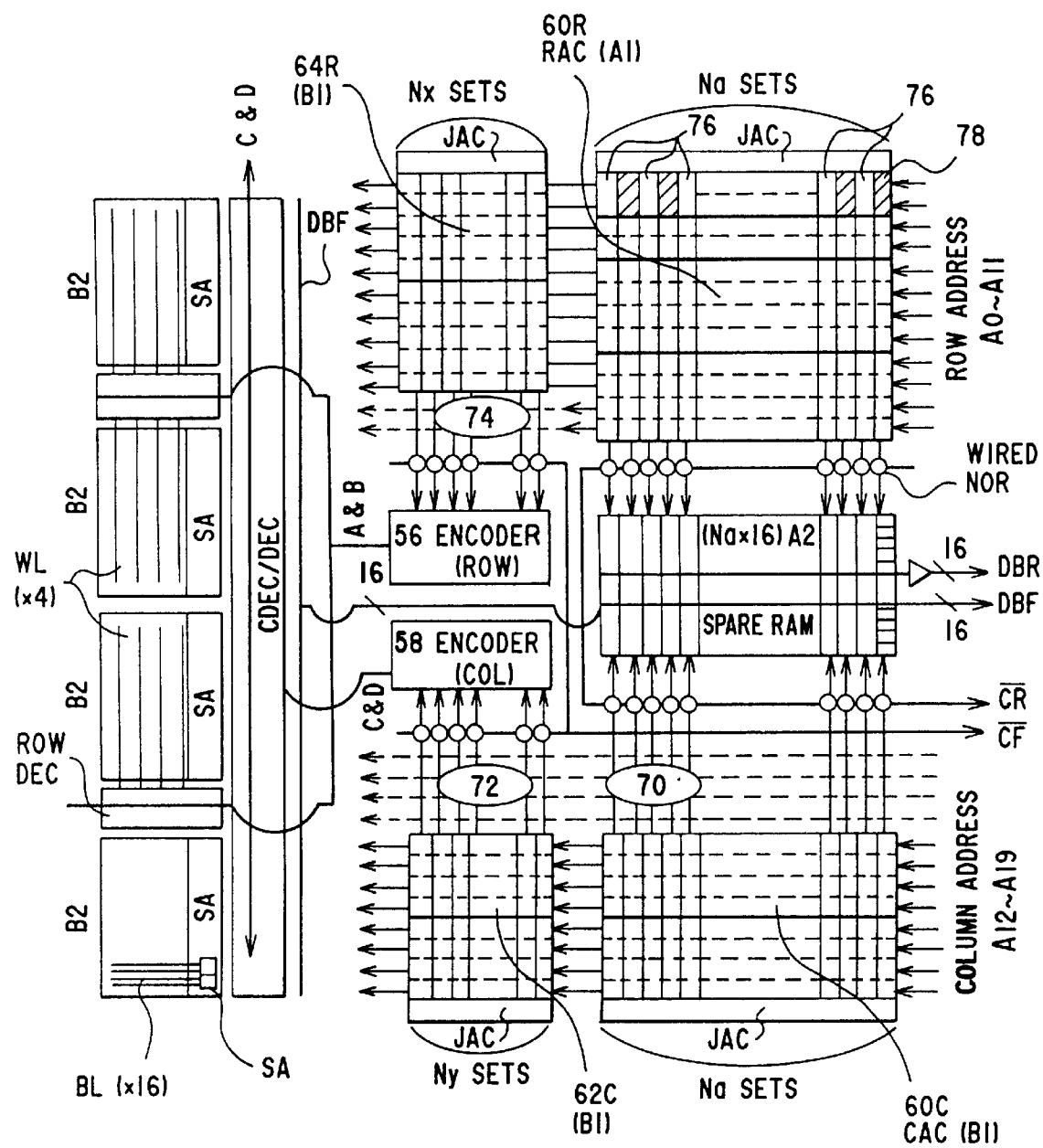
FIG. 19 is a block diagram showing an improvement of the combined arrangement of address comparison circuits and redundant memory cell arrays shown in FIG. 18.

FIG. 19 illustrates in block form an improvement of the combined arrangement of address comparison circuits and redundant memory cell arrays shown in FIG. 18. First, the arrangement shown in FIG. 19 differs from the arrangement shown in FIG. 18 in that the redundant memory cell array A2 for relieving refresh-failure cells and its address comparison circuit Al are related to each other as shown in FIG. 6. Specifically, the redundant memory cell array A2 is provided between the row address comparison circuit 60R and the column address comparison circuit 60C. This arrangement also allows the row and column address comparison circuits 64R, 62C for fixed-failure cells to be disposed one on each side of the encoders 56,58. The arrangement shown in FIG. 19 has a better space efficiency than the arrangement shown in FIG. 18.

Secondly, the number of AND gates for two address bits in the row address comparison circuit 60R of the address comparison circuit A1 for refresh-failure cells is reduced to one half, as shown in FIG. 14. Specifically, every other AND gates for being supplied with two row address bits AO, Al are dispensed with. Those AND gates which are dispensed with are denoted by 76, and output signals from AND gates 78 are supplied to two sets of AND gate groups which are supplied with other address signals.

The arrangement shown in FIG. 19 can increase the speed of operation of the address comparison circuit because the number of AND gate groups is very small, and saves the current which is consumed because useless AND gate groups are dispensed with.

Figure 20:
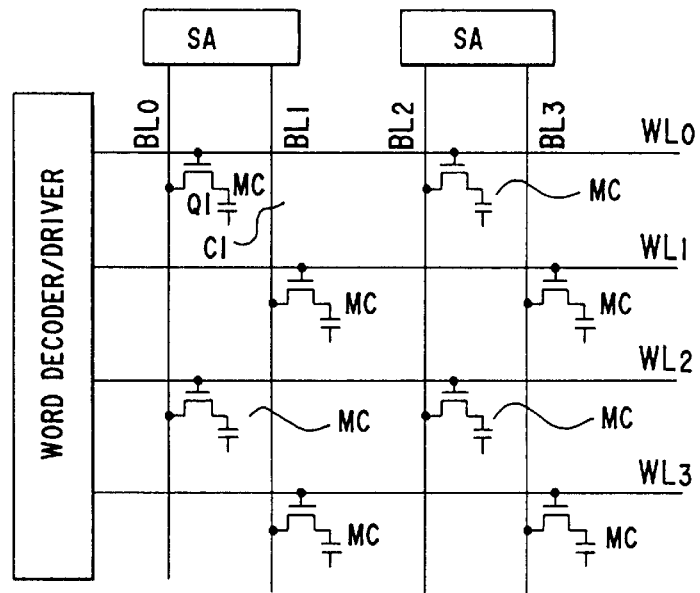
FIG. 20 is a circuit diagram showing, by way of example, memory cells which are used in the memory cell array or the redundant memory cell array for relieving fixed-failure cells in the memory device according to the present invention.

FIG. 20 shows, by way of example, memory cells MC which are used in the memory cell array or the redundant memory cell array B2 for relieving fixed-failure cells in the memory device according to the present invention. Each of the memory cells MC comprises a transistor Q1 and a capacitor C1. Such a dynamic memory cell stores a charge representing data in the capacitor C1 and reads the stored charge with a sense amplifier SA through a bit line BL, as is well known in the art. Before the charge stored in the capacitor C1 drops to a predetermined allowable level after elapse of a given time, it is amplified by the sense amplifier SA and rewritten. Such a process is known as a refreshing process. The time over which the stored charge drops to the predetermined allowable level varies from memory cell to memory cell depending on process conditions.

The redundant memory cells for relieving refresh-failure cells may preferably, in some cases, be static memory cells whose refresh times are long or infinite, rather than dynamic memory cells including the 4-transistor dynamic memory cells described above. As described above, refresh-failure cells can efficiently be replaced with redundant memory cells per bit or several bits. Therefore, the address comparison circuit is required to compare all address signals with stored address bits, and hence may take a long time for address comparison. The static memory cell allows a sense amplifier to amplify the stored charge quickly, and the redundant memory cell array which comprises static memory cells can be accessed at high speed. Since the number of memory cells is large, the area which is taken up by them is also large. However, the memory cells replace faulty cells per bit, they are not required to have a substantially large storage capacity.

The redundant memory cell array for relieving fixed-failure cells should preferably replace faulty cells per line or block because of the nature of faulty cells, and hence tends to be of a large storage capacity. Therefore, each of the redundant memory cells should preferably comprise a DRAM memory cell which comprises a transistor and a capacitor.

However, the present invention is not limited to the above arrangements. All the redundant memory cells may comprise static memory cells or dynamic memory cells. The principles of the present invention are also applicable to DRAM memory cells each comprising a transistor and a capacitor or SRAM memory cells each comprising four transistor.

HIERARCHICAL REDUNDANT MEMORY CELL STRUCTURE FOR RELIEVING REFRESH-FAILURE CELLS

In the memory device described above, redundant memory cells for relieving refresh-failure cells are basically positioned in one centralized area on the memory chip as shown in FIG. 1 or FIG. 2. The centralized location of the redundant memory cells is advantageous in that since refresh-failure cells occur dispersively over the entire memory chip, it can relieve refresh-failure cells highly flexibly with increased probability.

As the storage capacity of memories increases, the redundant memory cell array for relieving refresh-failure cells and its address comparison circuit, which are positioned in a centralized area, take up a larger area on the memory chip, and the address comparison circuit consumes an increased amount of electric power and become slow in its speed. In a memory device having a large storage capacity of 256 Mbits, for example, the redundant memory cell array positioned in the centralized area for relieving refresh-failure cells is subject to limitations.

One possible solution would be to provide a plurality of memory cell blocks of a memory device with respective redundant memory cell arrays and their address comparison circuits, i.e., a dispersed redundant memory cell arrangement. With the dispersed redundant memory cell arrangement, however, in order to achieve the same number of bits that can be relieved as with the centralized redundant memory cell arrangement, it is necessary to provide many bits of relieving redundant cells for each of the blocks, resulting in very large number of bits of entire relieving redundant cells on the entire memory chip.

To explain the above situation, it is now assumed that a memory device of 1M (220) bits has 16 memory cell blocks each of 64K (216) bits and faulty cells are to be relieved at an average rate of one bit per 16K ($2^{14}$) bits. Thus, on the entire memory chip, refresh-failure cells of 64 bits (1 Mbits/16 Kbits) are to be relieved at a somewhat sufficient relief probability, e.g., of 99%. If relieving redundant cells are to be provided in a centralized area, then the memory device may simply have 64 sets (64 bits for relieving a single bit and 64 sets for relieving 16 bits altogether) of redundant cell arrays and address comparison circuits corresponding thereto. The width of the address of each of the sets is of 20 bits (1M=$2^{20}$) for the combination of a row and a column.

If relieving redundant cells are to be provided dispersively for each of 16 memory cell blocks each of 64 Kbits, then four sets of redundant memory cell arrays for relieving an average value of 4 bits (=64 Kbits/16 Kbits) are unable to achieve the same relief probability as described above. Specifically, if the probability that n bits can be relieved in each of the memory cell blocks is represented by f(n), then the relief probability for the entire memory chip is represented by a power of f(n), i.e., $\{f(n)\}^{16}$. Consequently, even if the relief probability for each block is f(n)=0.99, the relief probability for the entire memory chip is reduced to $\{f(n)\}^{16}$=0.85.

Figure 22:
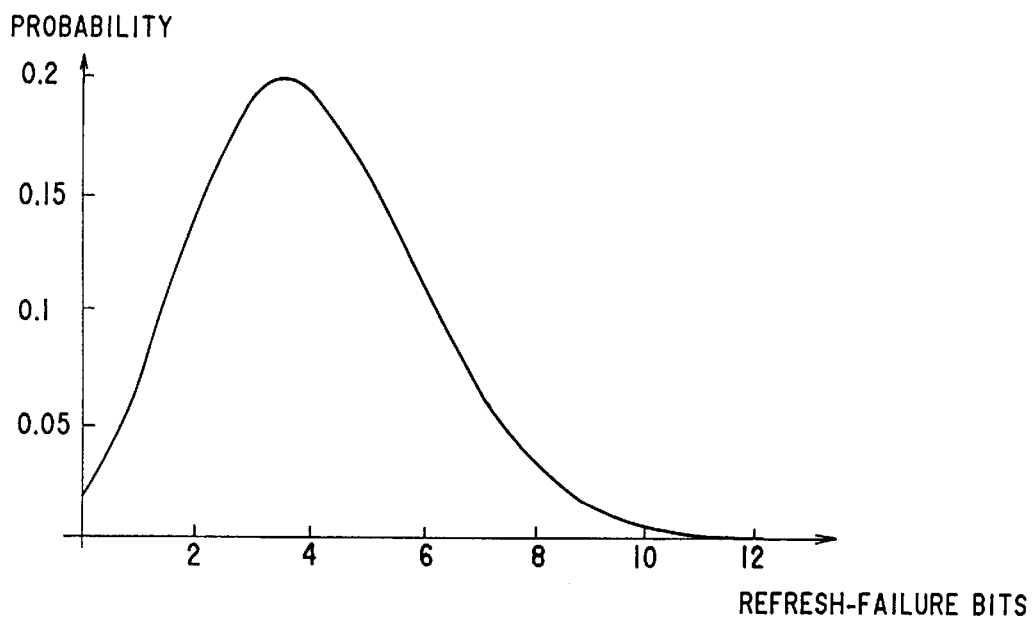
FIG. 22 is a graph showing the relationship between the number of refresh-failure bits in one memory cell block and the probability that they will occur.
Figure 23:
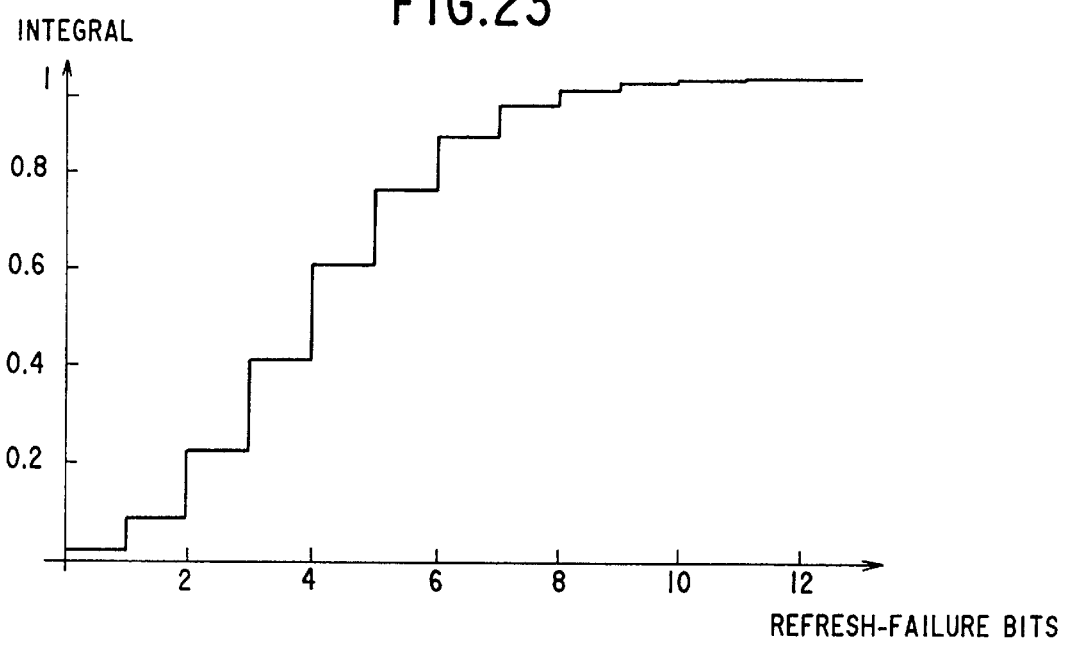
FIG. 23 is a graph showing the relationship between the number of refresh-failure bits illustrated in FIG. 22 and the corresponding integral thereof.

FIG. 22 is a graph showing the relationship between the number of refresh-failure bits in one memory cell block and the probability that they will occur. As described above, the probability that failures of four bits will occur in a block is greatest. However, the probability that failures of ten bits or more will occur in a block is not nil. FIG. 23 is a graph showing the relationship between the number of refresh-failure bits illustrated in FIG. 22 and the corresponding integral thereof. As can be seen from the graph shown in FIG. 23, for increasing the relief probability in one memory cell block beyond 99%, it is necessary to make the number of faulty bits that can be relieved equal to or greater than 11 bits, for example (99.6% at 11 bits). The relief probability for the entire memory chip is the 16th power of the relief probability for each of the memory cell blocks. Therefore, if it is assumed that each memory cell block has a 12-bit redundant memory cell array, then the redundant memory cell arrays of the 16 memory cell blocks have 12×16=192 bits, which are considerably more than the 64 bits of the centralized-type redundant memory cell array.

Providing each memory cell block with a redundant memory cell array for relieving refresh-failure cells is effective in reducing the address bits in each memory cell block to 16 bits in the above example, resulting in the number of address bits to be compared in the address comparison circuit of the redundant memory cell array thereby to eliminate the drawback of the centralized-type redundant memory cell array. In order to increase the relief probability, however, as shown in FIGS. 22 and 23, the number of bits (the number of sets) of the redundant memory cell array which is to be associated with each memory cell block is increased to the extent that the total storage capacity of the redundant memory cell arrays on the entire memory chip is very large.

According to an embodiment of the present invention, a hierarchical redundant memory cell array structure for relieving refresh-failure cells comprises redundant memory cell arrays associated with respective memory cell blocks on a memory chip for achieving a certain relief probability and a common relieving redundant memory cell array on the memory chip. According to the hierarchical redundant memory cell array structure, an average number of faulty bits or slightly more faulty bits in each of the memory cell blocks are relieved by the redundant memory cell array associated therewith, and faulty bits which cannot be relieved in each of the memory cell blocks are relieved by the common relieving redundant memory cell array on the memory chip. The hierarchical redundant memory cell array structure may be of three or four layers, rather than the two layers. The optimum number of layers is selected depending on parameters including the overall storage capacity of the memory chip, the number of memory cell blocks used, and the storage capacity of each of the memory cell blocks.

Figure 24:
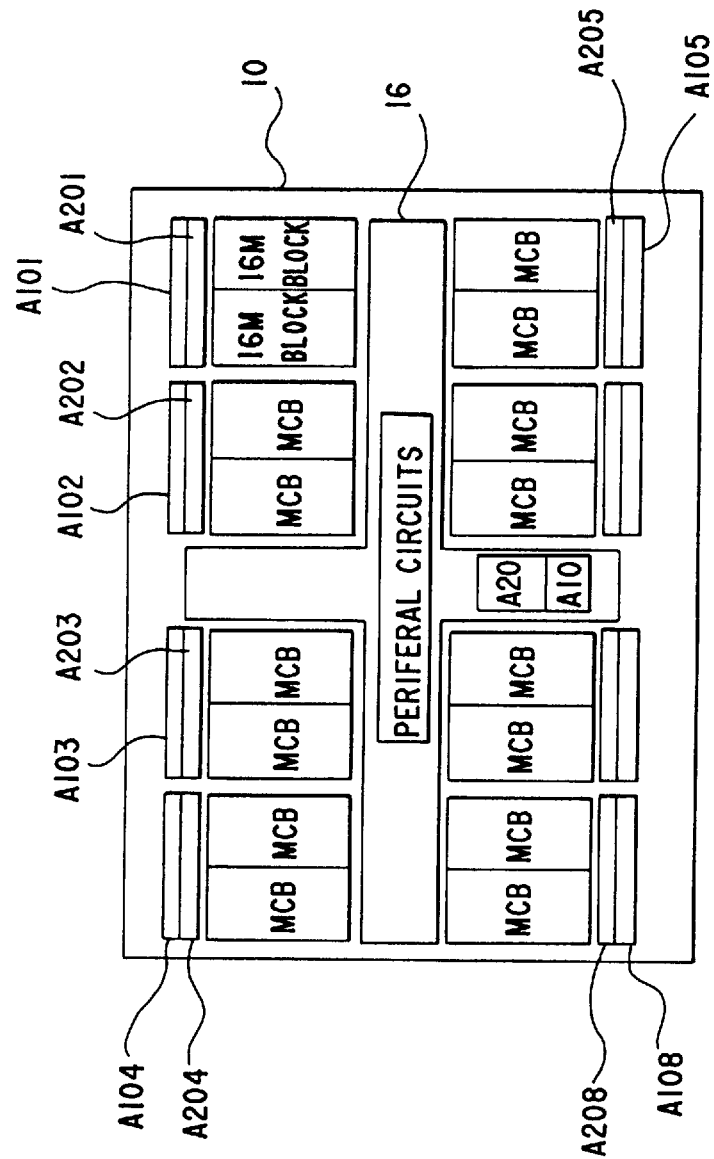
FIG. 24 is a plan view of an entire memory chip of a memory device which incorporates a hierarchical arrangement of redundant circuits for relieving refresh-failure cells.

FIG. 24 shows an entire memory chip of a memory device which incorporates a hierarchical arrangement of redundant circuits for relieving refresh-failure cells. The memory device shown in FIG. 24 has a storage capacity of 256 Mbits. Those parts of the memory device shown in FIG. 24 which are identical to those of the memory device shown in FIG. 1 are denoted by identical reference characters. The memory chip 10 has eight memory cell blocks MCB each having a storage capacity of 32 Mbits, i.e., two blocks each of 16 Mbits disposed one on each side of a column decoder (not shown), and peripheral circuits 16 disposed between two arrays of the eight memory cell blocks MCB. The hierarchical redundant memory cell array structure has a two-layer structure comprising low-order redundant memory cell arrays A201~A208 associated with the respective memory cell blocks MCB and a common high-order redundant memory cell array A20 on the memory chip. The redundant memory cell arrays A201~A208, A20 are combined with respective address comparison circuits A101~A108, A10.

The common high-order redundant memory cell array A20 which is disposed in a centralized area has N1 sets of redundant memory cell arrays, for example. The address comparison circuit A10 combined with the common high-order redundant memory cell array A20 is arranged to be able to store faulty address bits and compare them with inputted address bits with respect to overall address bits of the memory device, i.e., 16 row address bits and 12 column address bits which are $2^{28}$=256 Mbits. The redundant memory cell arrays A201~A208 which are associated dispersely with the respective memory cell blocks MCB have N2 sets of redundant memory cell arrays, respectively. The address comparison circuits A101~A108 combined with the respective redundant memory cell arrays A201~A208 store faulty addresses and compare them with inputted addresses with respect to 13-bit row addresses and 12-bit column addresses which are of $2^{15}$=32 Mbits.

Faulty bits in the memory cell blocks MCB are replaced with redundant memory cells in the redundant memory cell arrays A201~A208. If the number of faulty bits in the memory cell blocks MCB exceeds N2, then the excess faulty bits are replaced with redundant memory cells in the centralized-type redundant memory cell array A20.

Figure 25:
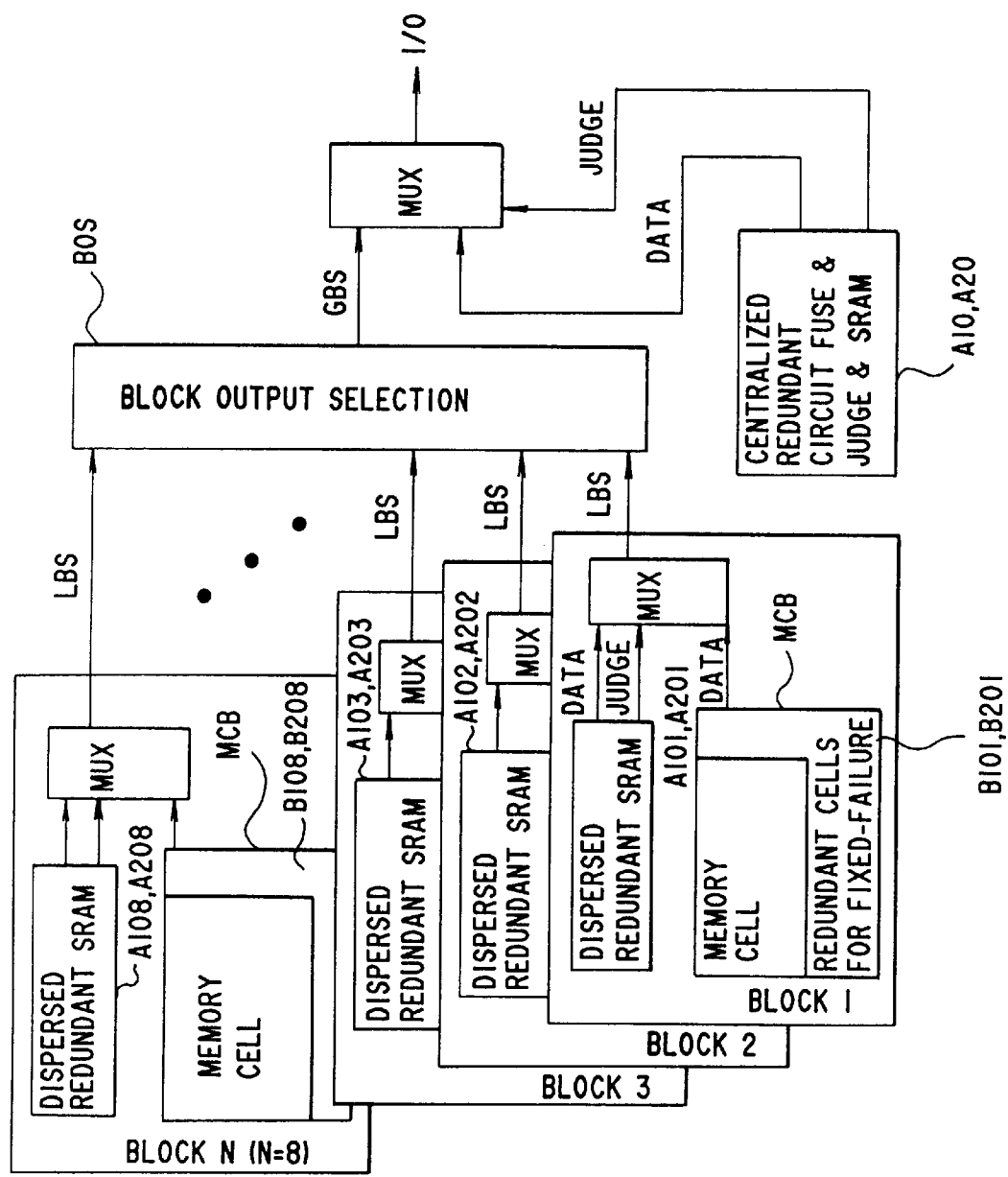
FIG. 25 is a block diagram of the memory chip shown in FIG. 24.

FIG. 25 shows in block form the memory device shown in FIG. 24. In FIG. 25, the memory device also includes redundant memory cell arrays for relieving fixed-failure cells in addition to the redundant memory cell arrays for relieving refresh-failure cells. The redundant memory cell arrays for relieving fixed-failure cells are disposed in the respective memory cell blocks MCB.

For example, a block 1 includes a memory cell block MCB which has a redundant memory cell array B201, e.g., an SRAM, for relieving fixed-failure cells and an address comparison circuit B101 which are disposed adjacent to a memory cell array MC. The memory cell block MCB outputs data from either the memory cell array MC or the redundant memory cell array B201 to a multiplexer MUX in the block 1. The block 1 also includes a redundant memory cell array A201 for relieving refresh-failure cells and an address comparison circuit A101 therefor, which are associated with the memory cell block MCB. The address comparison circuit A101 outputs a comparison matching signal "judge" for address signals to the multiplexer MUX, and the redundant memory cell array A201, which is of the dispersed type, outputs replacement data "data" to the multiplexer MUX. The multiplexer MUX selects the data from either the memory cell block MCB or the redundant memory cell array A201 according to the comparison matching signal "judge". The selected data are then outputted as output data from the block 1 to a local bus LBS.

Since the redundant memory cell array B201 for relieving fixed-failure cells is associated with the memory cell array MC, the address comparison circuit B101 operates at high speed because of its NOR gates, for accessing either an ordinary memory cell or a replacing redundant memory cell to read stored data therefrom. The address comparison circuit A101 combined with the redundant memory cell array A201 for relieving refresh-failure cells comprises AND gates, as described above, which reduce electric power consumption although they operate at low speed. As described above, the redundant memory cell array A201 outputs the comparison matching signal "judge" and the replacement data "data" to the multiplexer MUX, which selects the data from either the memory cell block MCB or the redundant memory cell array A201 according to the comparison matching signal "judge".

If refresh-failure cells of more bits than can be relieved by the dispersed-type redundant memory cell arrays A201~A208 in the respective blocks occur in the blocks, then the excessive bits are relieved by the common centralized-type redundant memory cell array A20 on the memory chip. Consequently, the overall relief probability for the entire memory device can be increased without having to increase the number of bits of the redundant memory cell array A201 for relieving refresh-failure cells in each block.

As shown in FIG. 25, one of the data from the local buses LBS from the respective blocks is selected by a block output selection circuit BOS and outputted to a global bus GBS. The replacement data "data" from the common centralized-type redundant memory cell array A20 or the data from the global bus GBS are selected by a multiplexer MUX according to a comparison matching signal "judge" from an address comparison circuit A10 combined with the common centralized-type redundant memory cell array A20. The address comparison circuit A10 comprises AND gates as described above.

Figure 26:
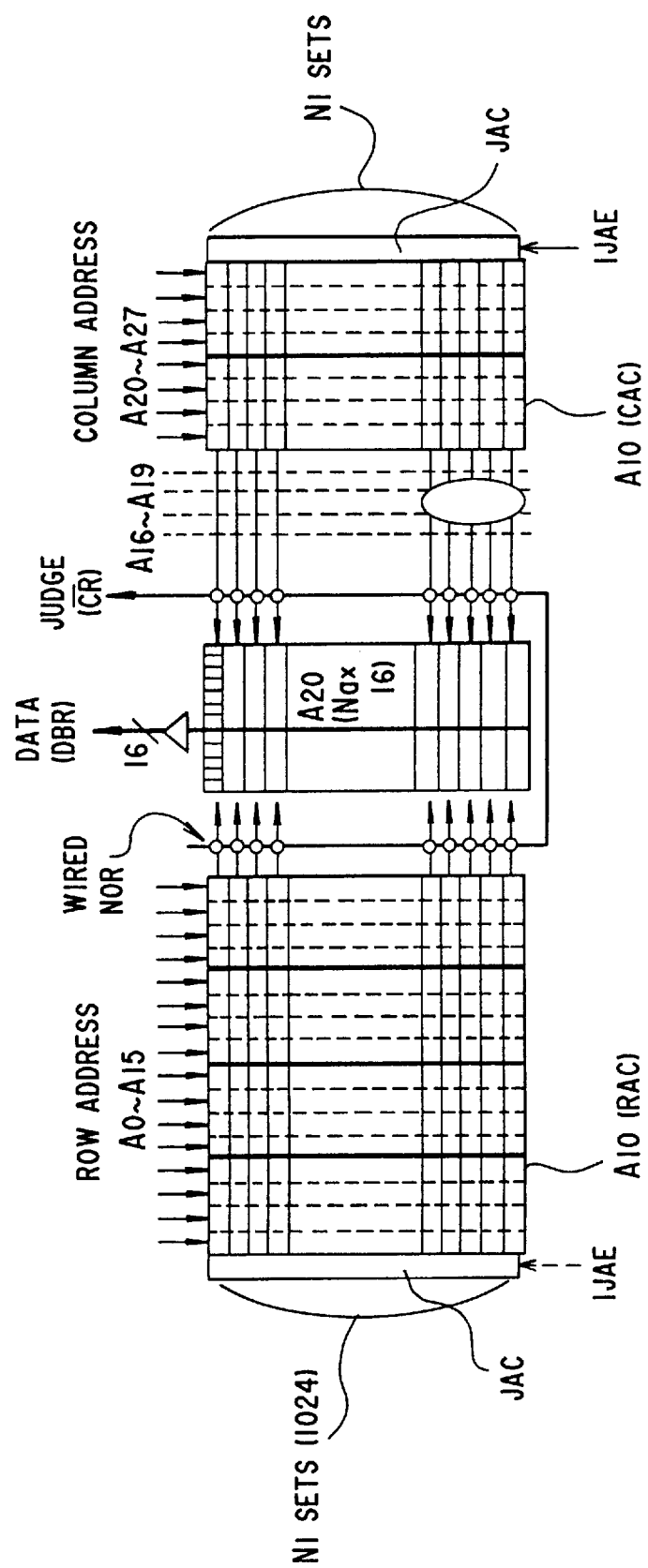
FIG. 26 is a block diagram of a common centralized-type redundant memory cell array on the memory chip shown in FIG. 25 and an address comparison circuit combined therewith.

FIG. 26 shows in block form the common centralized-type redundant memory cell array A20 on the memory chip and the address comparison circuit A10 combined therewith. The common centralized-type redundant memory cell array A20 and the address comparison circuit A10 which are shown in FIG. 26 are equivalent to the redundant memory cell array A2 and the address comparison circuit A1, respectively, which are shown in FIG. 19. However, since the memory device associates to FIG. 26 has a large storage capacity of 256 Mbits, it has 16 row address bits A0–A15 and 12 column address bits A16–A27, resulting in a total number of $2^{28}$=256 Mbits. The redundant memory cell array A20 is of a 16-bit structure, and hence the column address comparison circuit CAC in the address comparison circuit A10 is supplied with eight address bits A20~A27.

The centralized-type redundant memory cell array A20 is capable of replacing refresh-failure bits with N1 sets of bits, e.g., 1024 (1 K) sets of bits. Therefore, the centralized-type redundant memory cell array A20 can relieve up to 1K refresh-failure bits which cannot be relieved by each of the blocks.

An output set of 16 bits is outputted as replacement data "data" (DBR), and an output signal from the address comparison circuit is outputted as a comparison matching signal "judge" (/CR) in the same manner as with the arrangement shown in FIG. 19.

Figure 27:
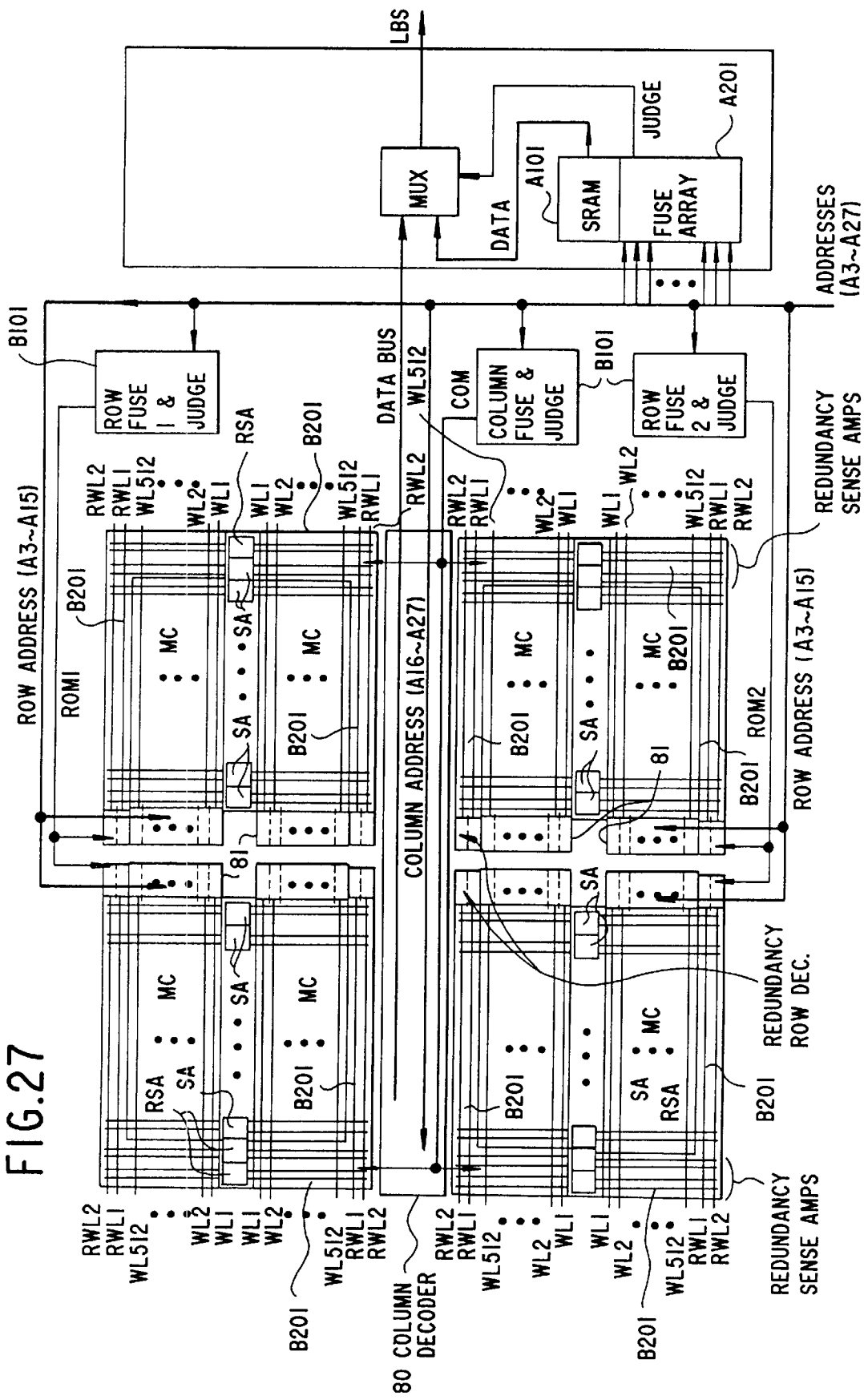
FIG. 27 is a block diagram of a detailed arrangement of each of blocks shown in FIG. 25.

FIG. 27 shows in block form a detailed arrangement of each of the blocks shown in FIG. 25. In FIG. 27, the block 1 shown in FIG. 25 is illustrated by way of example. The block shown in FIG. 27 has memory cell blocks each of 16 Mbits disposed one on each side of a central column decoder 80, i.e., respectively above and below the central column decoder 80, the block having a total of 32 Mbits. Each memory cell block of 16 Mbits, above and below the central column decoder 80, is also divided into two blocks disposed one on each side of a central row decoder and driver 81. Address signals A3~A27 are given to the row decoder and driver 81 and the column decoder 80, and also to row and column address comparison circuits B101 for fixed-failure cells in the memory cell blocks. When the row address comparison circuits B101 output matching signals ROM1, ROM2, any access to the ordinary memory cell array MC is prohibited, redundant word lines RWL for redundant cells for relieving fixed-failure cells are energized and accessed instead. When the column address comparison circuit B101 outputs a matching signal COM, redundant sense amplifiers RSA, rather than ordinary sense amplifiers SA, are selected and connected to data buses. The above structure is equivalent to the structure of a general redundant circuit for relieving fixed-failure cells.

The block shown in FIG. 27 also has the redundant memory cell array A101 for relieving refresh-failure cells in the block and the address comparison circuit A201 combined therewith. The address comparison circuit A201 stores address bits of refresh-failure cells in ROMs which comprise fuses or EEPROMs, and compare them with supplied address signals. A comparison matching signal "JUDGE" from the address comparison circuit A201 and data "data" from the redundant memory cell array A101 are supplied to the multiplexer MUX in the block. According to the comparison matching signal "JUDGE", the multiplexer MUX selects the data from the memory cell array or the data from the redundant memory cell array A101, and outputs the selected data to the local bus LBS.

Figure 28:
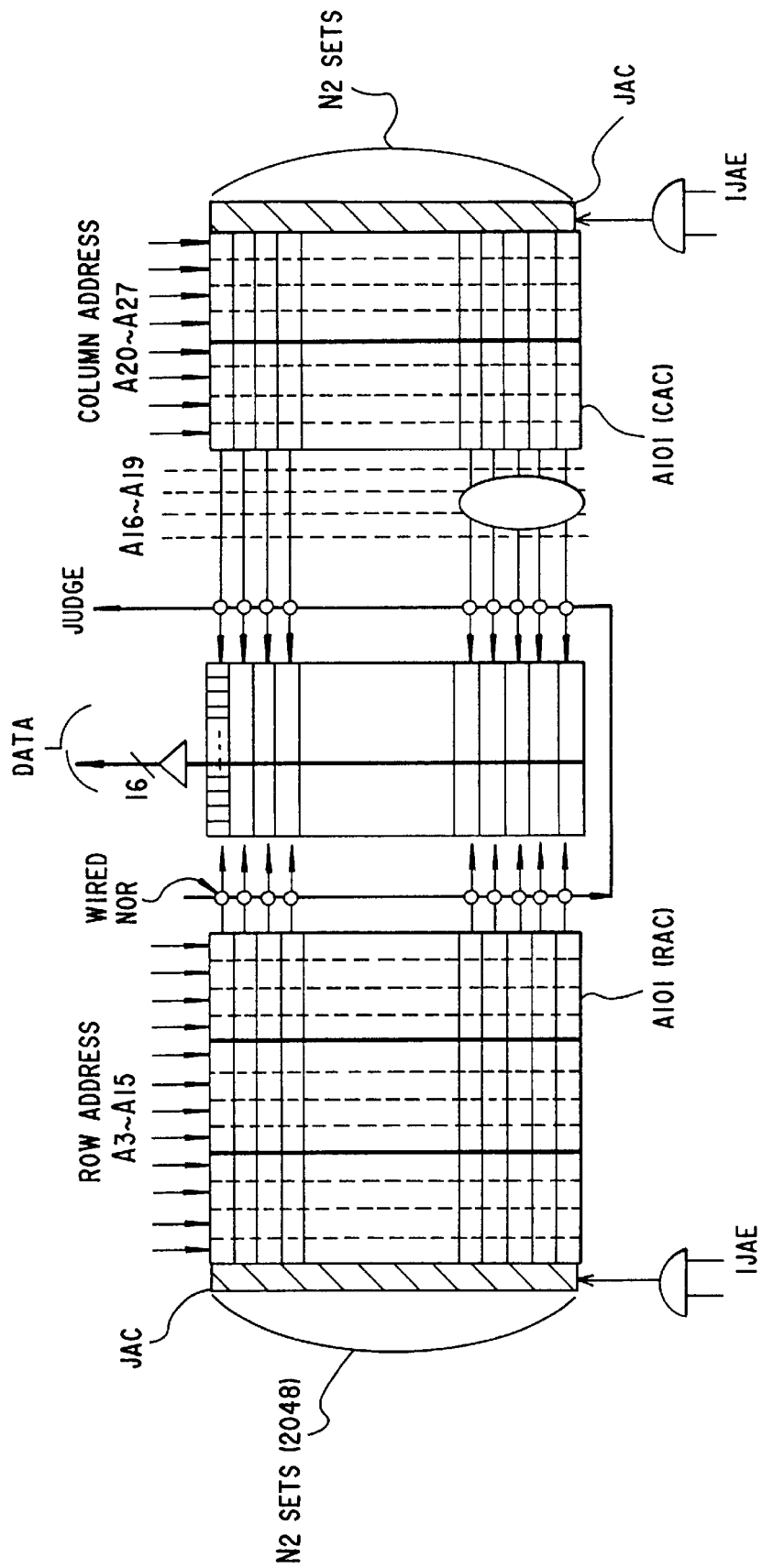
FIG. 28 is a block diagram of the redundant memory cell array and the address comparison circuit which are disposed in the block shown in FIG. 27.

FIG. 28 shows in block form the redundant memory cell array A101 and the address comparison circuit A201 which are of the dispersive type disposed in the block shown in FIG. 27. The redundant memory cell array A101 and the address comparison circuit A201 which are of the dispersive type shown in FIG. 28 are basically equivalent to the centralized-type redundant memory cell array A20 on the memory chip and the address comparison circuit A10 which are illustrated in FIG. 26. Since the redundant memory cell array A101 serves to relieve refresh-failure cells in the block, it has fewer row address bits, i.e., 13 row address bits A3~A15. The redundant memory cell array A101 can relieve N2 sets of bits, e.g., 2048 (2K) sets of bits, which are an average number of faulty bits, i.e., 32 Mbits/16 Kbits=2 Kbits. When the block which contains the redundant memory cell array A101 and the address comparison circuit A201 is not selected, the address comparison circuit A201 is not activated. Only when the block is selected, the address comparison circuit A201 is activated by a judge activating signal /JAE which is supplied through an AND gate to a judge activation circuit JAC by a block selection signal.

Whereas the address comparison circuit A10 of the centralized design illustrated in FIG. 26 is always activated, the address comparison circuit A201 of the dispersive design disposed in each block is activated only when the block is selected. Therefore, the address comparison circuit A201 of the dispersive design consumes less electric power than the address comparison circuit A10 of the centralized design. The row address bits A3~A15 may be supplied to the address comparison circuit A201 only when it is activated by the block selection signal.

In this embodiment, the memory device which has the storage capacity of 256 Mbits comprises eight memory cell blocks each having a storage capacity of 32 Mbits. The centralized-type redundant memory cell array A20 shown in FIG. 26 is capable of replacing refresh-failure bits with 1024 (1K) sets of bits, for example, whereas the dispersive redundant memory cell array A201 in each block is capable of replacing refresh-failure bits with 2048 (2K) sets of bits, for example. In the case where up to one refresh-failure cell per 16 Kbits should be relieved, if the centralized-type redundant memory cell array alone would relieve the refresh-failure cells, than 16384 sets (16 Kbits=256 Mbits/16 Kbits) of bits in the centralized-type redundant memory cell array are necessary.

In the hierarchical redundant memory cell array structure according to the present invention, however, the same relief probability can be achieved by relieving faulty cells with 2K sets of bits for each block, i.e., a total of 26K sets of bits for the blocks, and by relieving faulty cells with common 1K sets of bits for the entire memory chip, with the result that the numbers of comparison circuits of the dispersive and centralized types can be reduced as much as possible. In this case, the total number of sets that can be replaced is 17K sets. Accordingly, while the total storage capacity of redundant memory cells of the hierarchical design is larger than if only centralized redundant memory cells were used, the number of sets that can be replaced by each individual redundant memory array is sufficiently small. As a result, it is possible to avoid a circuit arrangement which would consume a large centralized current. The storage capacity of added redundant circuits is not substantially large. Furthermore, the total number of sets that can be replaced by redundant memory arrays in the hierarchical type is larger than if all redundant circuits are of the dispersive type.

The centralized redundant circuit in the high-order layer may not be a single circuit on the entire memory chip, but may be a plurality of high-order redundant circuits each for 64 Mbits in one quarter of the memory chip, which are capable of replacing faulty cells with 256 sets of bits (one quarter of 1024 bits). In this case, each of the number of address bits to be stored and the number of address bits to be compared is reduced by two bits. This modified arrangement has its relief probability smaller than if a centralized redundant circuit capable of replacing faulty cells with 1024 sets of bits were provided in the high-order layer. To avoid such a shortcoming, an additional redundant circuit may be provided in a further high-order layer on the memory chip, and the number of sets that can be replaced by the additional redundant circuit may be set to an optimum value, such as 4 sets. According to this arrangement, the redundant circuits are provided in a three-layer hierarchical arrangement which includes redundant circuits in the respective blocks, redundant circuits in the respective quarters of the memory chip, and a redundant circuit in the overall memory chip.

Figure 29:
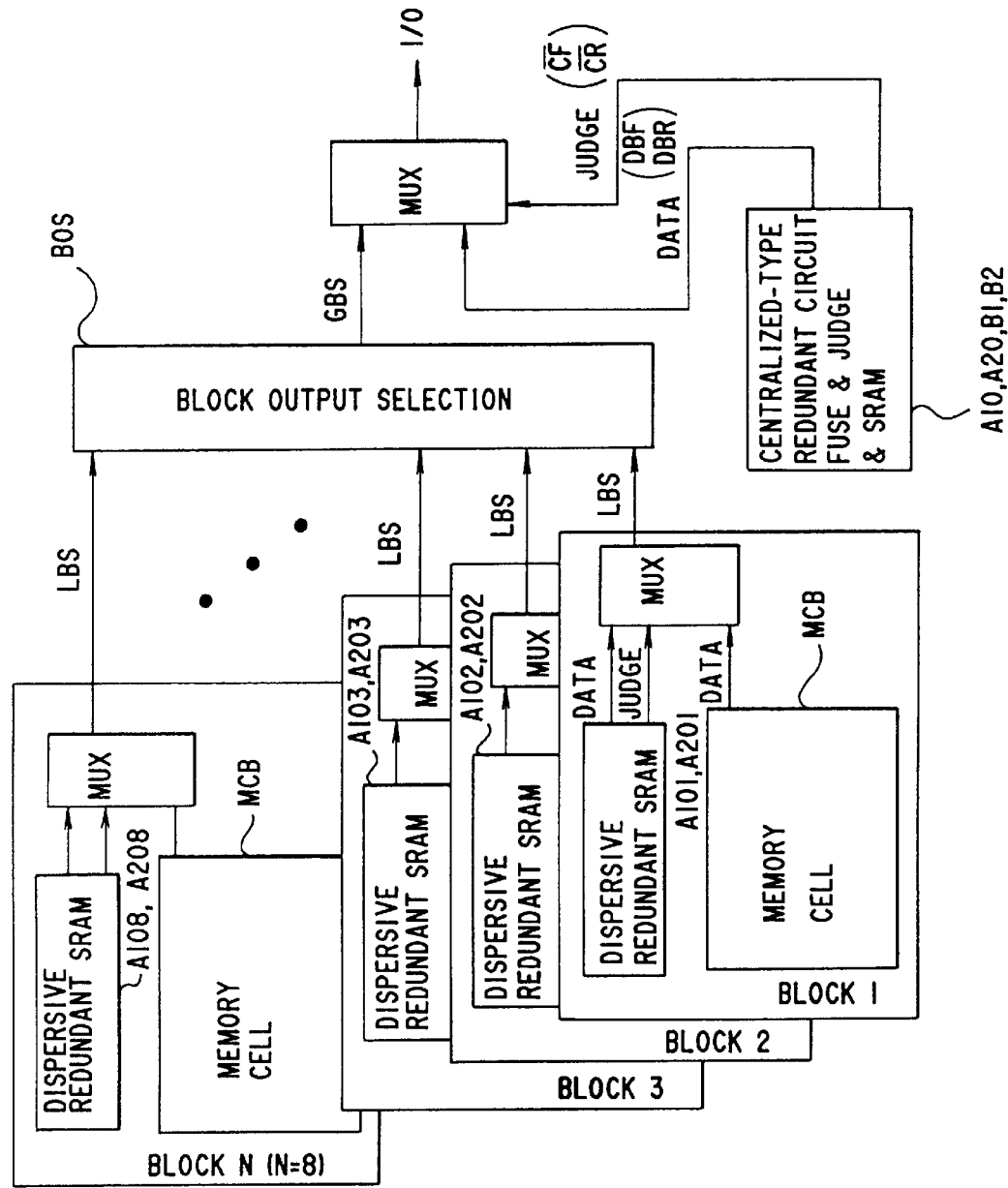
FIG. 29 is a block diagram of another arrangement in which redundant circuits for relieving refresh-failure cells are arranged in a hierarchical structure.

FIG. 29 shows in block form another arrangement in which redundant circuits for relieving refresh-failure cells are arranged in a hierarchical structure. In FIG. 29, common redundant circuits B1, B2 for relieving fixed-failure cells are disposed on an entire memory chip unlike the arrangement shown in FIG. 25. Therefore, the arrangement shown in FIG. 29 has centralized redundant circuits for relieving fixed-failure cells and centralized and dispersive redundant circuits arranged in a hierarchical structure for relieving refresh-failure cells. The arrangement shown in FIG. 29 allows address comparison circuits to be arranged an efficient layout. Other details of the arrangement shown in FIG. 29 are identical to those of the arrangement shown in FIG. 25.

Figure 30:
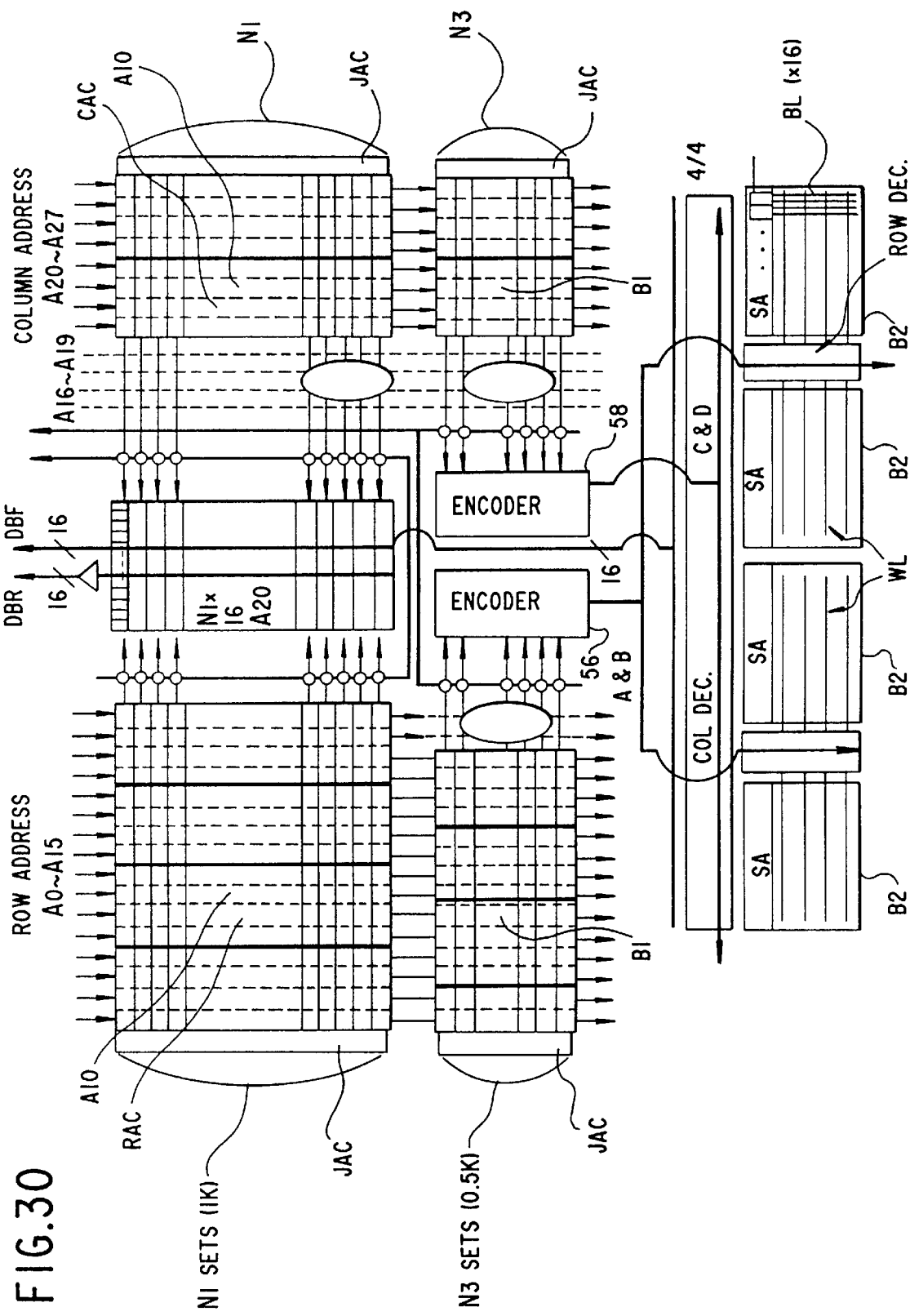
FIG. 30 is a block diagram of a combined arrangement of the redundant circuits for relieving fixed-failure cells and the redundant circuits for relieving refresh-failure cells which are shown in FIG. 29.

FIG. 30 illustrates in block form a combined arrangement of the redundant circuits B1, B2 for relieving fixed-failure cells and the redundant circuits A10, A20 for relieving refresh-failure cells which are shown in FIG. 29. The combined arrangement shown in FIG. 30 is substantially equivalent to the arrangement shown in FIG. 19. According to the arrangement shown in FIG. 30, however, the number N1 of sets that can be replaced is considerably smaller than the number of sets in FIG. 29 because the redundant circuits for relieving refresh-failure cells are arranged in a hierarchical structure. In the above example of 256 Mbits, number N1 of sets that can be replaced represents 1024 bits (1 Kbits), for example.

Other details, e.g., the encoders 56, 58 for the redundant circuits for relieving fixed-failure cells, the redundant memory cell arrays B2, etc. are identical to those shown in FIG. 19, and will not be described below.

REDUNDANT CIRCUITS OF HIERARCHIZED RAM TYPE FOR RELIEVING FIXED-FAILURE CELLS

The hierarchization of the redundant circuits for relieving refresh-failure cells has been described above. As described above, if redundant circuits are hierarchized, then those redundant circuits which are disposed in a lowermost layer are positioned adjacent to memory cell arrays. In an embodiment which will be described below, addresses of faulty bits are stored in memory cells which are random-access memories (RAMS) for thereby simplifying address storing circuits for the redundant circuits in the lowermost layer.

Generally, it has been proposed to store addresses of faulty bits in RAMS, which are the same as memory cells, rather than ROMS. It has also been proposed to write redundant addresses into internal memories from a programmable ROM (PROM) disposed outside of a memory chip when the power supply thereof is turned on, or to write redundant addresses into internal memories from a ROM disposed on a peripheral region of a memory chip when the power supply thereof is turned on. By storing redundant addresses in RAMs, it is possible to simplify the redundant circuits in blocks in the lowermost layer.

Figure 31B:
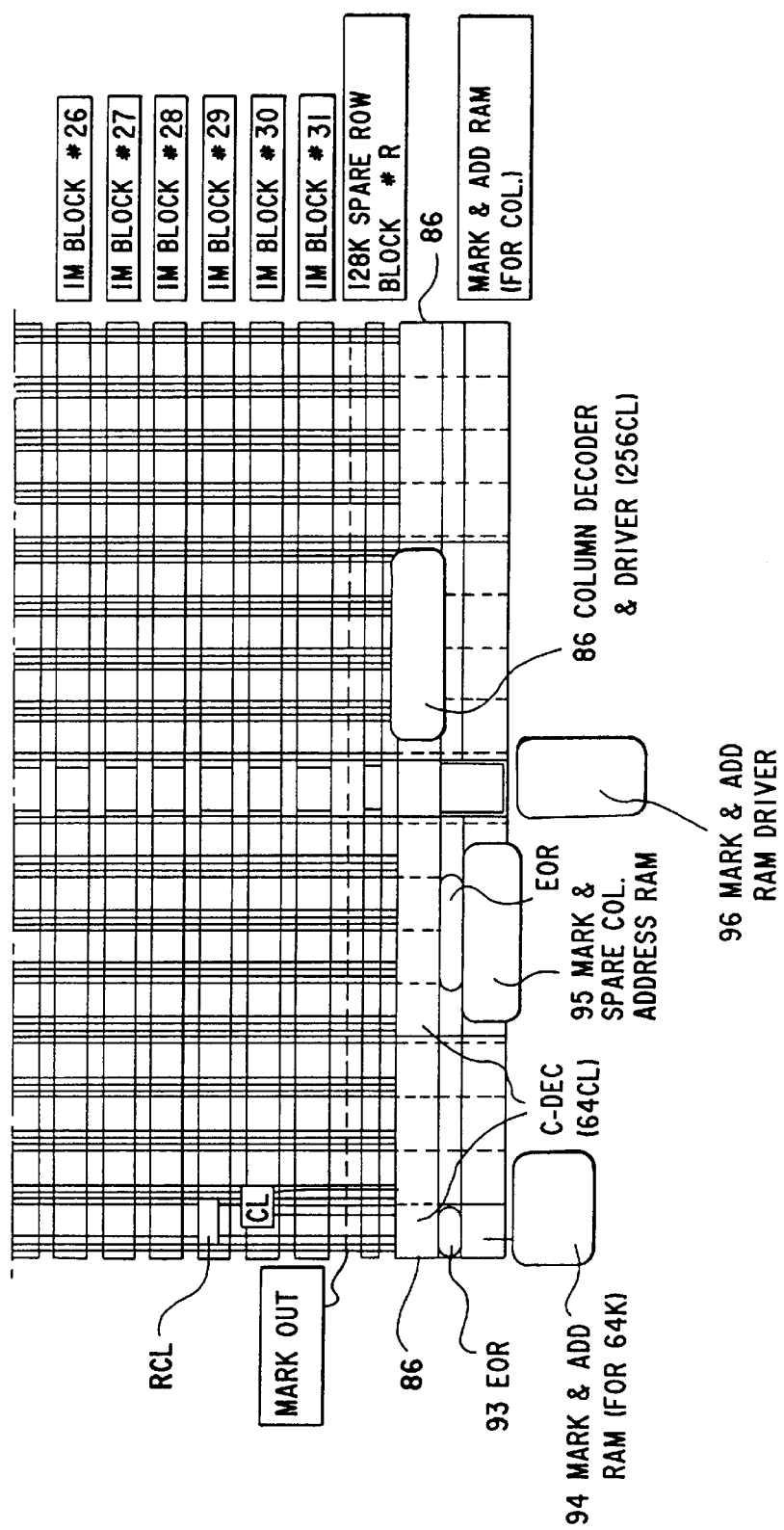
FIG. 31 is a block diagram of memory cell blocks which incorporate RAM-type redundant circuits.

FIG. 31 shows in block form memory cell blocks (32 Mbits) which incorporate RAM-type redundant circuits. Word lines which extend horizontally in FIG. 31 comprise main word lines MWL 84 and sub-word lines which are driven by a sub-word decoder 85. There are 32 memory cell blocks 82 each of 1 Mbits which have 256 word lines. A main word decoder and its driver 83 are disposed centrally in the memory cell blocks 82. Sense amplifiers 92 are disposed as shared sense amplifiers between the memory cell blocks 82 each of 1 Mbits. A column decoder 86 for decoding column addresses is disposed below the memory cell blocks 82 for selecting the sense amplifiers.

Each of the memory cell blocks 82 comprises 16 memory cell arrays MC each of 64 Kbits. Each of the memory cell arrays MC is associated with mark RAMs 87, 88 for substantially storing redundant address bits. Each of the memory cell blocks 82 comprises 256 word lines, 256 bit line pairs, and sense amplifiers SA.

Figure 32:
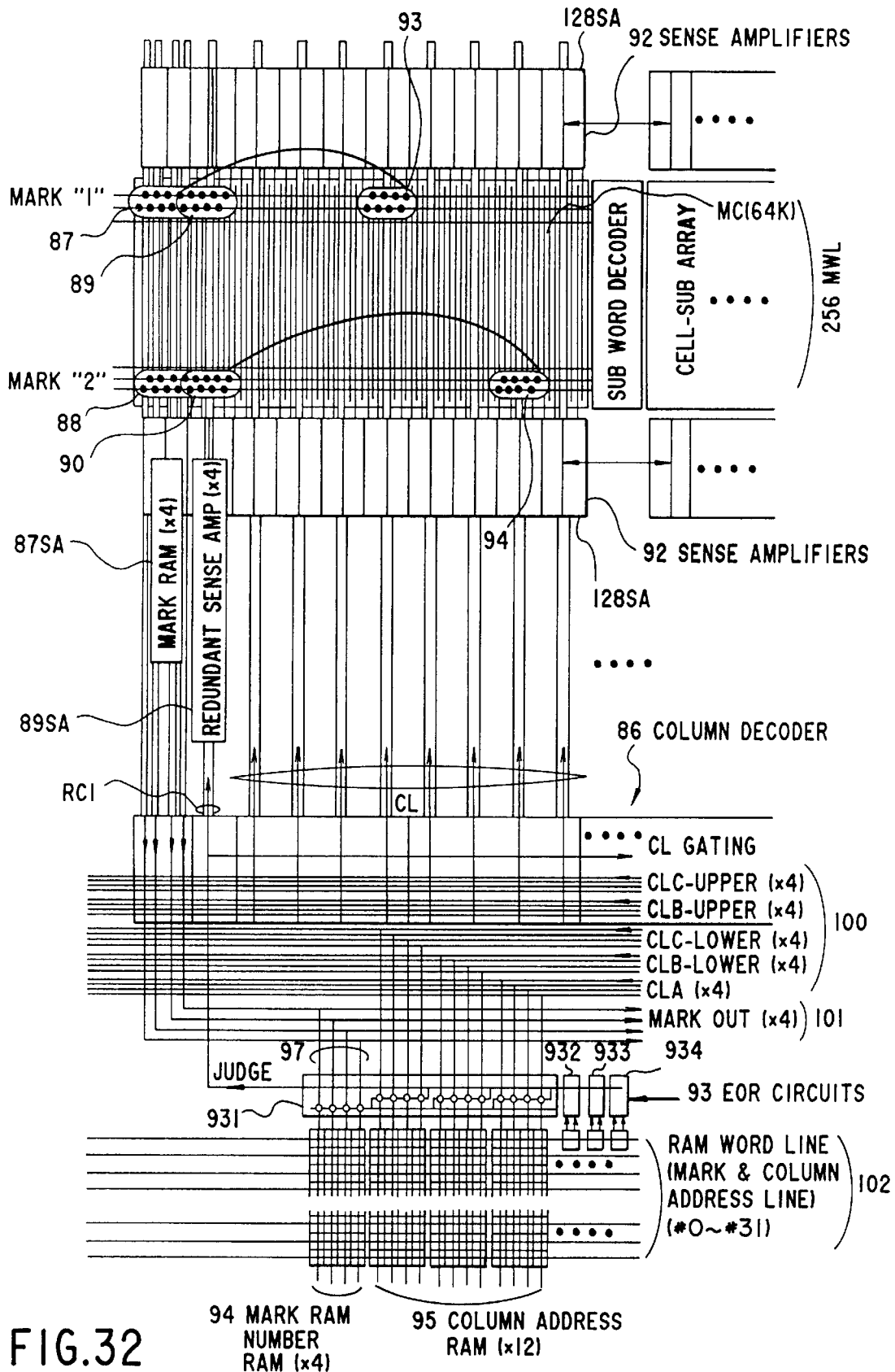
FIG. 32 is an enlarged block diagram of one of memory cell arrays of each of the memory cell blocks shown in FIG. 31.

FIG. 32 shows on an enlarged scale one of the memory cell arrays MC each of 64 Kbits. The memory cell array MC of 64 Kbits comprises 256 sub-word lines WL, 128 upper sense amplifiers 92, and 128 lower sense amplifiers 92. A selected sub-word line is energized by the sub-word decoder 85, and the stored data are amplified by the sense amplifier 92 and selected and outputted by the column decoder 86. The reference numeral 100 represents predecoded column addresses.

The mark RAMs 87, 88 according to a feature of the present invention are disposed on the left end of the memory cell array MC, and redundant RAMs 89, 90 for replacing refresh-failure cells are positioned laterally of the mark RAMs 87, 88. In the illustrated embodiment, a set 93 of 8 bits is replaced with the redundant RAM 89, and a set 94 of 8 bits is replaced with the redundant RAM 90. Address storing circuits for storing addresses of faulty cells are replaced with the mark RAMs 87, 88. Specifically, when the power supply of the memory chip is turned on, the data of the mark RAM are written into the mark RAMs 87, 88 according to addresses stored in an address storing ROM. As a result, if addresses for selecting the faulty cells 93, 94 are inputted, the mark RAMs 87, 88 output positional data except data of all 0 through a sense amplifier 87SA for the mark RAMs to mark RAM output lines 97. Therefore, when faulty cells to be replaced are accessed, the mark RAMs 87, 88 output positional data except data of all 0 as row address bits through the mark RAM output lines 97 to an EOR circuit 93.

Therefore, when the mark RAMs 87, 88 are selected and output data except data of all 0 to the mark RAM output lines 97, the comparison of row address bits of redundant addresses with inputted row address bits to determine whether they match each other or not is equivalently performed. Then, it is necessary to determine whether column address bits of redundant addresses at the row address bits match inputted column address bits or not.

To effect such address bit matching, the memory cell array shown in FIG. 32 has an EOR circuit 93, a mark RAM number RAM 94, and a redundant column address RAM 95. The mark RAM number RAM 94 and the redundant column address RAM 95 have 32 word lines to which 32 memory block selection signals 102 are supplied. The mark RAM number RAM94 has 4 bit lines and the redundant column address RAM 95 has 12 bit lines both of which are supplied to the EOR circuit 93. If four sets of bits can be replaced by each of the memory blocks (1 Mbits), then four sets of the mark RAM and number RAM 94, the redundant column address RAM 95, and EOR circuits 931~934 are arranged laterally along the memory block selection signals 102.

Figure 33:
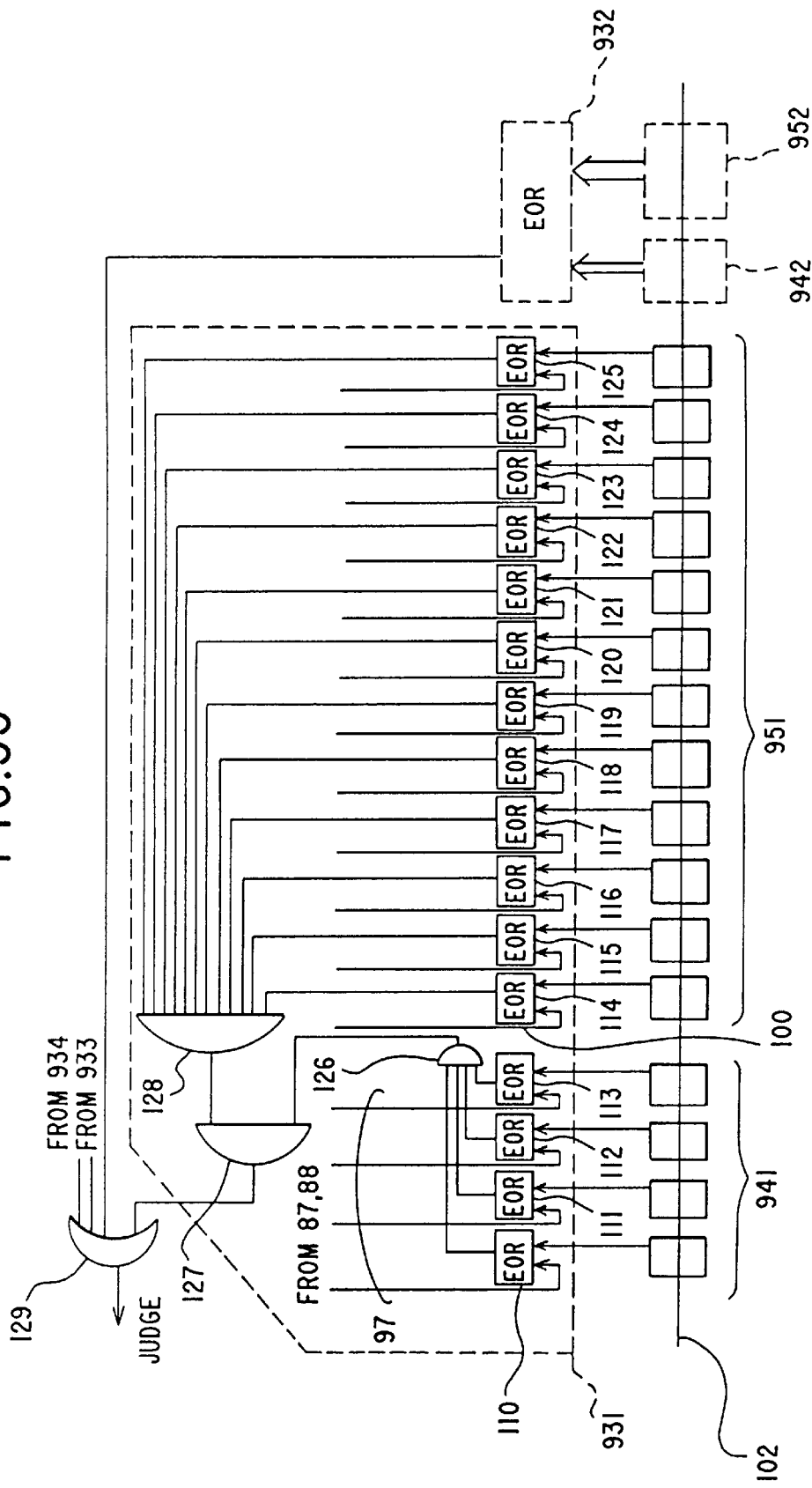
FIG. 33 is a block diagram of an EOR circuit in the memory cell array shown in FIG. 32.

FIG. 33 shows the EOR circuit 931 in block form. The EOR circuit 931 has 4-bit EOR gates 110~113 for comparing output lines 97 from the mark RAMs 87, 88 with data stored in a mark RAM number RAM 941, and an AND gate 126 for ANDing output signals from the EOR gates 110~113. The EOR circuit 931 also has EOR gates 114~125 for comparing column address bits, corresponding to row address bits of the mark RAMs 87, 88, stored in a redundant column address RAM 951 with inputted column address signals 100, an AND gate 128 for ANDing output signals from the EOR gates 114~125, and an AND gate 127 for ANDing output signals from the AND gates 126, 128.

Therefore, when a corresponding block selection signal 102, i.e. word line for RAM 941, 951, is selected and raised, the EOR circuit 931 determines whether the mark RAM output 97 match with the output of the mark RAM number RAM 941, and simultaneously redundant column address bits stored in the block 951 match with inputted column address bits 100 or not. When they match each other, the EOR circuit 931 outputs a matching signal "judge" through an OR gate 129.

If the mark RAMs are employed as described above, it is possible to place the redundant memory cell array in the lowermost layer for relieving refresh-failure cells in an ordinary memory area and also dispense with at least comparison matching circuits for row address bits. If refresh-failure cells cannot be relieved in each memory block, then they can be relieved by redundant memory cell arrays in an upper layer. The redundant memory cell arrays in an upper layer are not arranged in the same manner as the mark RAM, but comprise AND-type comparison circuits and redundant memory cell arrays such as SRAMs or the like.

According to the present invention, as described above, faulty cells whose refresh intervals are short can be replaced with redundant memory cells, and fixed-failure cells can be replaced with dedicated redundant memory cells. Since refresh-failure cells occur in a dispersive pattern, they may be replaced efficiently per bit or several bits, resulting in the need to provide address storage circuits of large storage capacity for storing addresses of faulty bits and address comparison circuits. According to the present invention, however, AND-type address comparison circuits are used to suppress current consumption by the address storage circuits of large storage capacity and the address comparison circuits. Inasmuch as the AND-type address comparison circuits are lower in speed than general NOR-type address comparison circuits, data from redundant memory cells and data from ordinary memory cells are selected by a multiplexer disposed in a stage preceding an input/output circuit for thereby preventing the overall time to access the memory from being prolonged.

If the memory device is of a large storage capacity of 256 Mbits, for example, then redundant circuits for relieving refresh-failure cells are arranged in a hierarchical structure for improved space efficiency and reduced power consumption.

Although certain preferred embodiments of the present invention have been shown and described in detail, it should be understood that various changes and modifications may be made therein without departing from the scope of the appended claims.

What is claimed is:

1. A memory device having a plurality of word lines, a plurality of bit lines crossing the word lines, and a memory cell array having memory cells disposed at intersections between the word lines and the bit lines, comprising:

a first redundant memory cell array for replacing memory cells with redundant memory cells per bit or a small number of bits;

a first address comparison circuit for storing addresses of memory cells to be replaced, comparing the stored addresses with an inputted address, and allowing a memory cell to be replaced with a redundant memory cell in said first redundant memory cell array when a stored address matches the inputted address;

a second redundant memory cell array for replacing memory cells with redundant memory cells per word line or bit line; and a second address comparison circuit for storing addresses corresponding to word lines or bit lines to be replaced, comparing the stored addresses with an inputted address, and allowing memory cells to be replaced with redundant memory cells in said second redundant memory cell array when a stored address matches the inputted address.

2. A memory device according to claim 1, wherein a data retention time over which a charge representing data stored in the memory cell to be replaced by said first address comparison circuit drops to a predetermined allowable level is shorter than a data retention time of the redundant memory cell to be replaced in said first redundant memory cell array.

3. A memory device according to claim 1, wherein the memory cells to be replaced by said second address comparison circuit suffer a failure in reading data therefrom or writing data therein.

4. A memory device according to claim 1, wherein said second address comparison circuit allows memory cells to be replaced with redundant memory cells per word line in said second redundant memory cell array when the stored address matches a row address for selecting a word line, and allows memory cells to be replaced with redundant memory cells per bit line in said second redundant memory cell array when the stored address matches a column address for selecting a bit line.

5. A memory device according to claim 1, further comprising a multiplexer disposed in a stage preceding an output stage of the memory device for selecting one of data outputted from said memory cell array, data outputted from said first redundant memory cell array, and data outputted from said second redundant memory cell array.

6. A memory device having a plurality of word lines, a plurality of bit lines crossing the word lines, and a memory cell array having memory cells disposed at intersections between the word lines and the bit lines and including capacities for holding charges representing data, said memory cell array including memory cells having data retention times over which said charges drop to a predetermined allowable level, said data retention times including a first time and a second time shorter than said first time, comprising:
   a first redundant memory cell array having redundant memory cells for replacing memory cells having said second time in said memory cell array; and
   a first address comparison circuit for storing addresses of the memory cells having said second time, comparing the stored addresses with an inputted address, and allowing a memory cell having said second time to be replaced with a redundant memory cell having a third time longer than said second time in said first redundant memory cell array when a stored address matches the inputted address;
   said first address comparison circuit comprising AND-type logic circuits for forming a current path to an output terminal when the stored address matches the inputted address.

7. A memory device according to claim 6, wherein said first address comparison circuit comprises as many cascaded paired unit circuits as the number of address bits of the addresses to be compared, each of said cascaded paired unit circuits comprising a pair of transistors having respective gates for being supplied with the inputted address and a pair of fuses connected to said transistors, respectively, for storing address bits of one of said stored addresses, and wherein said first address comparison circuit outputs an address matching signal through said current path which is formed when said transistors are rendered conductive and said fuses are rendered conductive.

8. A memory device according to claim 6, wherein said first address comparison circuit comprises as many cascaded unit circuits as the number of address bits of the addresses to be compared, each of said cascaded unit circuits comprising a pair of transistors having respective gates for being supplied with the inputted address and threshold voltages to be increased or reduced by electric means, said transistors storing address bits of one of said stored addresses as an increase or reduction in the respective threshold voltages, and wherein said first address comparison circuit outputs an address matching signal through said current path which is formed when said transistors are rendered conductive.

9. A memory device according to claim 7 or 8, wherein said addresses include row address bits and column address bits, said first address comparison circuit comprising a row address comparison circuit for comparing the row address bits and a column address comparison circuit for comparing the column address bits, and wherein said first address comparison circuit outputs said address matching signal through said current path which is formed in said row address comparison circuit and said column address comparison circuit.

10. A memory device according to claim 7 or 8, wherein said cascaded unit circuits of said first address comparison circuit are divided into a plurality of blocks, said first address comparison circuit including buffers connected between said blocks for amplifying a signal flowing in said current path.

11. A memory device according to claim 7 or 8, wherein said first address comparison circuit has a plurality of sets of said cascaded unit circuits, said cascaded unit circuits being divided into at least two blocks, and wherein one of said blocks supplies output signals to the other block which belongs to said plurality of sets.

12. A memory device according to claim 11, wherein the number of sets in the other block to which the output signals from said one of the blocks are supplied can be modified by a mask option.

13. A memory device according to claim 12, wherein said mask option is effected on an uppermost metal layer of the memory device.

14. A memory device having a plurality of word lines, a plurality of bit lines crossing the word lines, and a memory cell array having memory cells disposed at intersections between the word lines and the bit lines, comprising:
   a first redundant memory cell array for replacing memory cells in the memory cell array with redundant memory cells per bit or a small number of bits;
   a first address comparison circuit for storing addresses of memory cells to be replaced, comparing the stored addresses with an inputted address, and allowing a memory cell having a second refresh cycle period in said memory cell array to be replaced with a redundant memory cell having a first refresh cycle period in said first redundant memory cell array longer than the second refresh cycle period when a stored address matches the inputted address;
   a second redundant memory cell array for replacing memory cells in the memory cell array with redundant memory cells per word line or bit line;
   a second address comparison circuit for storing addresses corresponding to word lines or bit lines to be replaced, comparing the stored addresses with an inputted address, and allowing a word line or a bit line to be replaced with a word line or a bit line in said second redundant memory cell array when a stored address matches the inputted address; and
   a multiplexer for selecting one of data outputted from said memory cell array, data outputted from said first redundant memory cell array, and data outputted from said second redundant memory cell array.

15. A memory device according to claim 14, wherein the memory device is disposed on a semiconductor chip, said first address comparison circuit and said second address comparison circuit being disposed adjacent to each other, and wherein said inputted address is supplied in common to said first address comparison circuit and said second address comparison circuit.

16. A memory device according to claim 14, wherein the memory device is disposed on a semiconductor chip, said memory cell array including a plurality of memory cell arrays disposed on said semiconductor chip, said first redundant memory cell array and said second redundant memory cell array being shared by said plurality of memory cell arrays, said first address comparison circuit being disposed adjacent to said first redundant memory cell array, said second address comparison circuit being disposed adjacent to said second redundant memory cell array, and wherein said inputted address is supplied in common to said first address comparison circuit and said second address comparison circuit.

17. A memory device according to claim 14, wherein the memory device is disposed on a semiconductor chip, said first address comparison circuit and said second address comparison circuit being disposed adjacent to each other, wherein a portion of said inputted address is supplied in common to said first address comparison circuit and said second address comparison circuit, and the remainder of said inputted address is supplied to said first address comparison circuit, and wherein said second address comparison circuit outputs an address matching signal to allow a plurality of word lines or bit lines to be replaced effectively.

18. A memory device according to claim 14, wherein the memory device is disposed on a semiconductor chip, said addresses including row address bits and column address bits, said first address comparison circuit comprising a first row address comparison unit for storing and comparing the row address bits with inputted row address bits and a first column address comparison unit for storing and comparing the column address bits with inputted column address bits, said second address comparison circuit comprising a second row address comparison unit for storing and comparing the row address bits with inputted row address bits and a second column address comparison unit for storing and comparing the column address bits with inputted column address bits, and wherein said first redundant memory cell array is disposed between said first row address comparison unit and said first column address comparison unit, for outputting data of memory cells to be replaced in response to respective address matching signals therefrom, said second row address comparison unit being disposed adjacent to said first row address comparison unit, said second row address comparison unit and said first row address comparison unit being supplied in common with the inputted row address bits, said second column address comparison unit being disposed adjacent to said first column address comparison unit, said second column address comparison unit and said first column address comparison unit being supplied in common with the inputted column address bits.

19. A memory device according to claim 18, wherein said memory cell array including a plurality of memory cell arrays disposed on said semiconductor chip, said second redundant memory cell array being disposed adjacent to said second address comparison circuit, and shared by said plurality of memory cell arrays.

20. A memory device having a plurality of word lines, a plurality of bit lines crossing the word lines, and a memory cell array having memory cells disposed at intersections between the word lines and the bit lines and including capacities for holding charges representing data, said memory cell array including memory cells having data retention times over which said charges drop to a predetermined allowable level, said data retention times including a first time and a second time shorter than said first time, comprising:

a first redundant memory cell array having redundant memory cells for replacing memory cells having said second time in said memory cell array; and a first address comparison circuit for storing addresses of the memory cells having said second time, comparing the stored addresses with an inputted address, and allowing a memory cell having said second time to be replaced with a redundant memory cell having a third time longer than said second time in said first redundant memory cell array when a stored address matches the inputted address;

wherein when an address corresponding to a memory cell having said second time is supplied, said memory cell array and a corresponding memory cell in said first redundant memory cell array are accessed and produce respective output signals which are selected by said first address comparison circuit.

21. A memory device having a plurality of word lines, a plurality of bit lines crossing the word lines, and a memory cell array having memory cells disposed at intersections between the word lines and the bit lines and including capacities for holding charges representing data, said memory cell array including memory cells having data retention times over which said charges drop to a predetermined allowable level, said data retention times including a first time and a second time shorter than said first time, comprising:

a redundant memory cell array having redundant memory cells for replacing memory cells having said second time in said memory cell array; and an address comparison circuit for storing addresses of the memory cells having said second time, comparing the stored addresses with an inputted address, and allowing a memory cell having said second time to be replaced with a redundant memory cell having a third time longer than said second time in said redundant memory cell array when a stored address matches the inputted address;

said redundant memory cell array and said address comparison circuit being included in a redundant circuit, said redundant circuit having a plurality of first-layer redundant circuits associated with respective divided memory cell arrays and a second-layer redundant circuit shared by said plurality of first-layer redundant circuits;

wherein memory cell having said second time in said divided memory cell arrays can be replaced with corresponding memory cell in redundant memory cell arrays in said first-layer redundant circuits, and memory cell having said second time which cannot be replaced with memory cell in said first-layer redundant circuits can be replaced with memory cell in a redundant memory cell array in said second-layer redundant circuit.

22. A memory device according to claim 21, wherein said divided memory cell arrays provide memory cell blocks for being supplied with respective first address sets, said first-layer redundant circuits being associated with the memory cell blocks, respectively, wherein the address comparison circuits in said first-layer redundant circuits compare said first address sets with the inputted address, and a memory cell in said memory cell blocks is replaced with a memory cell in the redundant memory cell arrays in said first-layer redundant circuits when a first address set matches the inputted address, and wherein said second-layer redundant circuit is shared by said memory cell blocks, the address comparison circuit in said second-layer redundant circuit stores addresses corresponding to memory cells which cannot be relieved by said first-layer redundant circuits as second address sets which are greater in number than said first address sets, and compares the stored addresses with the inputted address, and a memory cell in said memory cell blocks is replaced with a memory cell in the redundant memory cell array in said second-layer redundant circuit when a second address set matches the inputted address.

23. A memory device according to claim 21 or 22, further comprising a fixed-failure cell redundant circuit for replacing and relieving fixed-failure cells in said memory cell arrays at least per word line or bit line, said fixed-failure cell redundant circuit being associated with each of said divided memory cell arrays.

24. A memory device according to claim 21 or 22, further comprising a fixed-failure cell redundant circuit for replacing and relieving fixed-failure cells in said memory cell arrays at least per word line or bit line, said fixed-failure cell redundant circuit being shared by said divided memory cell arrays.

25. A memory device according to claim 24, wherein said fixed-failure cell redundant circuit includes an address comparison circuit disposed adjacent to the address comparison circuit in said second-layer redundant circuit, said inputted address being supplied in common to said address comparison circuit in said fixed-failure cell redundant circuit and said address comparison circuit in said second-layer redundant circuit.

26. A memory device having a plurality of word lines, a plurality of bit lines crossing the word lines, and a memory cell array having memory cells disposed at intersections between the word lines and the bit lines and including capacities for holding charges representing data, said memory cell array including memory cells having data retention times over which said charges drop to a predetermined allowable level, said data retention times including a first time and a second time shorter than said first time, comprising:

a redundant memory cell array having redundant memory cells for replacing memory cells having said second time in said memory cell array;

an address comparison circuit for storing addresses of the memory cells having said second time, comparing the stored addresses with an inputted address, and allowing a memory cell having said second time to be replaced with a redundant memory cell having a third time longer than said second time in said redundant memory cell array when a stored address matches the inputted address;

a plurality of memory blocks each having memory cell arrays of a predetermined storage capacity;

said memory cell arrays of said memory blocks including said redundant memory cell array and a mark memory cell array having the same word line as the memory cells having said second time, for outputting predetermined positional data when said word line is selected;

wherein said address comparison circuit stores column address bits of the memory cells having said second time on said word line, and compares the stored column address bits with inputted column address bits to allow the memory cell to be replaced effectively with the redundant memory cell when said word line is selected; and an upper-layer redundant memory cell array for relieving memory cells having said second time which cannot be relieved by the redundant memory cell arrays in said memory cell blocks and an upper-layer address comparison circuit associated with said upper-layer redundant memory cell array, said upper-layer redundant memory cell array and said upper-layer address comparison circuit being shared by said memory cell blocks.

27. A memory device having a plurality of word lines, a plurality of bit lines crossing the word lines, and a memory cell array having memory cells disposed at intersections between the word lines and the bit lines and including capacities for holding charges representing data, said memory cell array including memory cells having data retention times over which said charges drop to a predetermined allowable level, said data retention times including a first time and a second time shorter than said first time, comprising:

a redundant memory cell array having redundant memory cells for replacing memory cells having said second time in said memory cell array;

an address comparison circuit for storing addresses of the memory cells having said second time, comparing the stored addresses with an inputted address, and allowing a memory cell having said second time to be replaced with a redundant memory cell having a third time longer than said second time in said redundant memory cell array when a stored address matches the inputted address;

a plurality of memory blocks each having memory cell arrays of a predetermined storage capacity, said memory cell arrays of said memory blocks including said redundant memory cell array and a mark memory cell array having the same word line as the memory cells having said second time, for outputting predetermined positional data when said word line is selected; and an upper-layer redundant memory cell array for relieving memory cells having said second time which cannot be relieved by the redundant memory cell arrays in said memory cell blocks, said upper-layer redundant memory cell array being shared by said memory cell blocks.

* * * * *